US011265002B2

(12) United States Patent
McGibney et al.

(10) Patent No.: US 11,265,002 B2
(45) Date of Patent: Mar. 1, 2022

(54) PARALLEL PROCESSING OF MULTIPLE CHANNELS WITH VERY NARROW BANDPASS DIGITAL FILTERING

(71) Applicant: SIGMASENSE, LLC., Wilmington, DE (US)

(72) Inventors: Grant Howard McGibney, Calgary (CA); Patrick Troy Gray, Cedar Park, TX (US); Gerald Dale Morrison, Redmond, WA (US); Daniel Keith Van Ostrand, Leander, TX (US)

(73) Assignee: SIGMASENSE, LLC., Wilmington, DE (US)

( * ) Notice: Subject to any disclaimer, the term of this patent is extended or adjusted under 35 U.S.C. 154(b) by 0 days.

(21) Appl. No.: 17/168,962

(22) Filed: Feb. 5, 2021

(65) Prior Publication Data
US 2021/0184688 A1 Jun. 17, 2021

Related U.S. Application Data

(63) Continuation of application No. 16/780,133, filed on Feb. 3, 2020, now Pat. No. 10,917,101, which is a (Continued)

(51) Int. Cl.
*H03M 1/06* (2006.01)
*H03H 7/01* (2006.01)
(Continued)

(52) U.S. Cl.
CPC .......... *H03M 1/0626* (2013.01); *G06F 3/044* (2013.01); *H03H 7/0161* (2013.01); *H03M 1/1245* (2013.01); *G06F 3/041* (2013.01)

(58) Field of Classification Search
CPC .. H03M 1/0626; H03M 1/1245; H03M 3/462; H03M 3/402; H03H 7/0161;
(Continued)

(56) References Cited

U.S. PATENT DOCUMENTS 6,218,972 B1  4/2001  Groshong
6,600,788 B1  7/2003  Dick
(Continued)

FOREIGN PATENT DOCUMENTS

EP  2521268 A1  11/2012

OTHER PUBLICATIONS

Baker; How delta-sigma ADCs work, Part 1; Analog Applications Journal; Oct. 1, 2011; 6 pgs.
(Continued)

*Primary Examiner* — Khai M Nguyen
(74) *Attorney, Agent, or Firm* — Garlick & Markison; Timothy W. Markison; Patricia M. Healy

(57) ABSTRACT

A method includes converting, by n analog to digital converter circuits, n analog signals into n first digital signals having a first data rate frequency; converting, by n digital decimation filtering circuits, the n first digital signals into n second digital signals having a second data rate frequency; and converting, by n digital bandpass filter (BPF) circuits, the n second digital signals into a plurality of outbound digital signals having a third data rate frequency. The coefficients for the taps of a digital BPF circuit is set to produce a bandpass region approximately centered at the oscillation frequency of the analog signal and having a bandwidth tuned for filtering a pure tone component of the analog signal. The first data rate frequency is a first integer multiple of the third data rate frequency. The second data rate frequency is a second integer multiple of the third data rate frequency.

20 Claims, 41 Drawing Sheets

Related U.S. Application Data continuation of application No. 16/365,169, filed on Mar. 26, 2019, now Pat. No. 10,554,215.

(51) Int. Cl.
*H03M 1/12* (2006.01)
*G06F 3/044* (2006.01)
*G06F 3/041* (2006.01)

(58) Field of Classification Search
CPC ........... H03H 2218/04; H03H 17/06; H03H 17/0664; G06F 3/041; G06F 3/044; G06F 3/03545
USPC .................................. 341/143, 155
See application file for complete search history.

(56) References Cited

U.S. PATENT DOCUMENTS

| | | | |
|---|---|---|---|
| 6,665,013 B1 | 12/2003 | Fossum et al. | |
| 7,253,762 B2 * | 8/2007 | Huang | H03M 1/1019 341/120 |
| 7,528,755 B2 | 5/2009 | Hammerschmidt | |
| 8,031,094 B2 | 10/2011 | Hotelling et al. | |
| 8,089,289 B1 | 1/2012 | Kremin et al. | |
| 8,279,180 B2 | 10/2012 | Hotelling et al. | |
| 8,547,114 B2 | 10/2013 | Kremin | |
| 8,625,726 B2 | 1/2014 | Kuan | |
| 8,664,548 B2 * | 3/2014 | Wilson | G06F 3/0443 178/18.01 |
| 8,681,122 B2 | 3/2014 | Pirogov | |
| 9,201,547 B2 | 12/2015 | Elias | |
| 9,459,746 B2 | 10/2016 | Rosenberg | |
| 9,762,259 B1 | 9/2017 | Pu | |
| 10,554,215 B1 | 2/2020 | McGibney | |
| 2013/0278447 A1 | 10/2013 | Kremin | |
| 2016/0188049 A1 | 6/2016 | Yang et al. | |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

International Searching Authority; International Search Report and Written Opinion; International Application No. PCT/US2020/024123; dated Jun. 23, 2020; 8 pgs.

* cited by examiner communication system 10 computing device 12 computing device 14 computing device 18

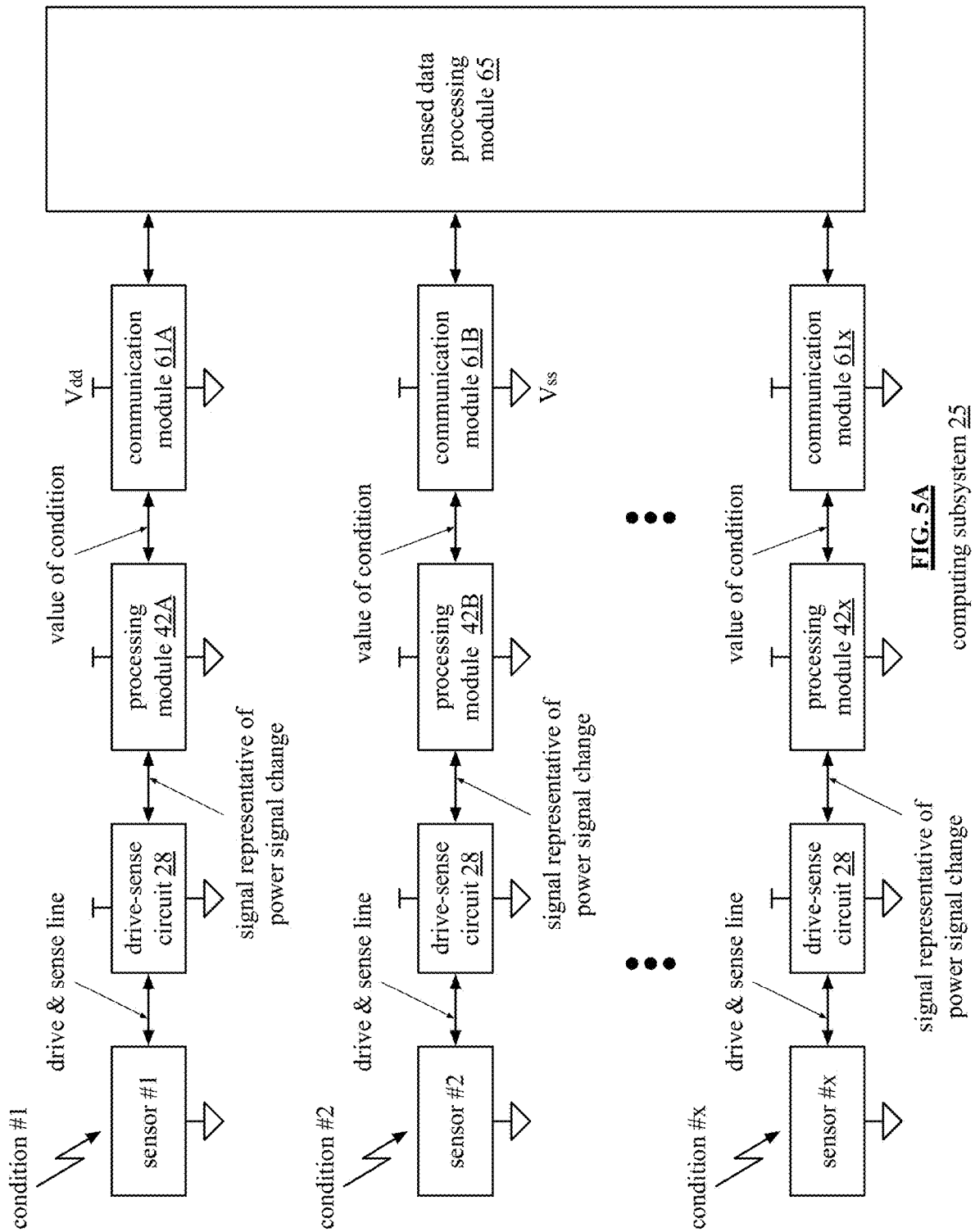

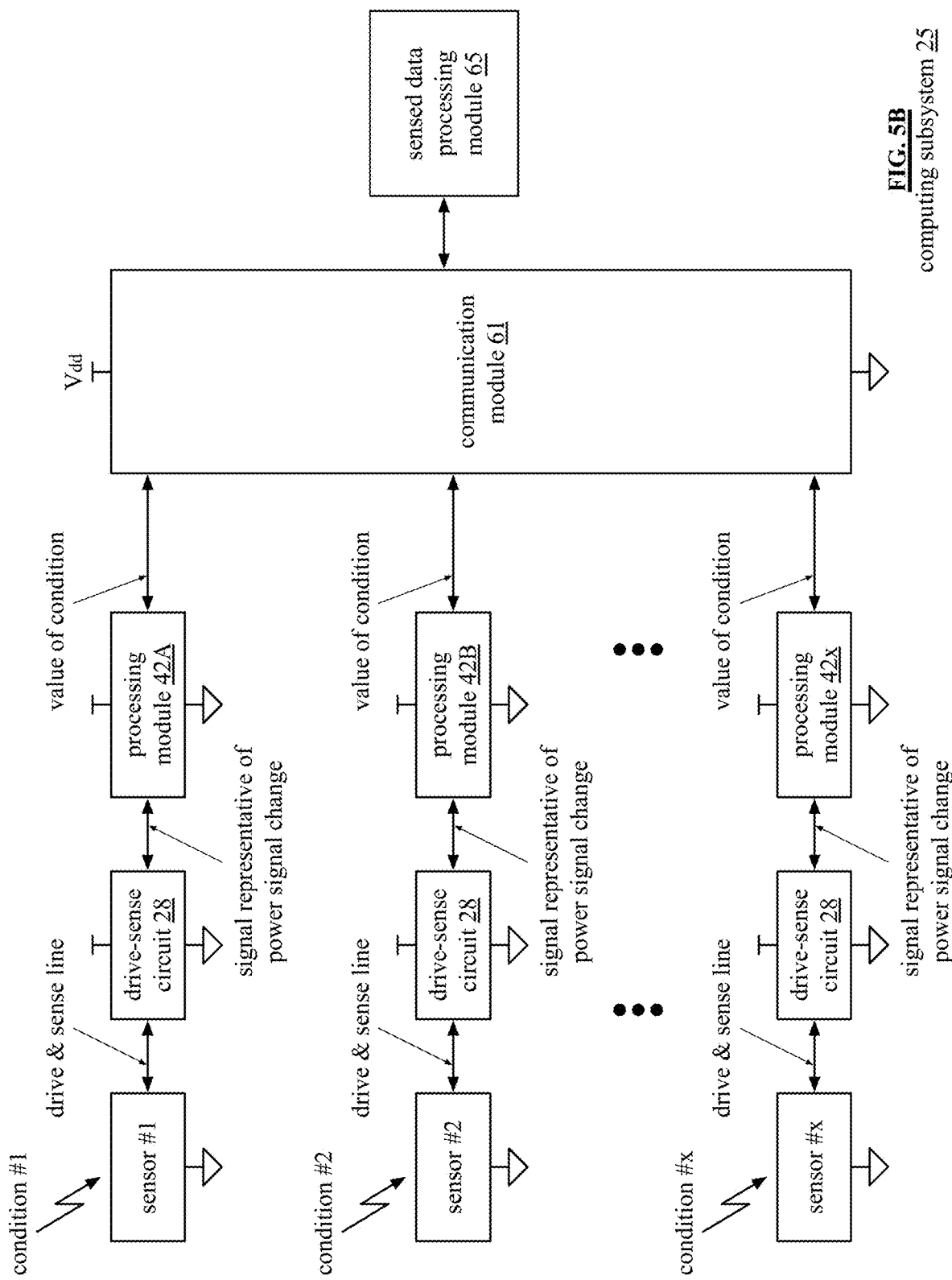

sensor graph power signal graph power signal graph power signal graph power signal graph power signal graph data sensing circuit 200 data sensing circuit 200 data circuit 230 analog to digital conversion circuit 246 analog to digital conversion circuit 246

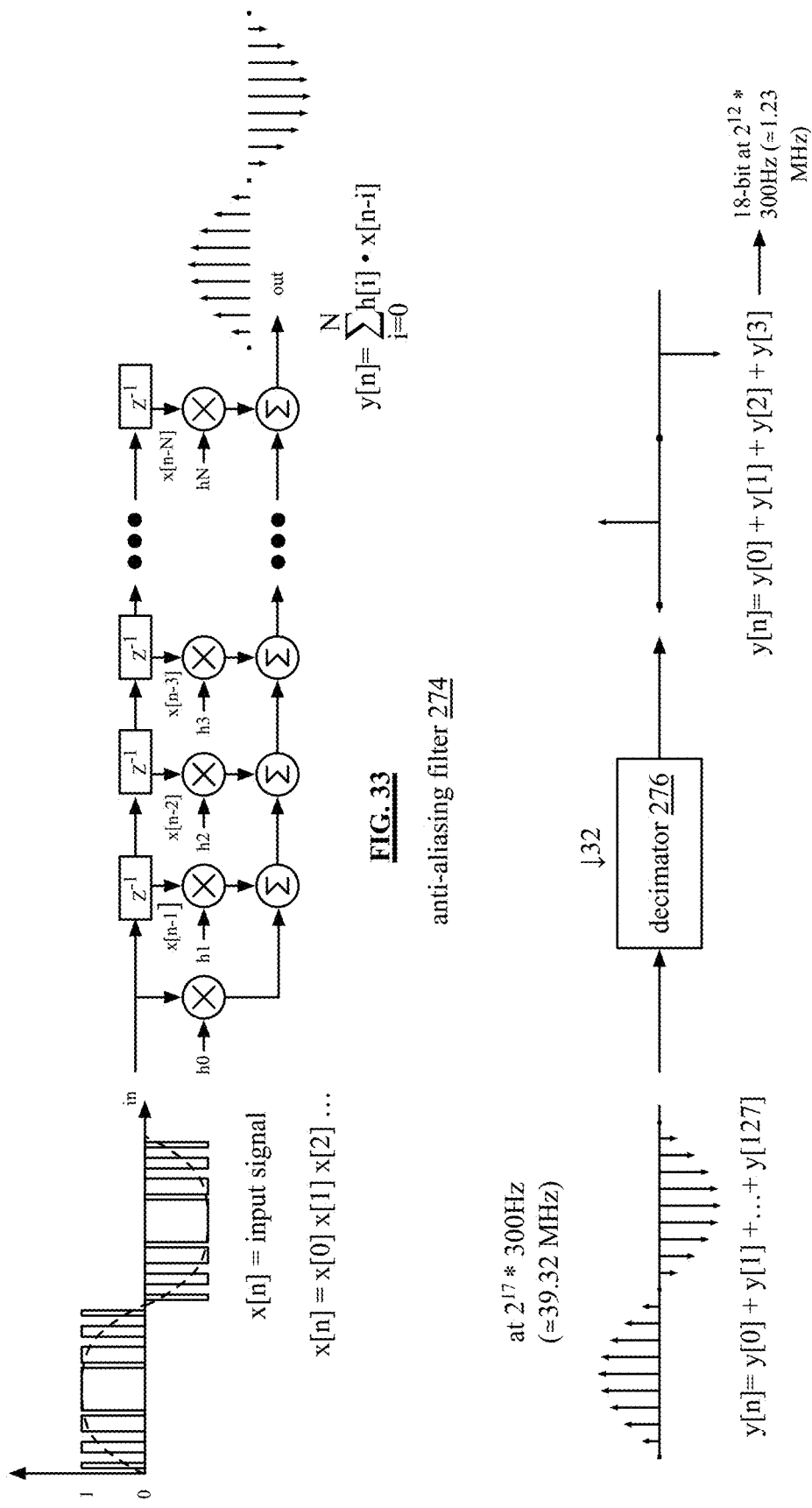

digital decimation filtering circuit 248 digital decimation filtering circuit 248 shift register memory 286 digital decimation filtering circuit 248

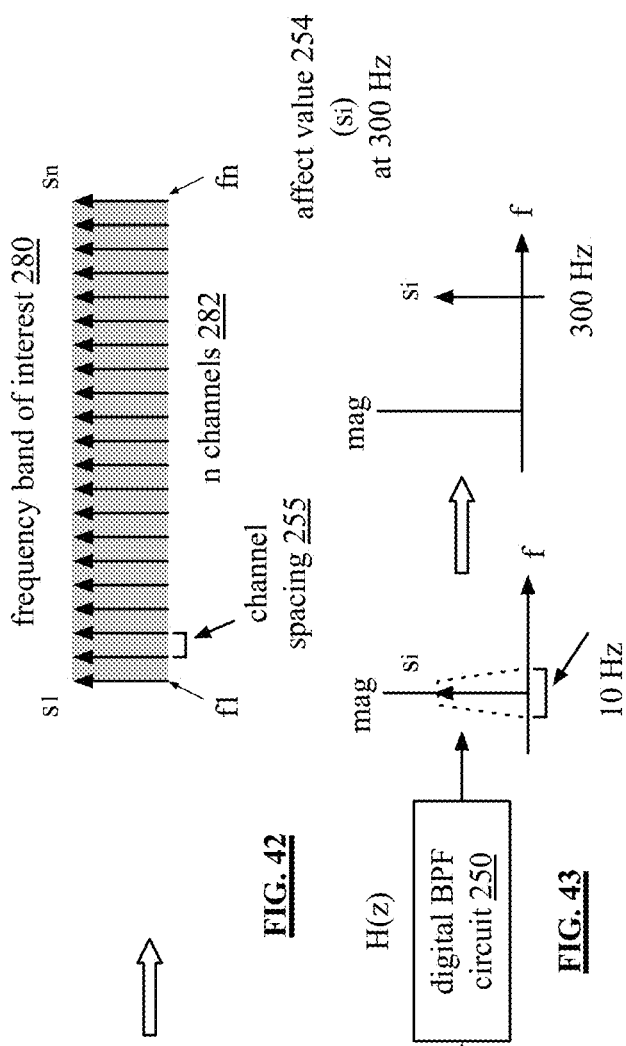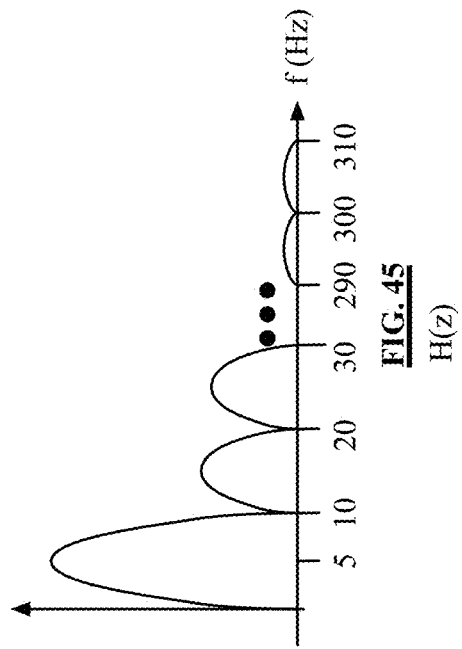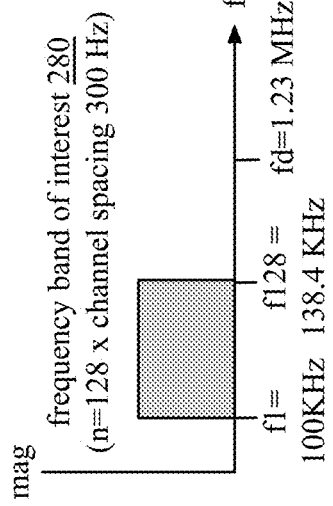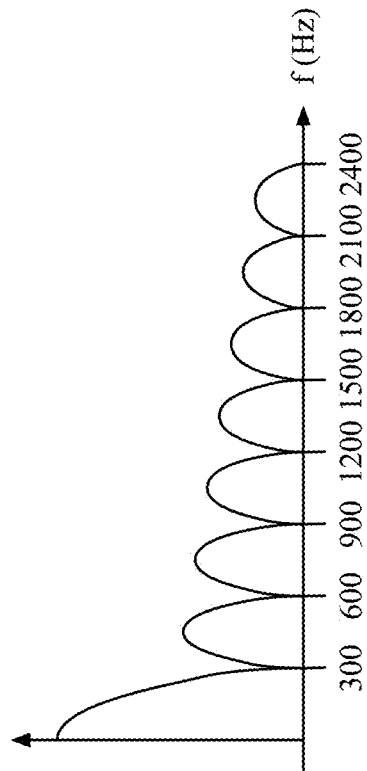

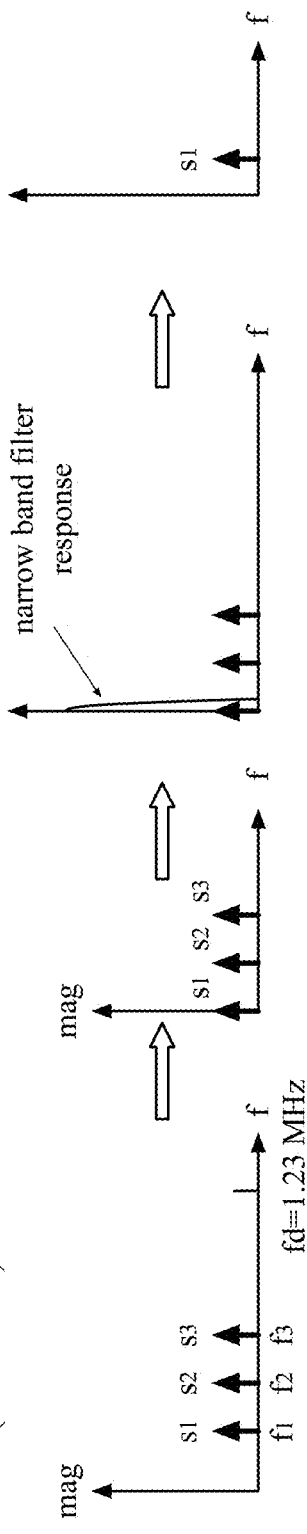
FIG. 46A input to BPF 1 250
FIG. 46B shift to baseband for f1
FIG. 46C apply filter
FIG. 46D output affected value 1 (real and imaginary components)
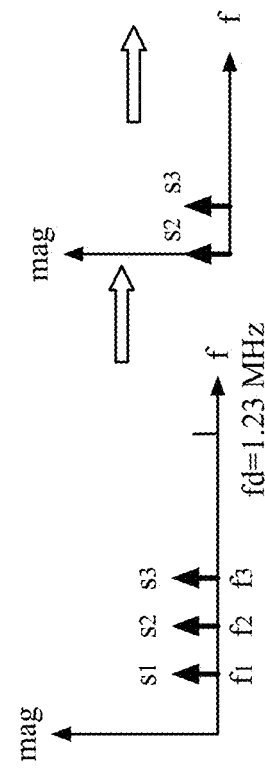
FIG. 47A input to BPF 2 250
FIG. 47B shift to baseband for f2
FIG. 47C apply filter
FIG. 47D output affected value 2 (real and imaginary components)

BPF circuit 250 coefficient processor 306

PARALLEL PROCESSING OF MULTIPLE CHANNELS WITH VERY NARROW BANDPASS DIGITAL FILTERING

CROSS-REFERENCE TO RELATED APPLICATIONS

The present U.S. Utility Patent Application claims priority pursuant to 35 U.S.C. § 120 as a continuation of U.S. Utility application Ser. No. 16/780,133, entitled "ANALOG TO DIGITAL CONVERSION CIRCUIT WITH VERY NARROW BANDPASS DIGITAL FILTERING," filed Feb. 3, 2020, issuing as U.S. Pat. No. 10,917,101 on Feb. 9, 2021, which is a continuation of U.S. Utility patent application Ser. No. 16/365,169 entitled "ANALOG TO DIGITAL CONVERSION CIRCUIT WITH VERY NARROW BANDPASS DIGITAL FILTERING," filed Mar. 26, 2019, issued as U.S. Pat. No. 10,554,215 on Feb. 4, 2020, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

BRIEF DESCRIPTION OF THE SEVERAL VIEWS OF THE DRAWING(S)

FIG. 5A is a schematic plot diagram of a computing subsystem in accordance with the present invention;

FIG. 5B is a schematic block diagram of another embodiment of a computing subsystem in accordance with the present invention;

Figure 24:
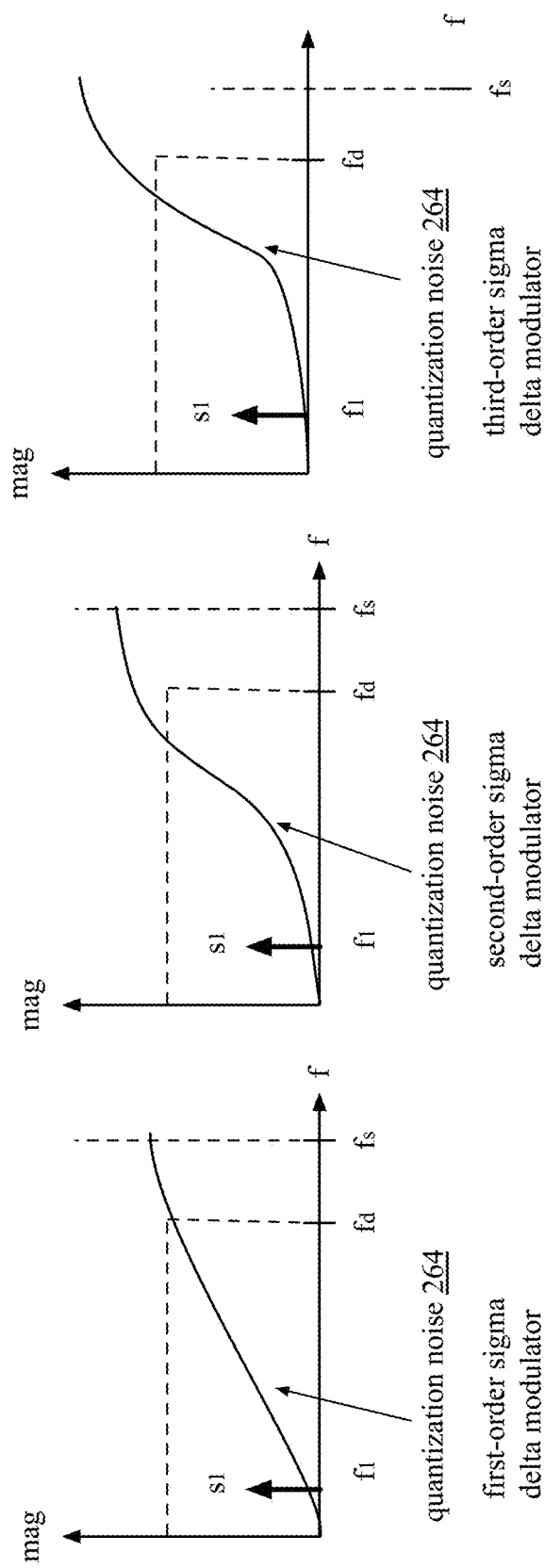
Figure 25:
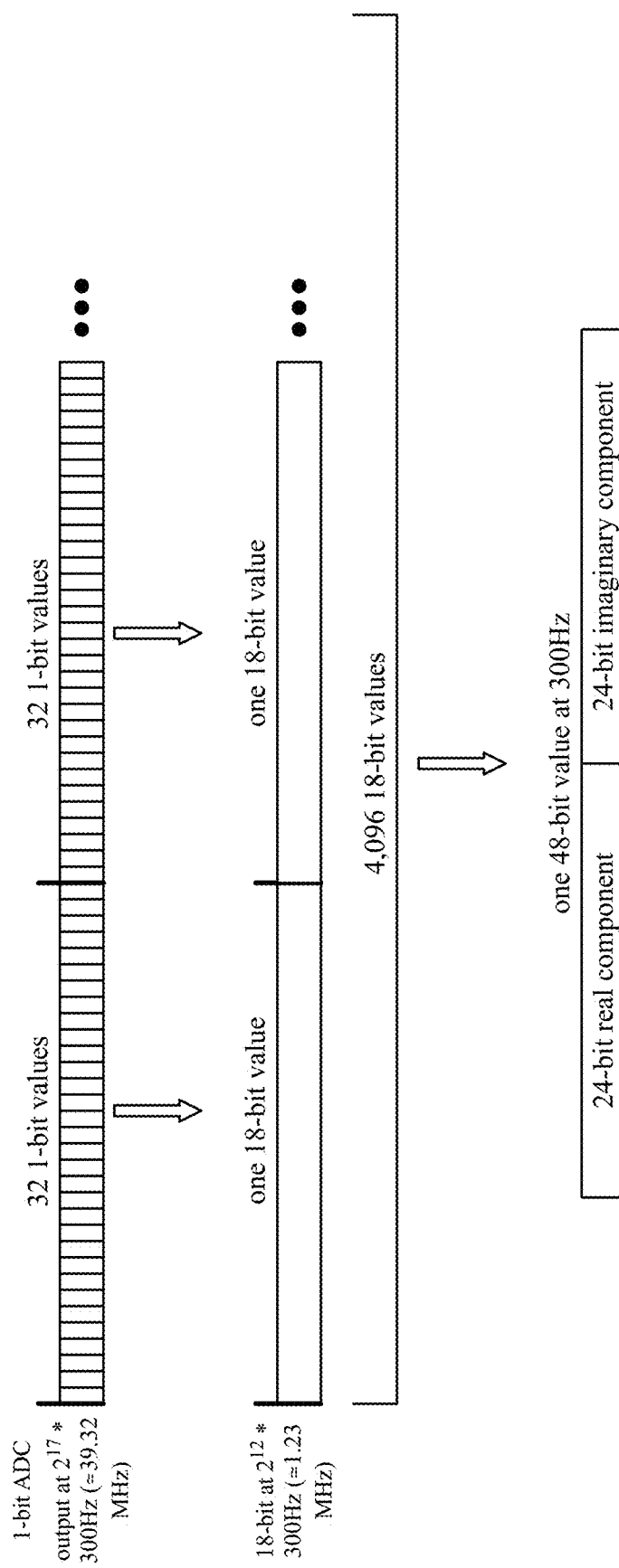
Figure 26:
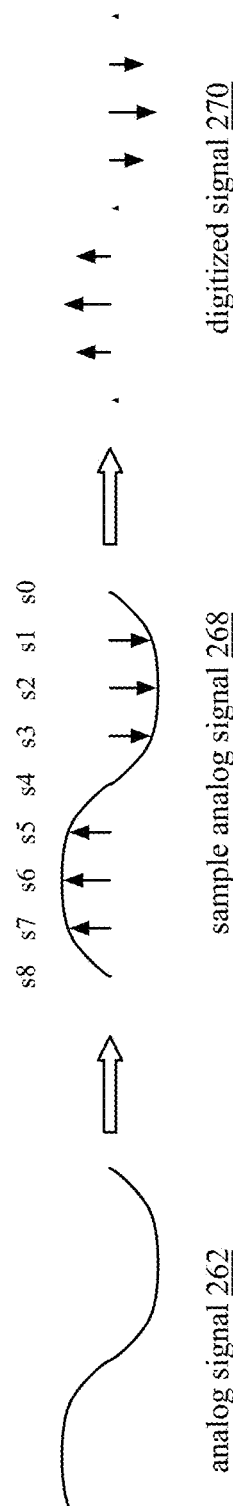
Figure 27:
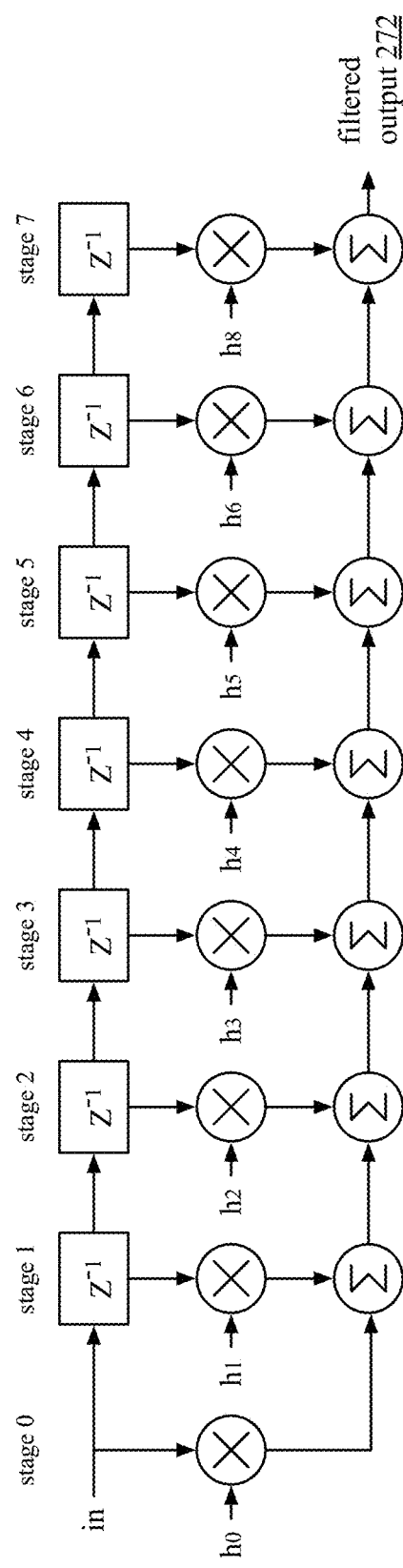
Figure 28:
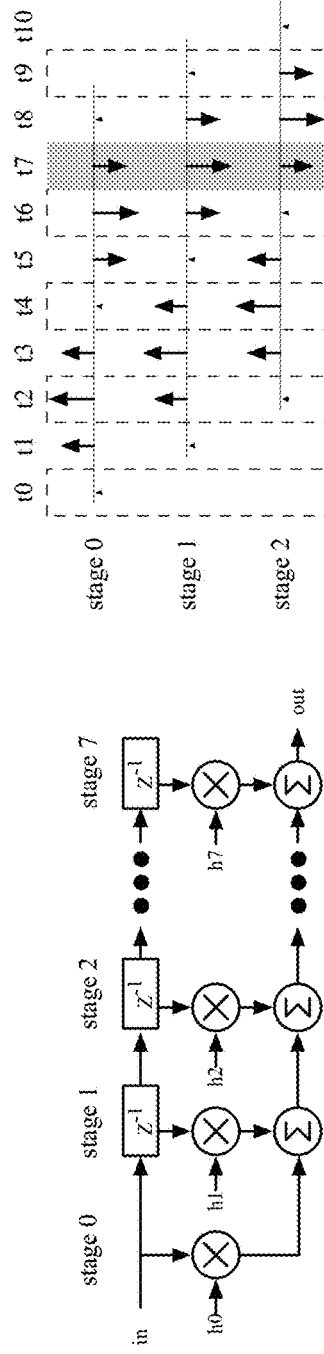
Figure 29:
Figure 30:
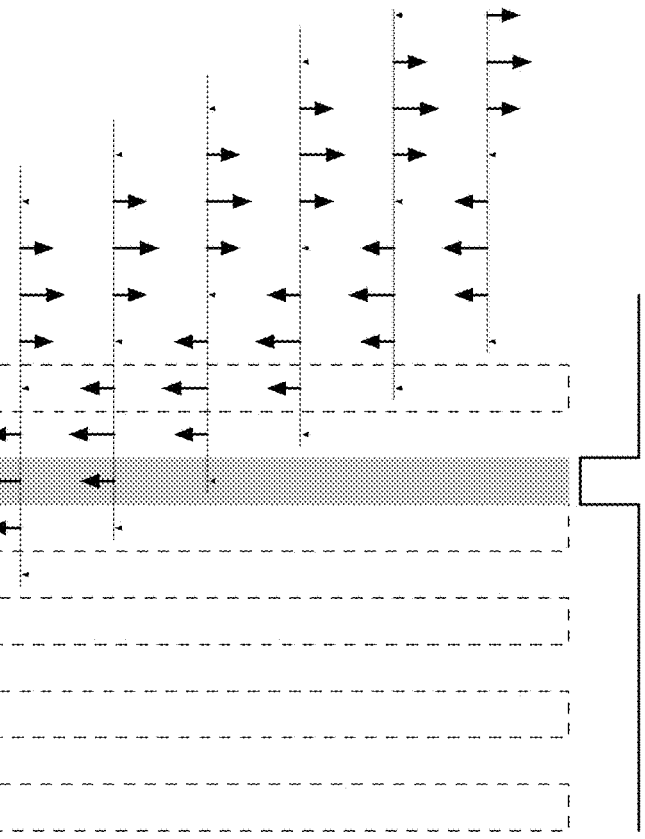
Figure 31:
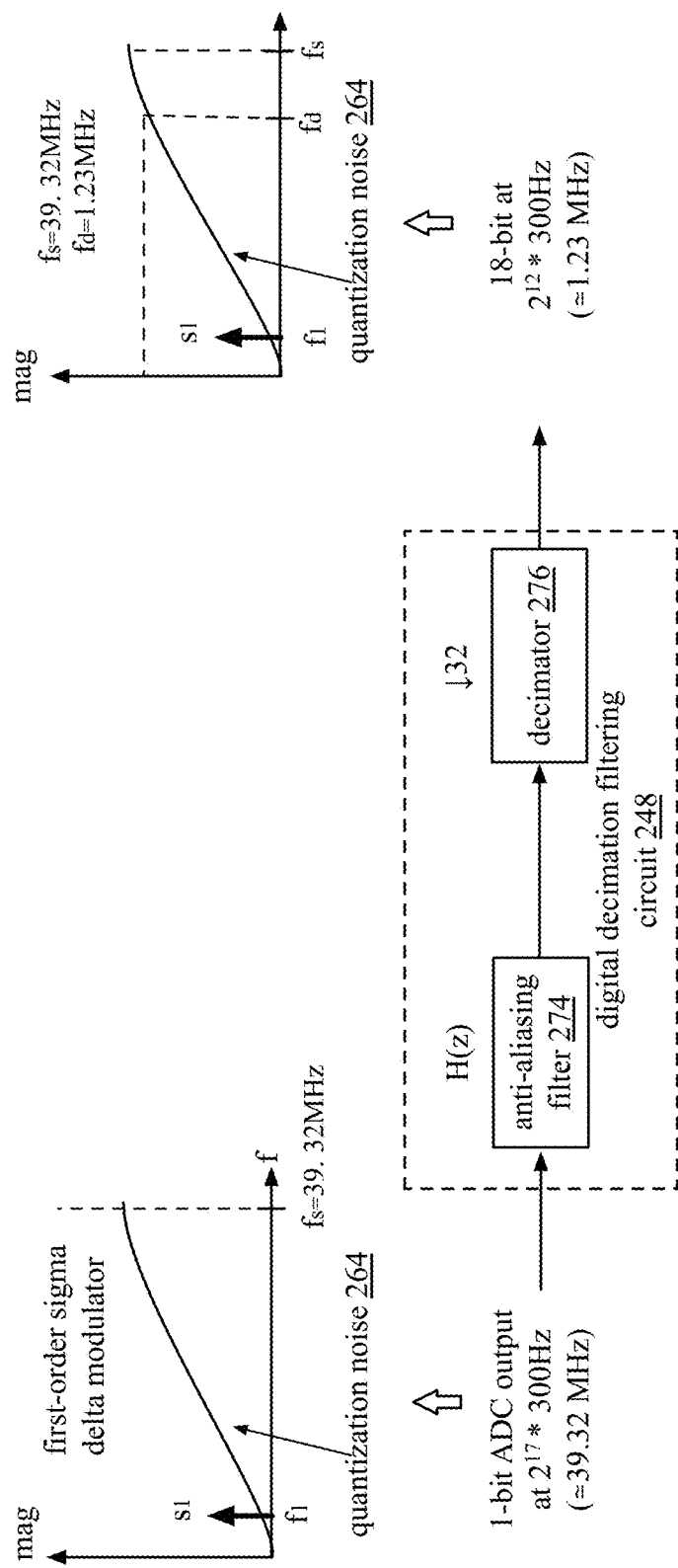
Figure 32:
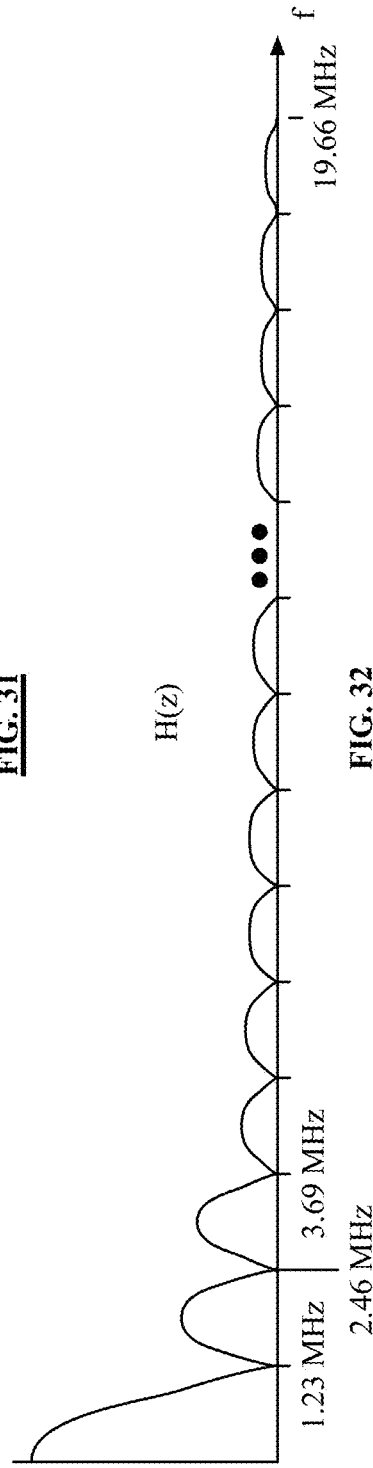
Figure 35:
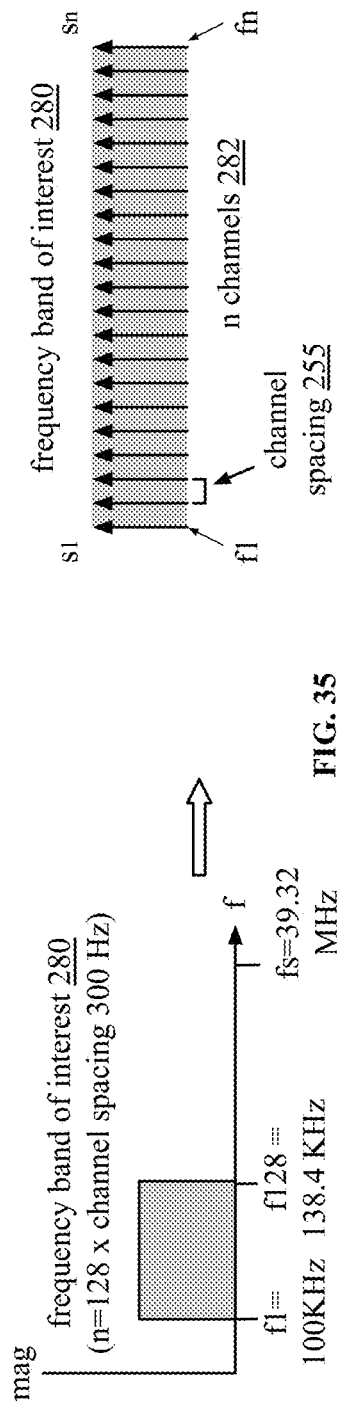
Figure 36:
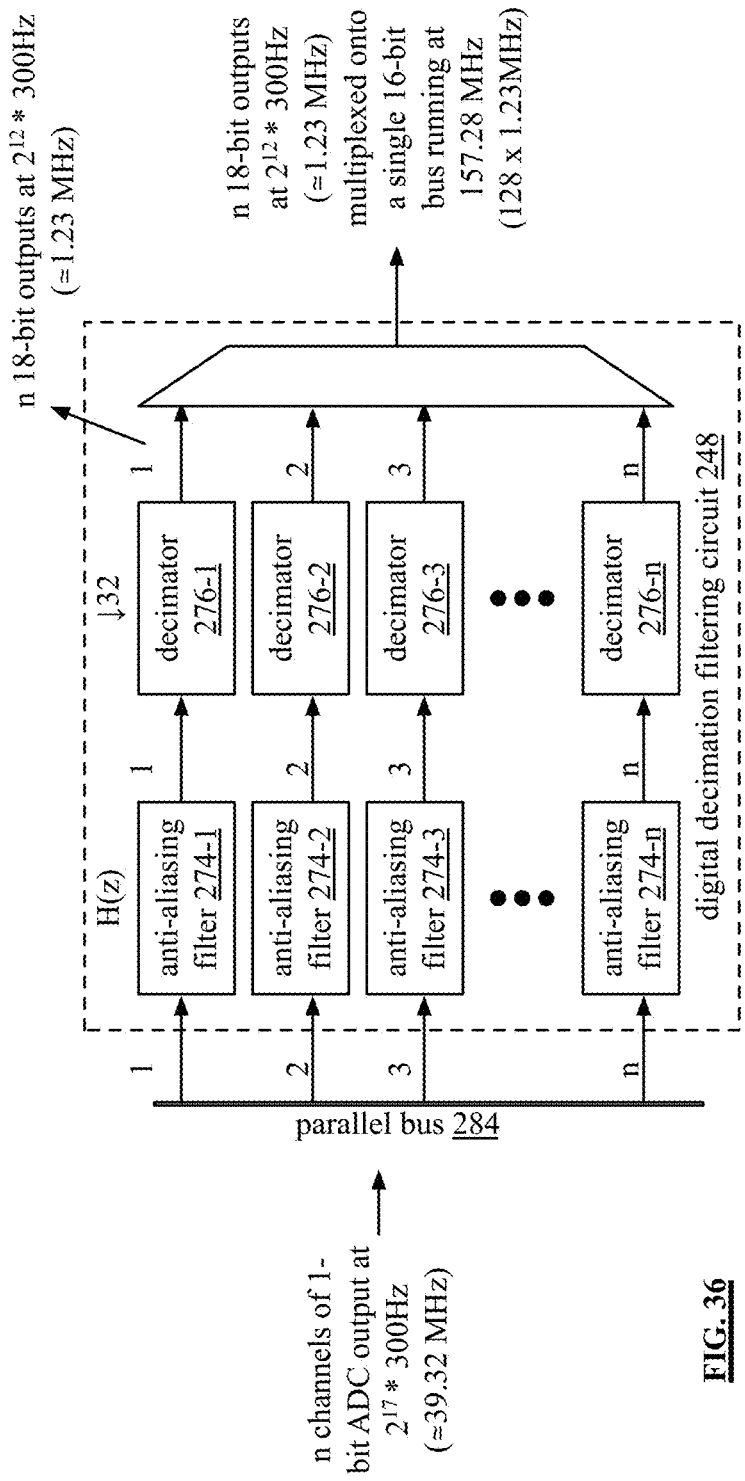
Figure 37:
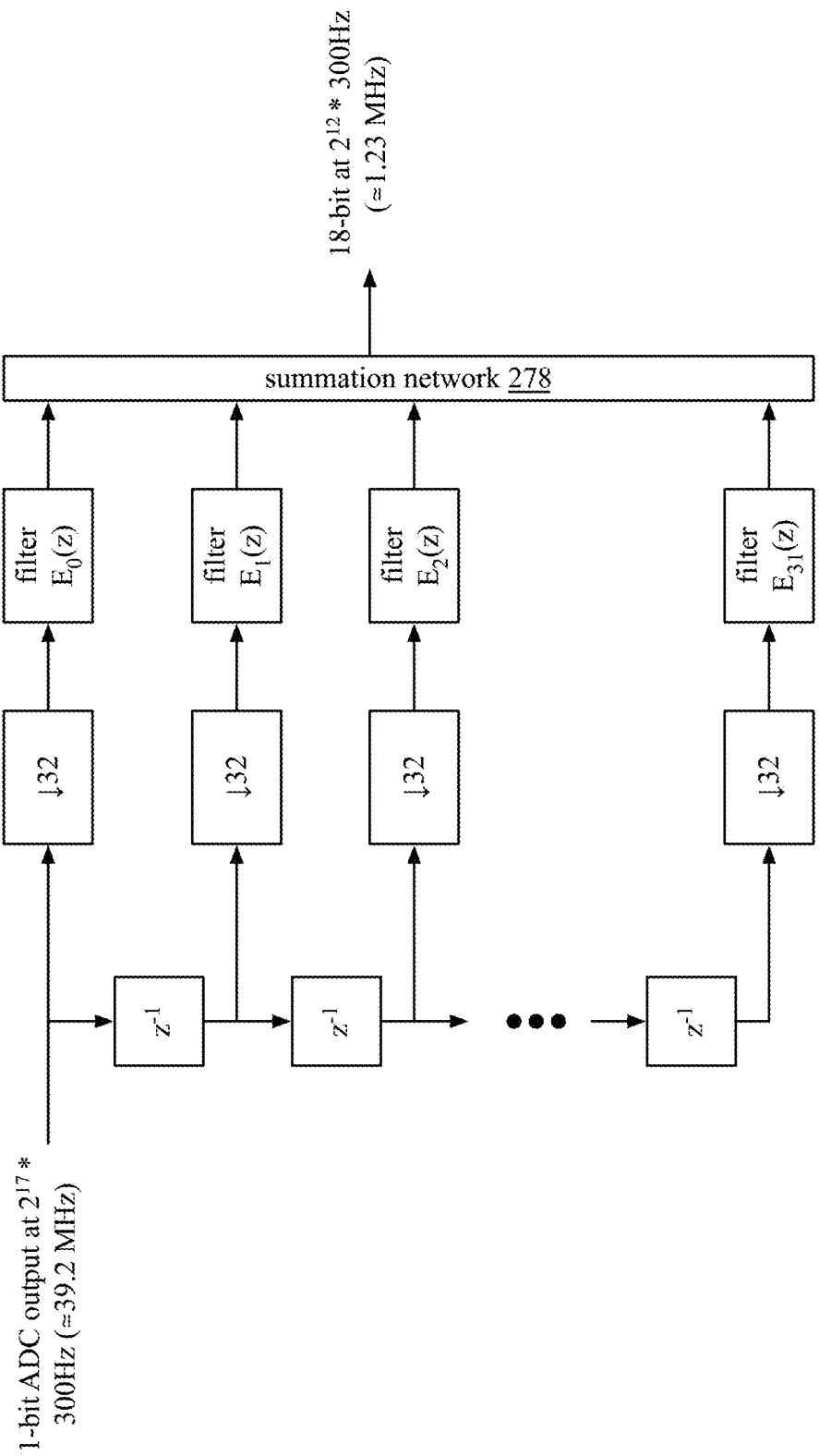
Figure 38:
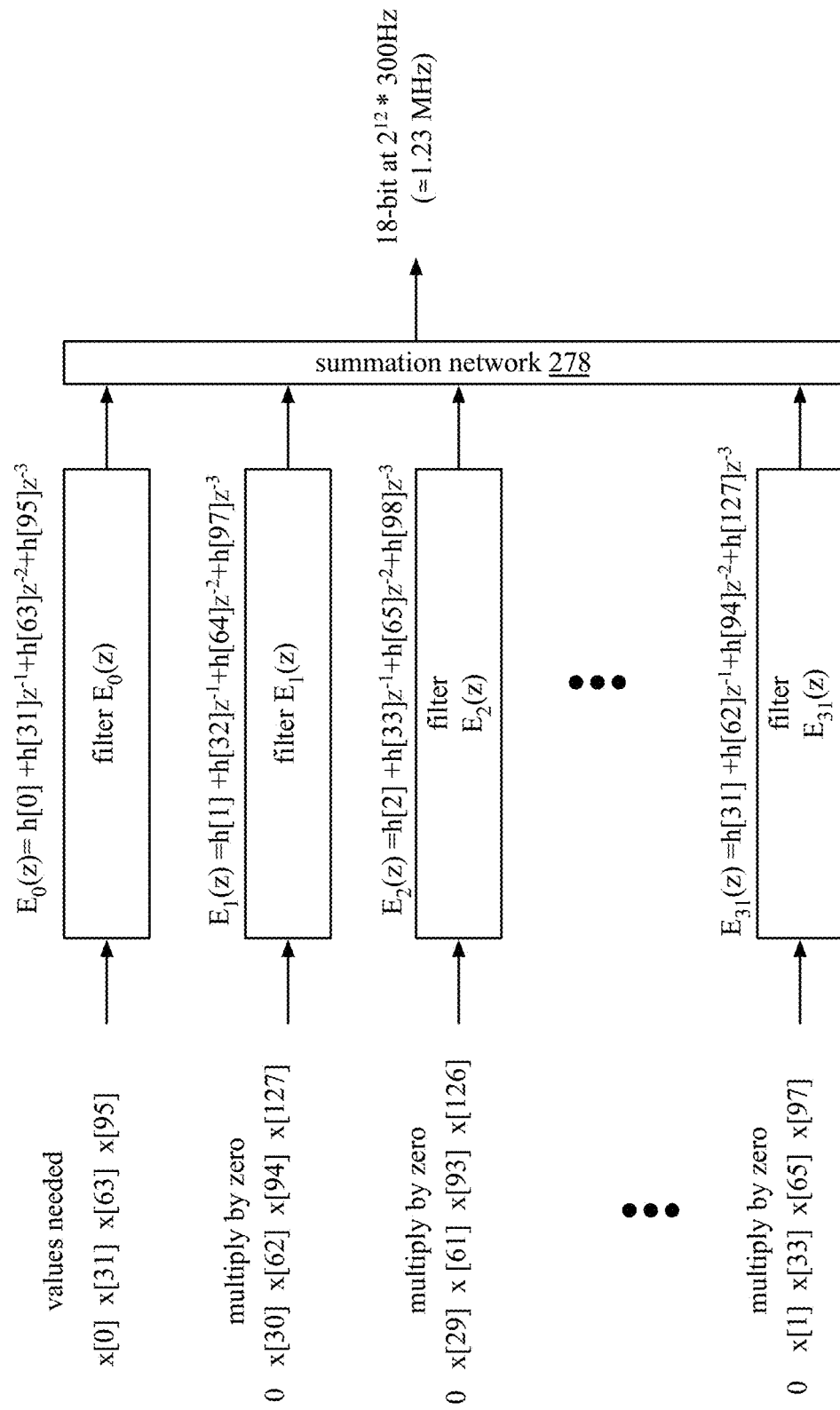
Figure 39:
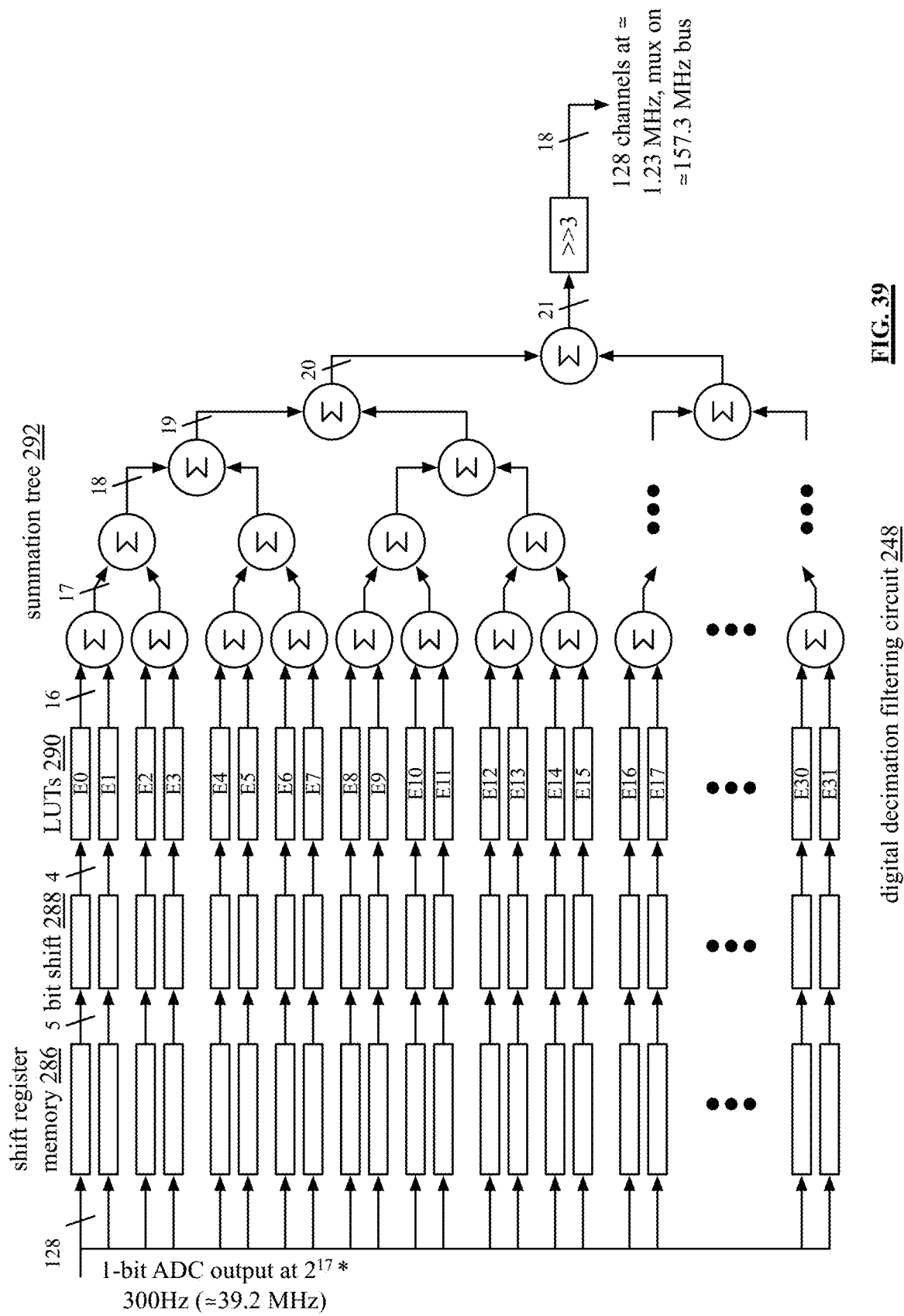
Figure 40:
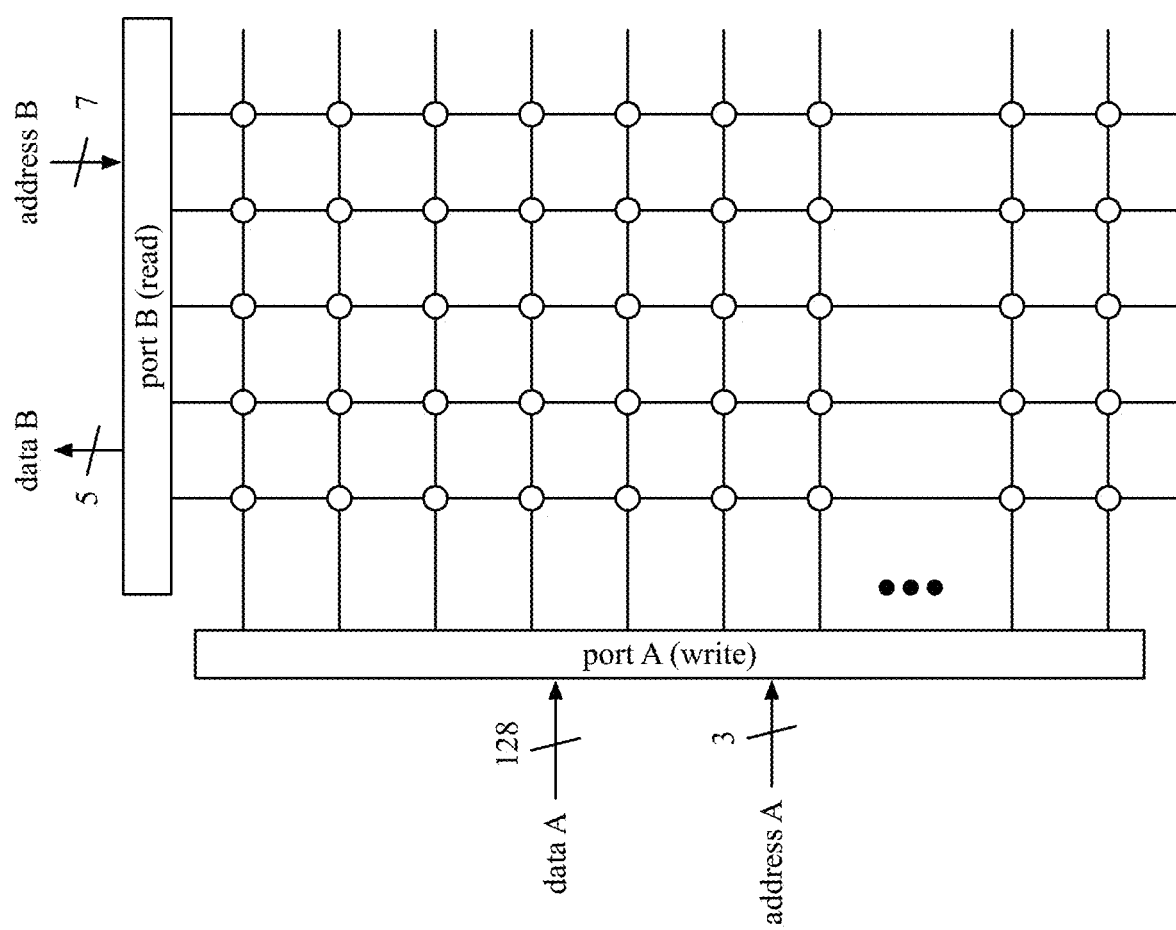
Figure 41:
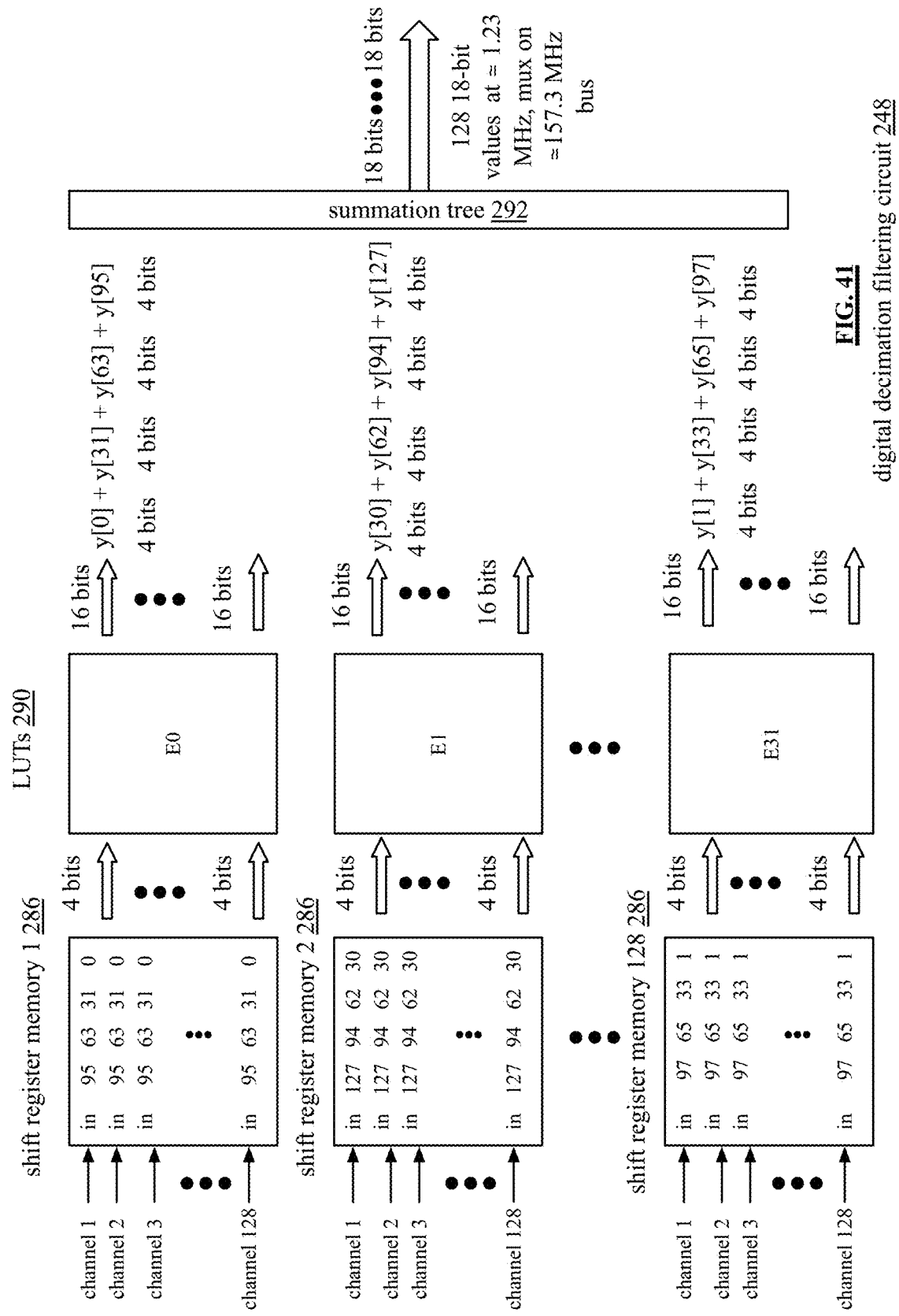
Figure 48:
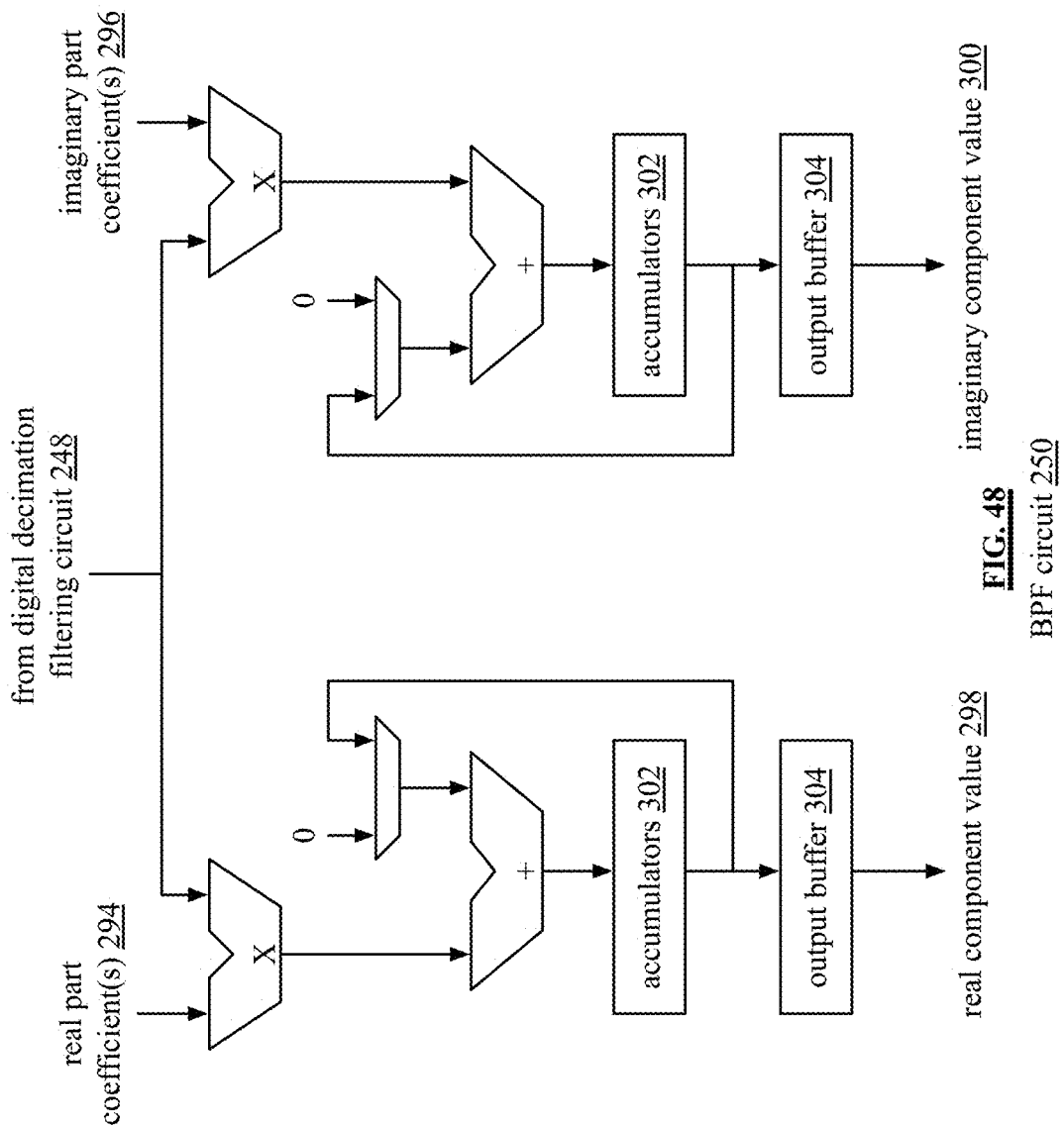
Figure 49:
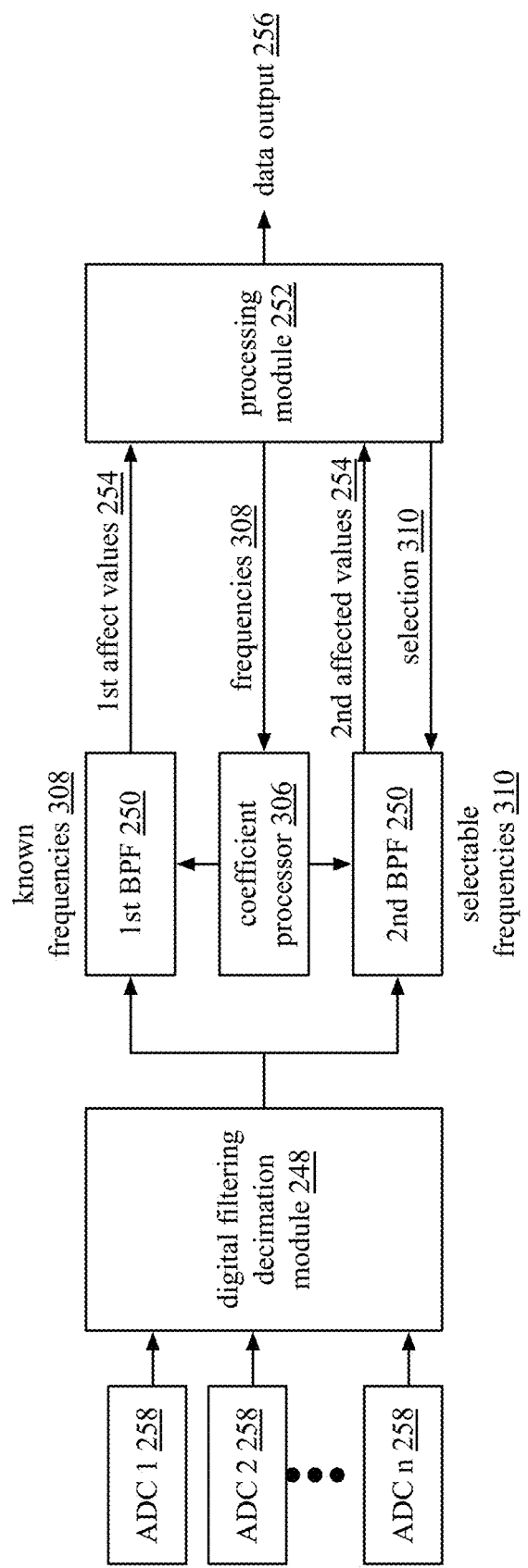
Figure 50:
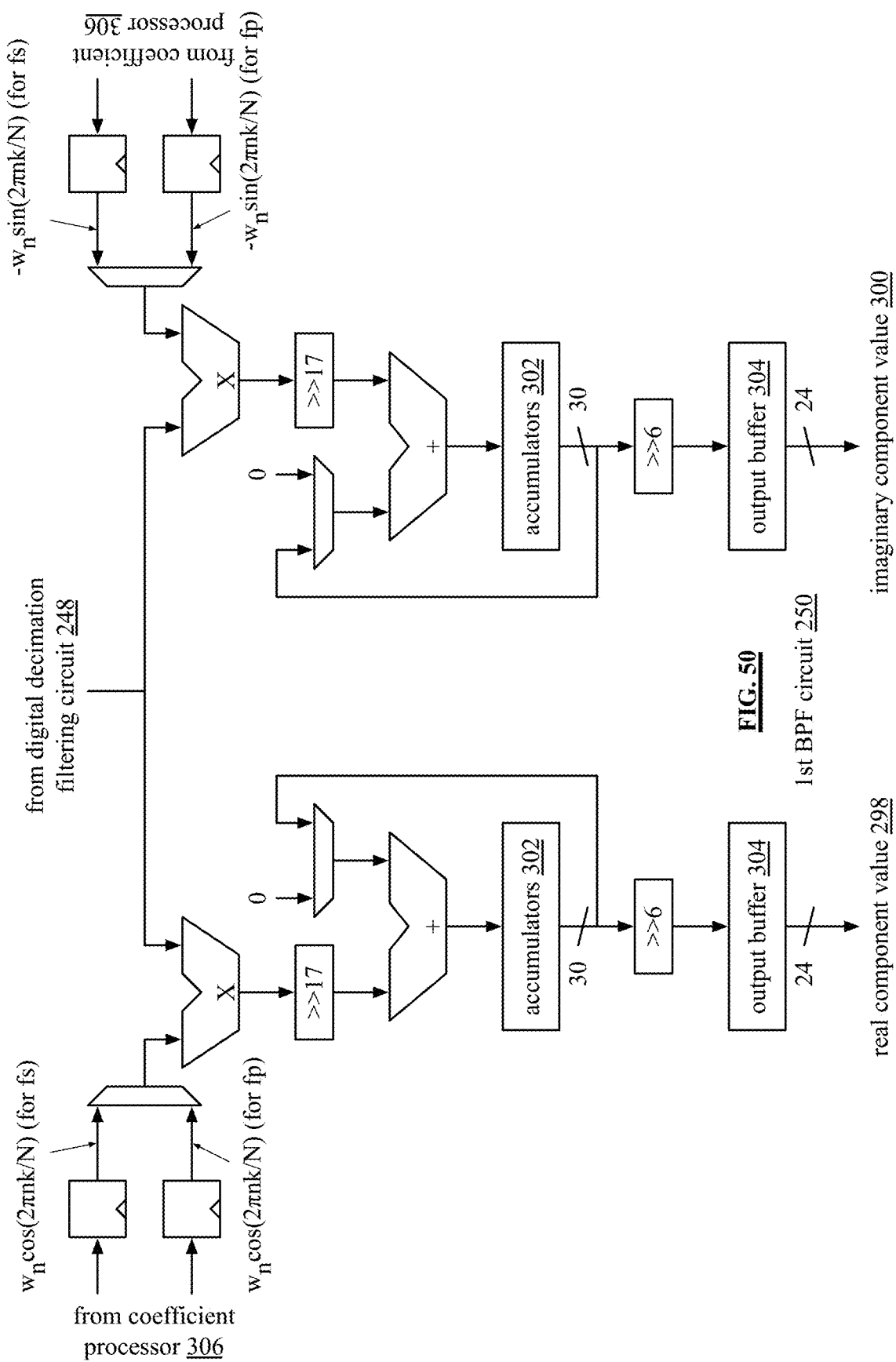
Figure 51:
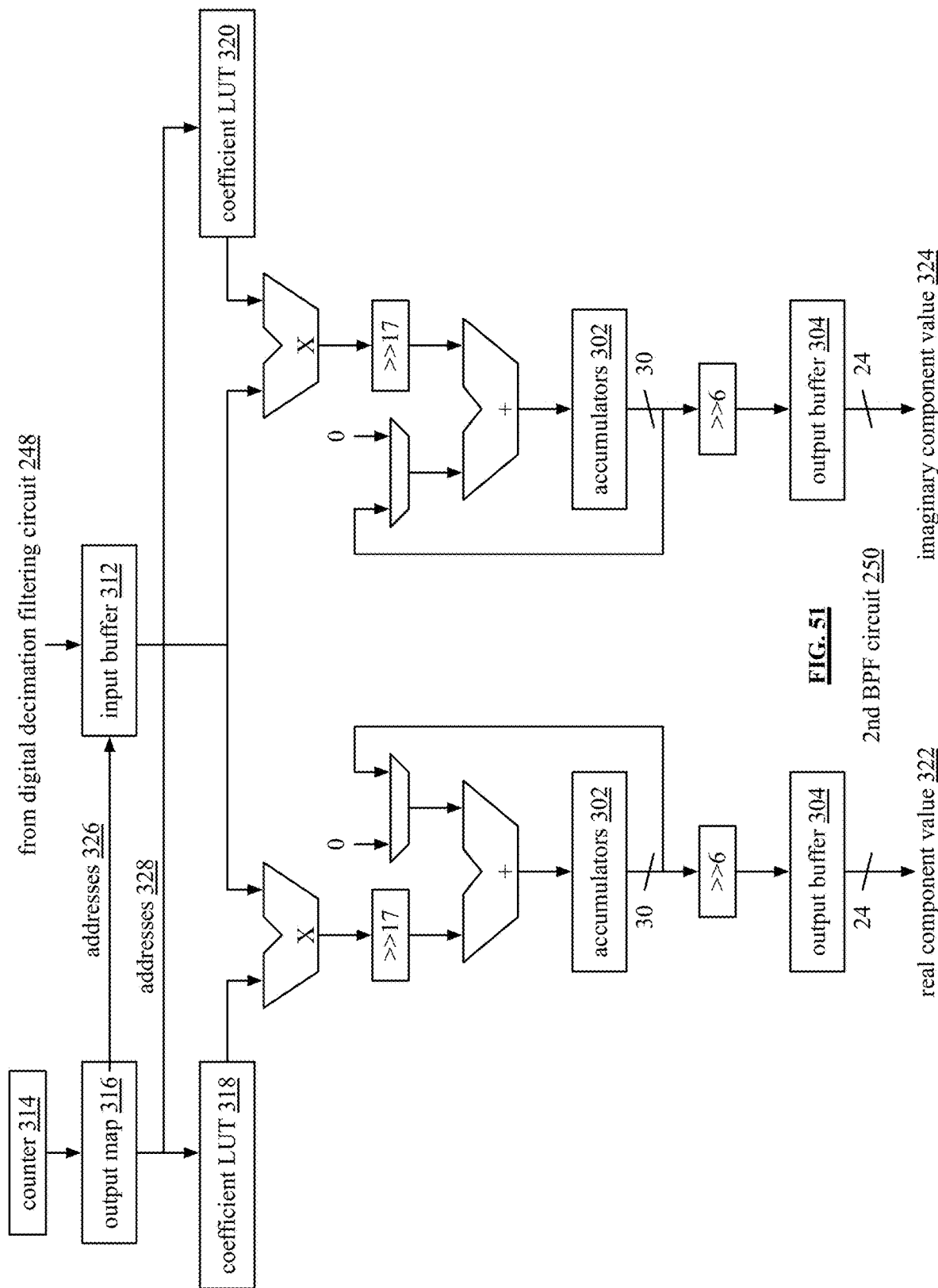
Figure 52:
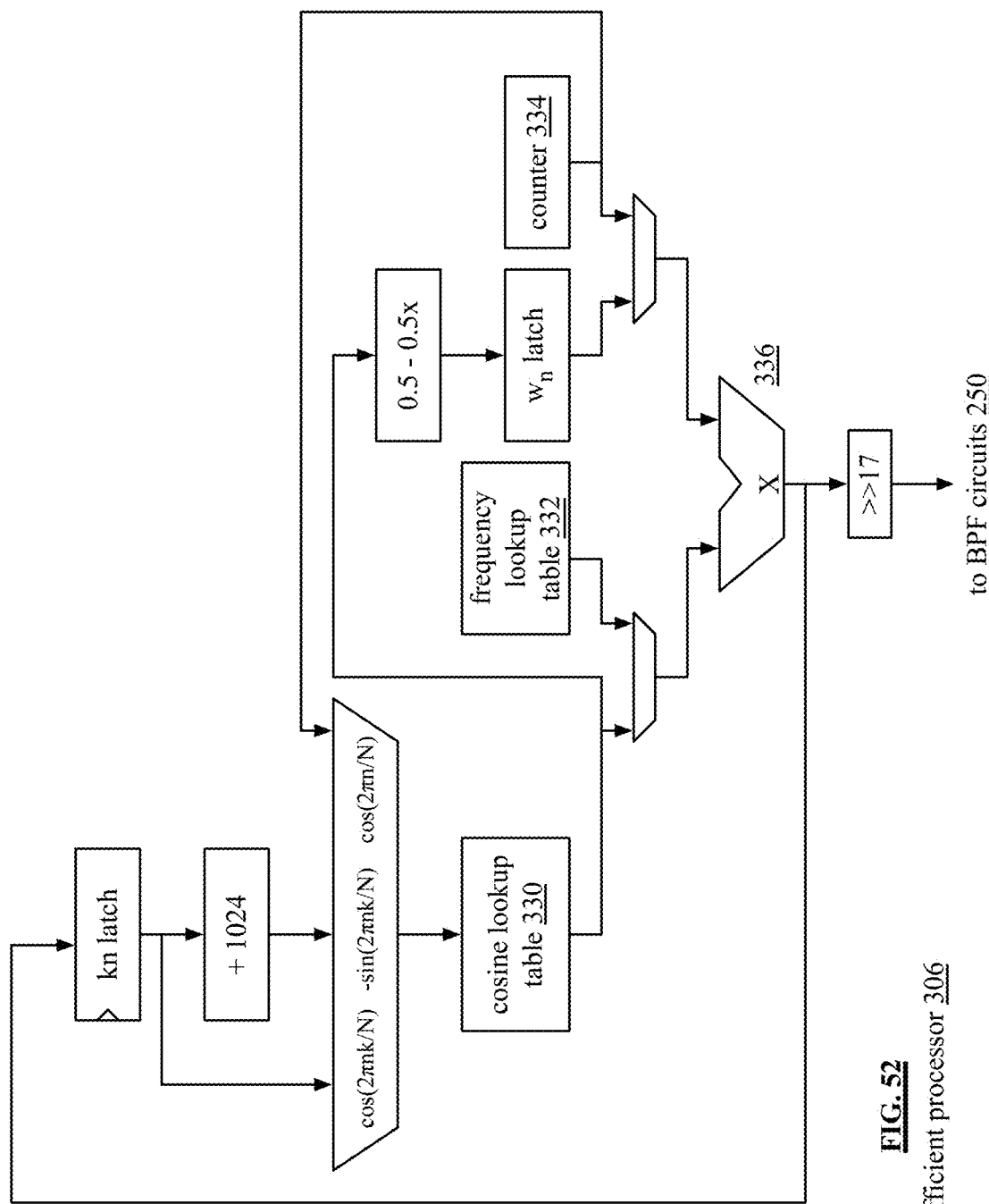
Figure 53:
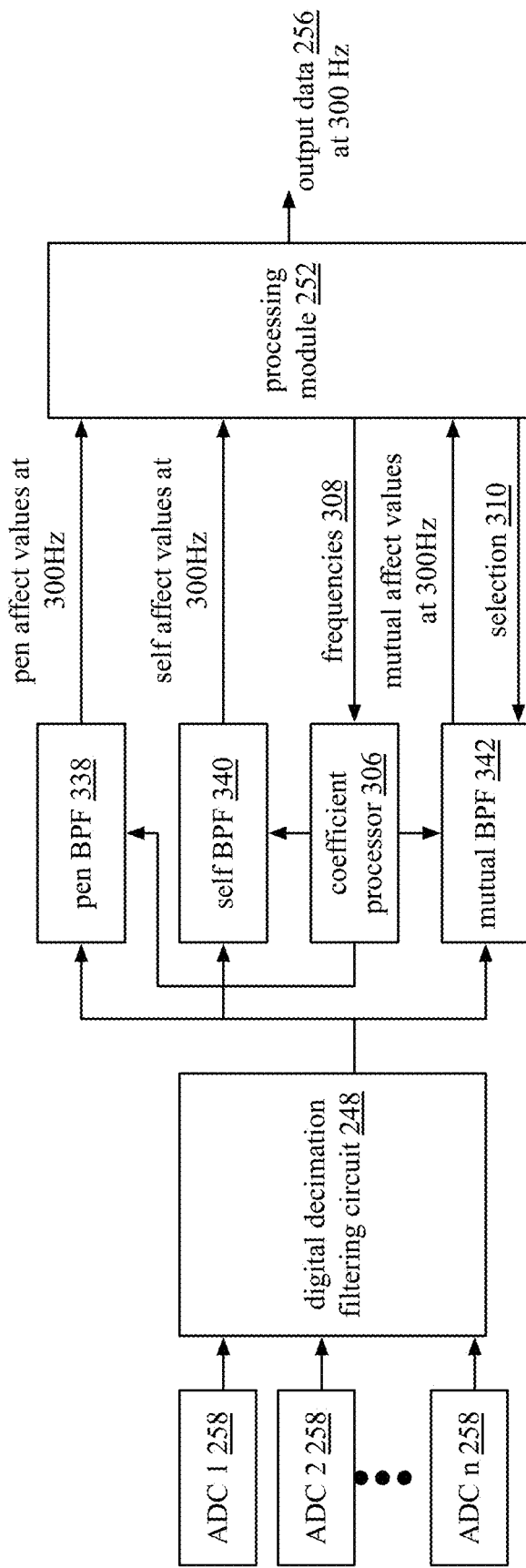
Figure 54:
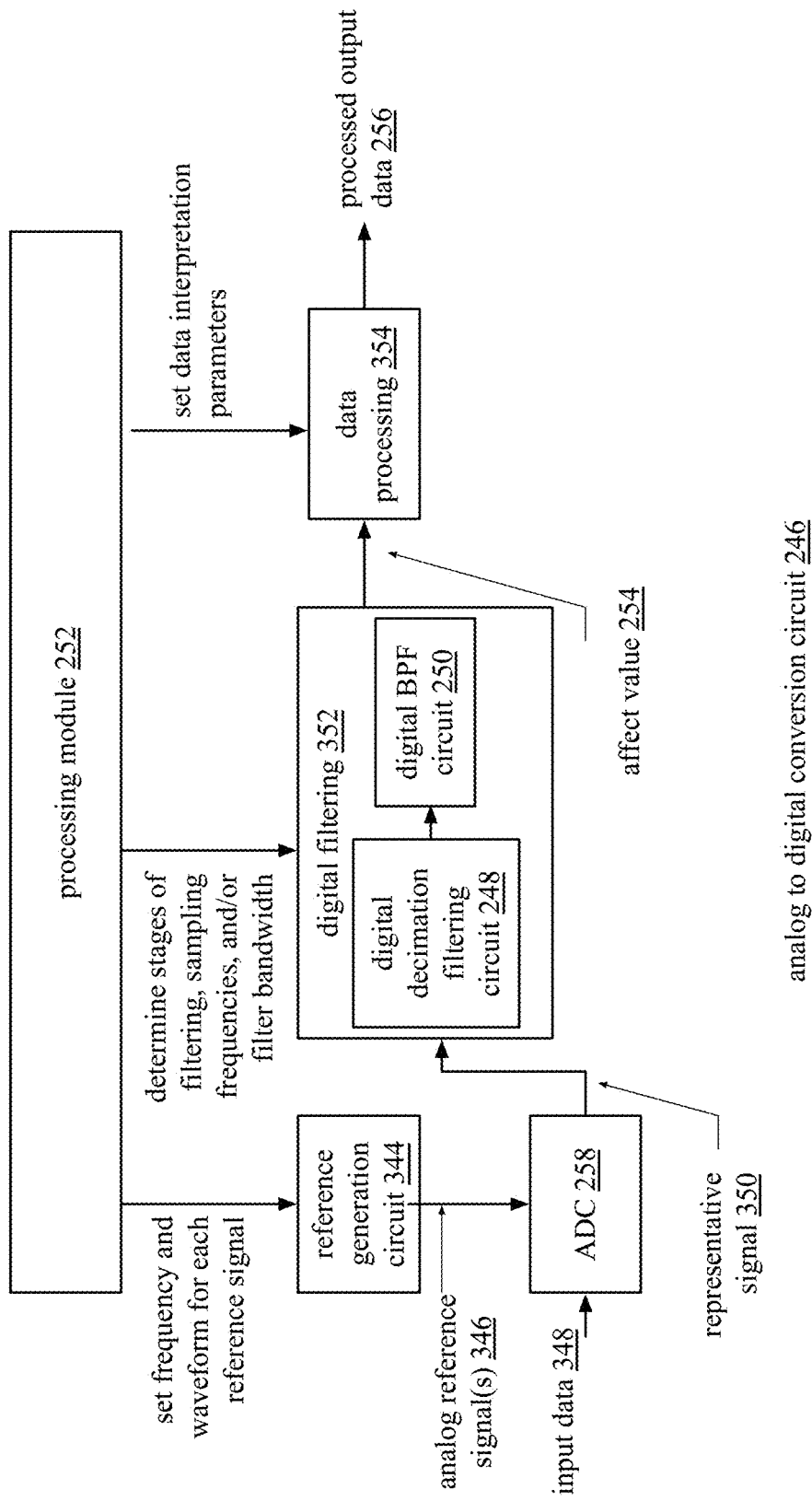

FIG. 24 an example of quantization noise of a sigma delta oversampling modulator in accordance with the present invention;

FIG. 25 is a schematic block diagram of example outputs of the different stages of an analog to digital conversion circuit in accordance with the present invention;

FIG. 26 is an example of sampling an analog signal to produce a digitized signal in accordance with the present invention;

FIG. 27 is a schematic block diagram of a digital filter implementing a multiply-accumulate function in accordance with the present invention;

FIG. 28 is a schematic block diagram of a digital filter implementing a multiply-accumulate function in accordance with the present invention;

FIG. 29 is an example of a digitized signal in accordance with the present invention;

FIG. 30 is an example of producing a digital filtered output in accordance with the present invention;

FIG. 31 is a schematic block diagram of an embodiment of a digital decimation filtering circuit in accordance with the present invention;

FIG. 32 is an example frequency response H(z) of an anti-aliasing filter in accordance with the present invention;

FIG. 33 is a schematic block diagram of an embodiment of an anti-aliasing filter in accordance with the present invention;

FIG. 34 is a schematic block diagram of an embodiment of a decimator in accordance with the present invention;

FIG. 35 is an example of a frequency band having frequency channels in accordance with the present invention;

FIG. 36 is a schematic block diagram of another embodiment of digital decimation filtering circuit in accordance with the present invention;

FIG. 37 is a schematic block diagram of another embodiment of digital decimation filtering circuit in accordance with the present invention;

FIG. 38 is a schematic block diagram of an example of polyphase filters of digital decimation filtering circuit in accordance with the present invention;

FIG. 39 is a schematic block diagram of another embodiment of the digital decimation filtering circuit in accordance with the present invention;

FIG. 40 is a schematic block diagram of an example of a shift register memory in accordance with the present invention;

FIG. 41 is a schematic block diagram of another embodiment of the digital decimation filtering circuit in accordance with the present invention;

FIG. 42 is an example of a frequency band having n frequency channels in accordance with the present invention;

FIG. 43 is a schematic block diagram of an embodiment of digital bandpass filter (BPF) circuit in accordance with the present invention;

FIG. 44 is an example frequency response H(z) of a digital bandpass filter (BPF) circuit in accordance with the present invention;

FIG. 45 is an example frequency response H(z) of a digital bandpass filter (BPF) circuit in accordance with the present invention;

FIGS. 46A-46D are examples of processing a signal by a digital bandpass filter (BPF) circuit in accordance with the present invention;

FIGS. 47A-47D are examples of processing a signal by a digital bandpass filter (BPF) circuit in accordance with the present invention;

FIG. 48 is a schematic block diagram of an embodiment of digital bandpass filter (BPF) circuit in accordance with the present invention;

FIG. 49 is a schematic block diagram of another embodiment of analog to digital conversion circuit in accordance with the present invention;

FIG. 50 is a schematic block diagram of an embodiment of a first bandpass filter (BPF) circuit in accordance with the present invention;

FIG. 51 is a schematic block diagram of an embodiment of a second bandpass filter (BPF) circuit in accordance with the present invention;

FIG. 52 is a schematic block diagram of an embodiment of a coefficient processor in accordance with the present invention;

FIG. 53 is a schematic block diagram of another embodiment of analog to digital conversion circuit in accordance with the present invention; and FIG. 54 is a schematic block diagram of an embodiment of processing module controls within the analog to digital conversion circuit.

DETAILED DESCRIPTION OF THE INVENTION

Figure 1:
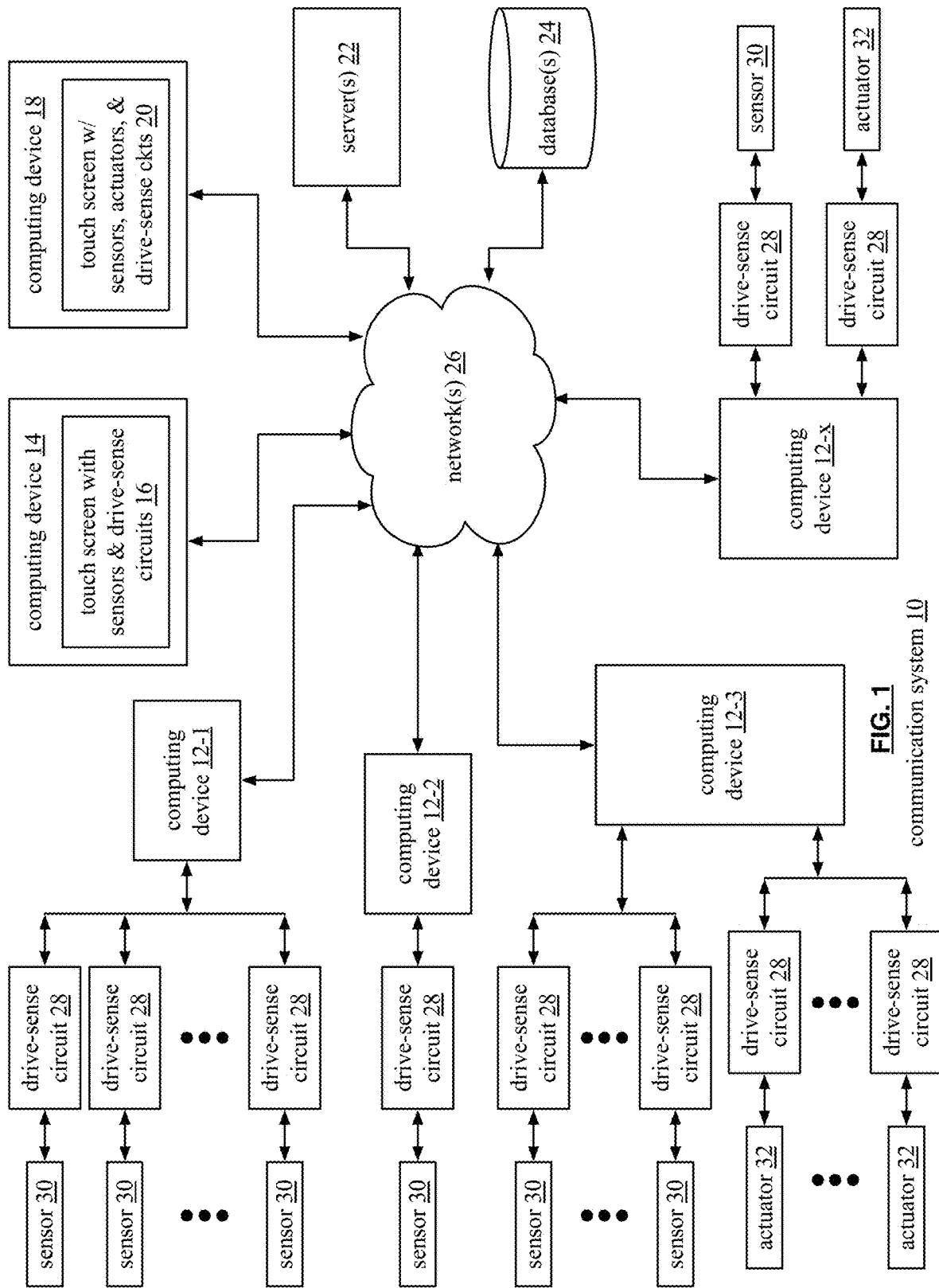
FIG. 1 is a schematic block diagram of an embodiment of a communication system in accordance with the present invention.

FIG. 1 is a schematic block diagram of an embodiment of a communication system 10 that includes a plurality of computing. devices 12-10, one or more servers 22, one or more databases 24, one or more networks 26, a plurality of drive-sense circuits 28, a plurality of sensors 30, and a plurality of actuators 32. Computing devices 14 include a touch screen 16 with sensors and drive-sensor circuits and computing devices 18 include a touch & tactic screen 20 that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of drive-sense circuits 28, which, in turn, communicate with a plurality of sensors 30. The sensors 30 and/or the drive-sense circuits 28 are within the computing device 12-1 and/or external to it. For example, the sensors 30 may be external to the computing device 12-1 and the drive-sense circuits are within the computing device 12-1. As another example, both the sensors 30 and the drive-sense circuits 28 are external to the computing device 12-1. When the drive-sense circuits 28 are external to the computing device, they are coupled to the computing device 12-1 via wired and/or wireless communication links as will be discussed in greater detail with reference to one or more of FIGS. 5A-5C.

The computing device 12-1 communicates with the drive-sense circuits 28 to; (a) turn them on, (b) obtain data from the sensors (individually and/or collectively), (c) instruct the drive sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The drive-sense circuits 28 have their own power source (e.g., battery, power supply, etc.) and are proximally located to their respective sensors 30. At desired time intervals (milliseconds, seconds, minutes, hours, etc.), the drive-sense circuits 28 provide a regulated source signal or a power signal to the sensors 30. An electrical characteristic of the sensor 30 affects the regulated source signal or power signal, which is reflective of the condition (e.g., the flow rate and/or the pressure) that sensor is sensing.

The drive-sense circuits 28 detect the effects on the regulated source signal or power signals as a result of the electrical characteristics of the sensors. The drive-sense circuits 28 then generate signals representative of change to the regulated source signal or power signal based on the detected effects on the power signals. The changes to the regulated source signals or power signals are representative of the conditions being sensed by the sensors 30.

The drive-sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a drive-sense circuit 28, which is, in turn, coupled to a senor 30. The sensor 30 and/or the drive-sense circuit 28 may be internal and/or external to the computing device 12-2. In this example, the sensor 30 is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the drive-sense circuit 28 provides the regulated source signal or power signal to the sensor 30 and detects an effect to the regulated source signal or power signal based on an electrical characteristic of the sensor. The drive-sense circuit generates a representative signal of the affect and sends it to the computing device 12-2.

In another example of operation, computing device 12-3 is coupled to a plurality of drive-sense circuits 28 that are coupled to a plurality of sensors 30 and is coupled to a plurality of drive-sense circuits 28 that are coupled to a plurality of actuators 32. The generally functionality of the drive-sense circuits 28 coupled to the sensors 30 in accordance with the above description.

Since an actuator 32 is essentially an inverse of a sensor in that an actuator converts an electrical signal into a physical condition, while a sensor converts a physical condition into an electrical signal, the drive-sense circuits 28 can be used to power actuators 32. Thus, in this example, the computing device 12-3 provides actuation signals to the drive-sense circuits 28 for the actuators 32. The drive-sense circuits modulate the actuation signals on to power signals or regulated control signals, which are provided to the actuators 32. The actuators 32 are powered from the power signals or regulated control signals and produce the desired physical condition from the modulated actuation signals.

As another example of operation, computing device 12-x is coupled to a drive-sense circuit 28 that is coupled to a sensor 30 and is coupled to a drive-sense circuit 28 that is coupled to an actuator 32. In this example, the sensor 30 and the actuator 32 are for use by the computing device 12-x. For example, the sensor 30 may be a piezoelectric microphone and the actuator 32 may be a piezoelectric speaker.

Figure 2:
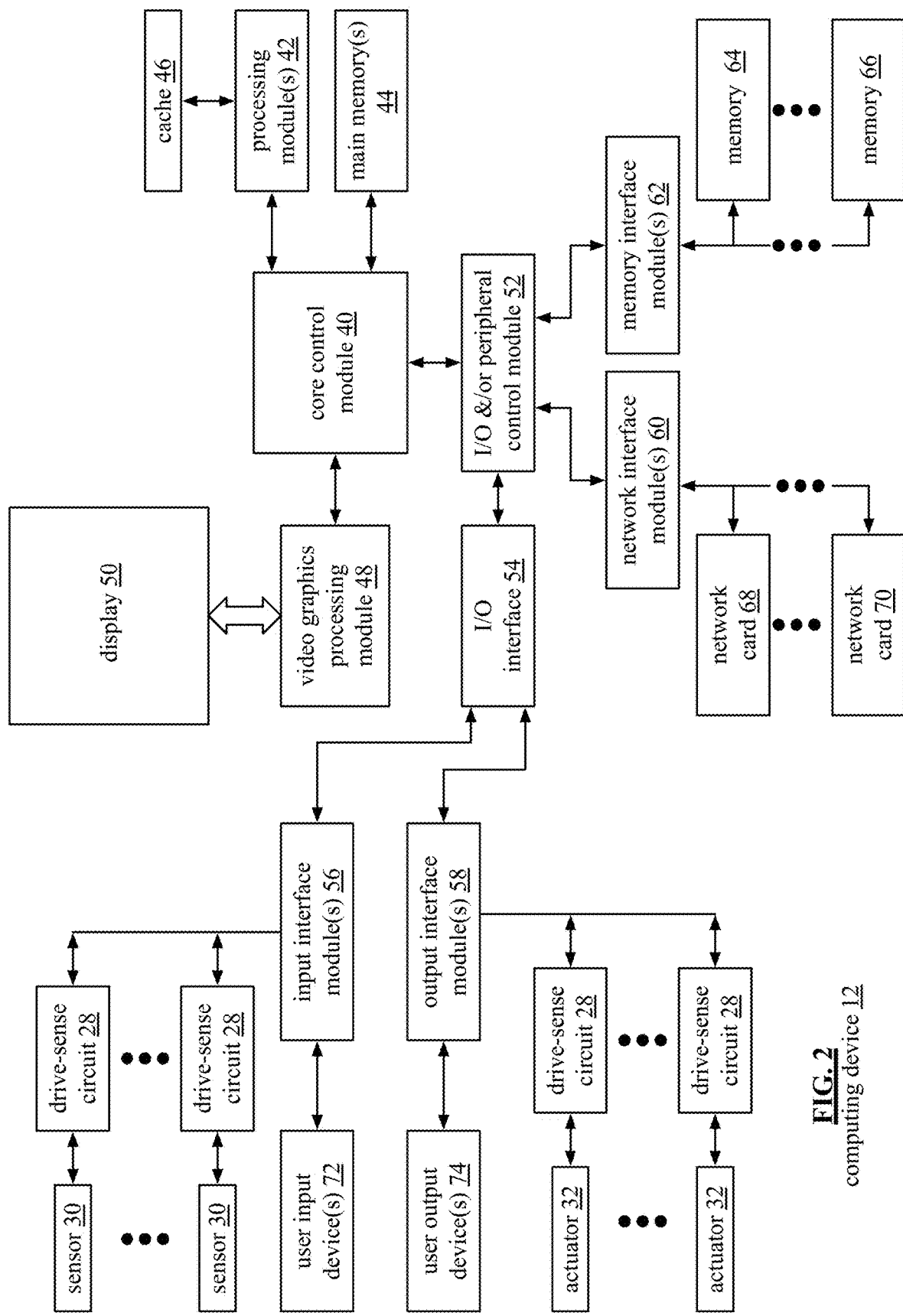
FIG. 2 is a schematic block diagram of an embodiment of a computing device in accordance with the present invention.

FIG. 2 is a schematic block diagram of an embodiment of a computing device 12 (e.g., any one of 12-1 through 12-x). The computing device 12 includes a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 (4th generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

FIG. 2 further illustrates sensors 30 and actuators 32 coupled to drive-sense circuits 28, which are coupled to the input interface module 56 (e.g., USB port). Alternatively, one or more of the drive-sense circuits 28 is coupled to the computing device via a wireless network card (e.g., WLAN) or a wired network card (e.g., Gigabit LAN). While not shown, the computing device 12 further includes a BIOS (Basic Input Output System) memory coupled to the core control module 40.

Figure 3:
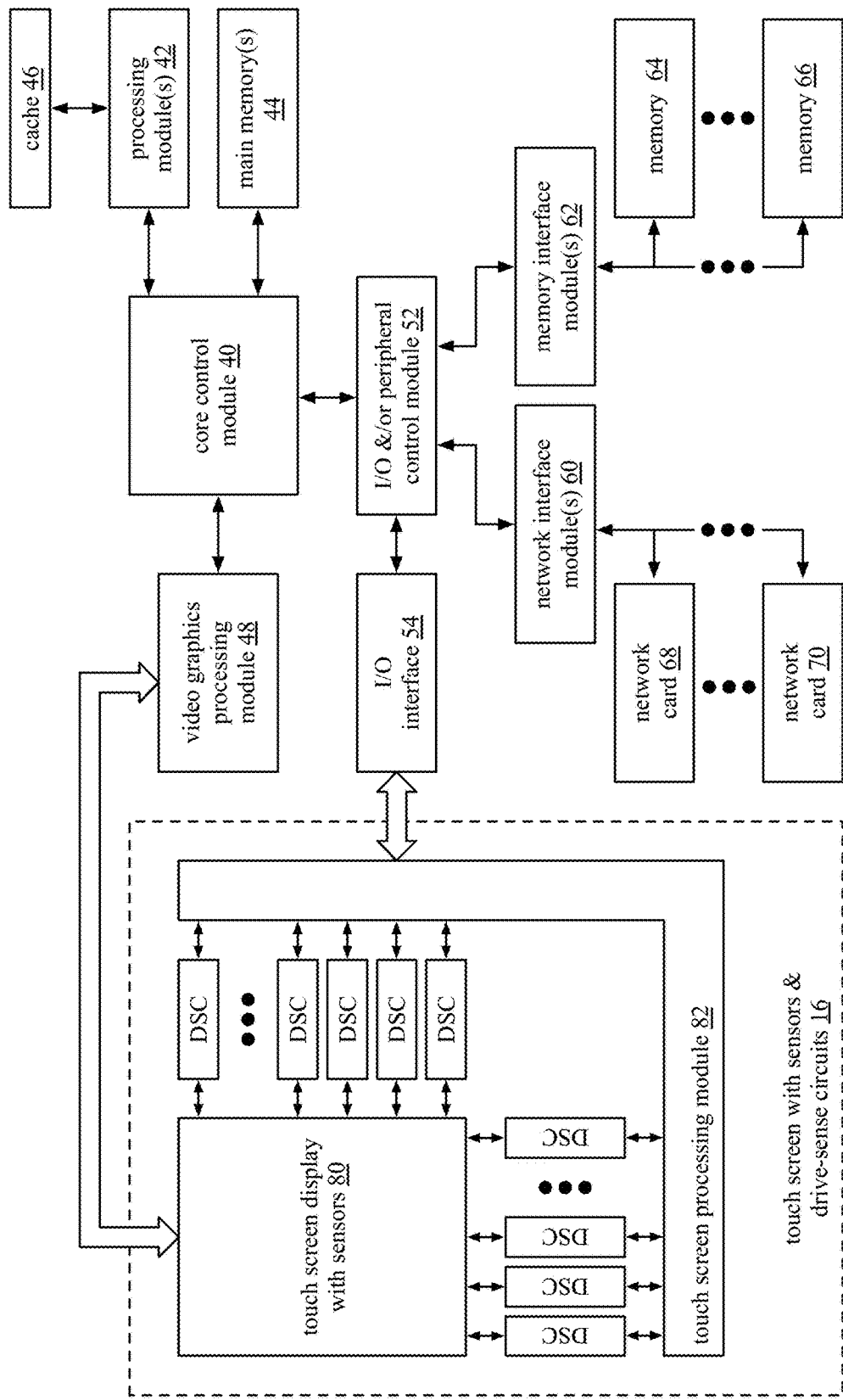
FIG. 3 is a schematic block diagram of another embodiment of a computing device in accordance with the present invention.

FIG. 3 is a schematic block diagram of another embodiment of a computing device 14 that includes a core control module 40, one or more processing modules 42, one or more main memories 44, cache memory 46, a video graphics processing module 48, a touch screen 16, an Input-Output (I/O) peripheral control module 52, one or more input interface modules 56, one or more output interface modules 58, one or more network interface modules 60, and one or more memory interface modules 62. The touch screen 16 includes a touch screen display 80, a plurality of sensors 30, a plurality of drive-sense circuits (DSC), and a touch screen processing module 82.

Computing device 14 operates similarly to computing device 12 of FIG. 2 with the addition of a touch screen as an input device. The touch screen includes a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes). The drive-sense circuits (DSC) coupled to the affected sensors detect the change and provide a representation of the change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 4:
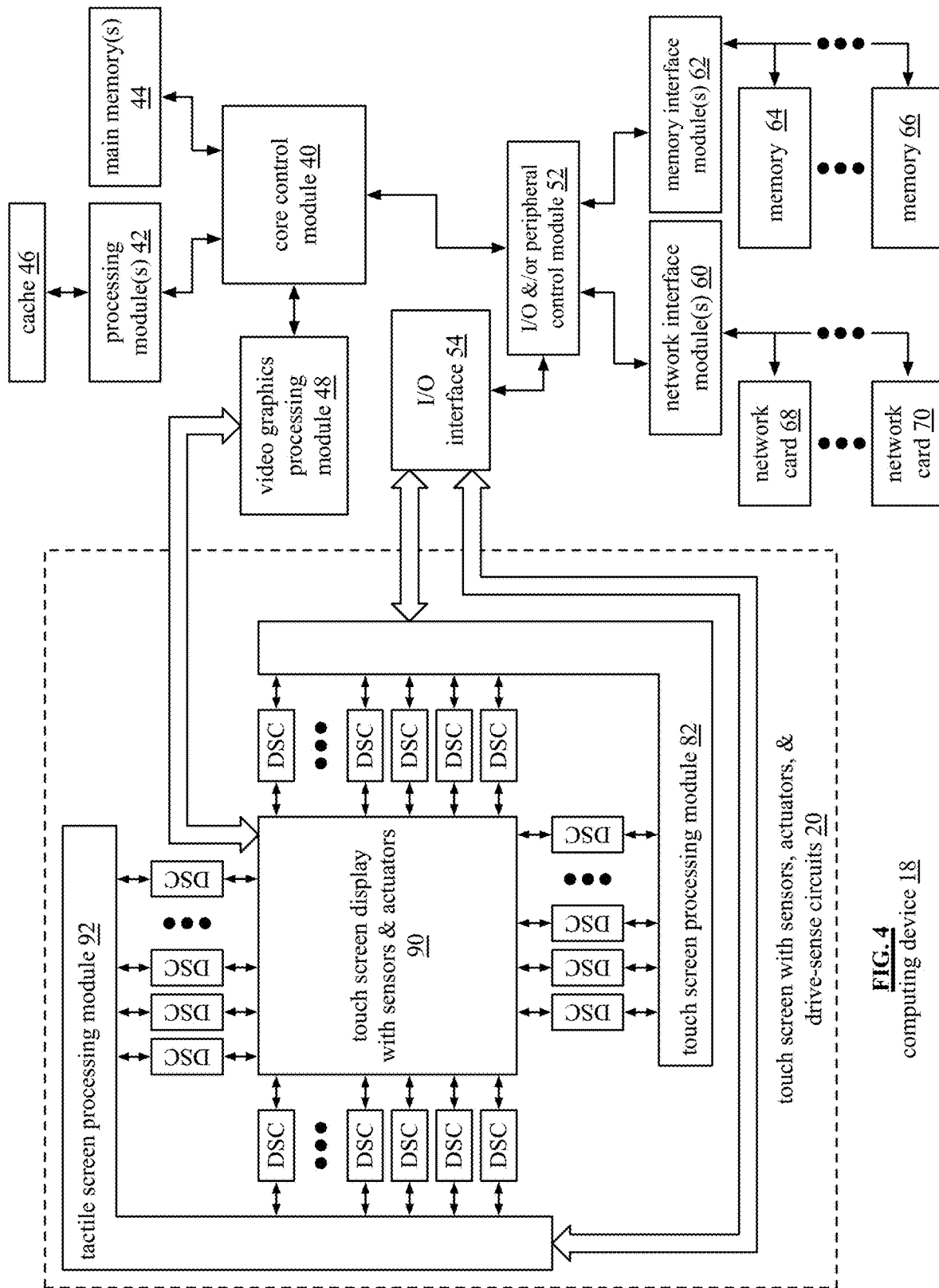
FIG. 4 is a schematic block diagram of another embodiment of a computing device in accordance with the present invention.

FIG. 4 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and tactile screen display 90, a plurality of sensors 30, a plurality of actuators 32, a plurality of drive-sense circuits (DSC), a touch screen processing module 82, and a tactile screen processing module 92.

Computing device 18 operates similarly to computing device 14 of FIG. 3 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate drive-sense circuits (DSC) via the tactile screen processing module 92, which may be a stand-alone processing module or integrated into processing module 42. The drive-sense circuits (DSC) convert the tactile data into drive-actuate signals and provide them to the appropriate actuators to create the desired tactile feel on the screen 20.

FIG. 5A is a schematic plot diagram of a computing subsystem 25 that includes a sensed data processing module 65, a plurality of communication modules 61A-x, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing devices in which processing modules 42A-x reside.

A drive-sense circuit 28 (or multiple drive-sense circuits), a processing module (e.g., 41A), and a communication module (e.g., 61A) are within a common computing device. Each grouping of a drive-sense circuit(s), processing module, and communication module is in a separate computing device. A communication module 61A-x is constructed in accordance with one or more wired communication protocol and/or one or more wireless communication protocols that is/are in accordance with the one or more of the Open System Interconnection (OSI) model, the Transmission Control Protocol/Internet Protocol (TCP/IP) model, and other communication protocol module.

In an example of operation, a processing module (e.g., 42A) provides a control signal to its corresponding drive-sense circuit 28. The processing module 42 A may generate the control signal, receive it from the sensed data processing module 65, or receive an indication from the sensed data processing module 65 to generate the control signal. The control signal enables the drive-sense circuit 28 to provide a drive signal to its corresponding sensor. The control signal may further include a reference signal having one or more frequency components to facilitate creation of the drive signal and/or interpreting a sensed signal received from the sensor.

Based on the control signal, the drive-sense circuit 28 provides the drive signal to its corresponding sensor (e.g., 1) on a drive & sense line. While receiving the drive signal (e.g., a power signal, a regulated source signal, etc.), the sensor senses a physical condition 1-x (e.g., acoustic waves, a biological condition, a chemical condition, an electric condition, a magnetic condition, an optical condition, a thermal condition, and/or a mechanical condition). As a result of the physical condition, an electrical characteristic (e.g., impedance, voltage, current, capacitance, inductance, resistance, reactance, etc.) of the sensor changes, which affects the drive signal. Note that if the sensor is an optical sensor, it converts a sensed optical condition into an electrical characteristic.

The drive-sense circuit 28 detects the effect on the drive signal via the drive & sense line and processes the affect to produce a signal representative of power change, which may be an analog or digital signal. The processing module 42A receives the signal representative of power change, interprets it, and generates a value representing the sensed physical condition. For example, if the sensor is sensing pressure, the value representing the sensed physical condition is a measure of pressure (e.g., x PSI (pounds per square inch)).

In accordance with a sensed data process function (e.g., algorithm, application, etc.), the sensed data processing module 65 gathers the values representing the sensed physical conditions from the processing modules. Since the sensors 1-x may be the same type of sensor (e.g., a pressure sensor), may each be different sensors, or a combination thereof; the sensed physical conditions may be the same, may each be different, or a combination thereof. The sensed data processing module 65 processes the gathered values to produce one or more desired results. For example, if the computing subsystem 25 is monitoring pressure along a pipeline, the processing of the gathered values indicates that the pressures are all within normal limits or that one or more of the sensed pressures is not within normal limits.

As another example, if the computing subsystem 25 is used in a manufacturing facility, the sensors are sensing a variety of physical conditions, such as acoustic waves (e.g., for sound proofing, sound generation, ultrasound monitoring, etc.), a biological condition (e.g., a bacterial contamination, etc.) a chemical condition (e.g., composition, gas concentration, etc.), an electric condition (e.g., current levels, voltage levels, electro-magnetic interference, etc.), a magnetic condition (e.g., induced current, magnetic field strength, magnetic field orientation, etc.), an optical condition (e.g., ambient light, infrared, etc.), a thermal condition (e.g., temperature, etc.), and/or a mechanical condition (e.g., physical position, force, pressure, acceleration, etc.).

The computing subsystem 25 may further include one or more actuators in place of one or more of the sensors and/or in addition to the sensors. When the computing subsystem 25 includes an actuator, the corresponding processing module provides an actuation control signal to the corresponding drive-sense circuit 28. The actuation control signal enables the drive-sense circuit 28 to provide a drive signal to the actuator via a drive & actuate line (e.g., similar to the drive & sense line, but for the actuator). The drive signal includes one or more frequency components and/or amplitude components to facilitate a desired actuation of the actuator.

In addition, the computing subsystem 25 may include an actuator and sensor working in concert. For example, the sensor is sensing the physical condition of the actuator. In this example, a drive-sense circuit provides a drive signal to the actuator and another drive sense signal provides the same drive signal, or a scaled version of it, to the sensor. This allows the sensor to provide near immediate and continuous sensing of the actuator's physical condition. This further allows for the sensor to operate at a first frequency and the actuator to operate at a second frequency.

In an embodiment, the computing subsystem is a stand-alone system for a wide variety of applications (e.g., manufacturing, pipelines, testing, monitoring, security, etc.). In another embodiment, the computing subsystem 25 is one subsystem of a plurality of subsystems forming a larger system. For example, different subsystems are employed based on geographic location. As a specific example, the computing subsystem 25 is deployed in one section of a factory and another computing subsystem is deployed in another part of the factory. As another example, different subsystems are employed based function of the subsystems. As a specific example, one subsystem monitors a city's traffic light operation and another subsystem monitors the city's sewage treatment plants.

Regardless of the use and/or deployment of the computing system, the physical conditions it is sensing, and/or the physical conditions it is actuating, each sensor and each actuator (if included) is driven and sensed by a single line as opposed to separate drive and sense lines. This provides many advantages including, but not limited to, lower power requirements, better ability to drive high impedance sensors, lower line to line interference, and/or concurrent sensing functions.

FIG. 5B is a schematic block diagram of another embodiment of a computing subsystem 25 that includes a sensed data processing module 65, a communication module 61, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device, devices, in which processing modules 42A-x reside.

In an embodiment, the drive-sense circuits 28, the processing modules, and the communication module are within a common computing device. For example, the computing device includes a central processing unit that includes a plurality of processing modules. The functionality and operation of the sensed data processing module 65, the communication module 61, the processing modules 42A-x, the drive sense circuits 28, and the sensors 1-x are as discussed with reference to FIG. 5A.

Figure 5C:
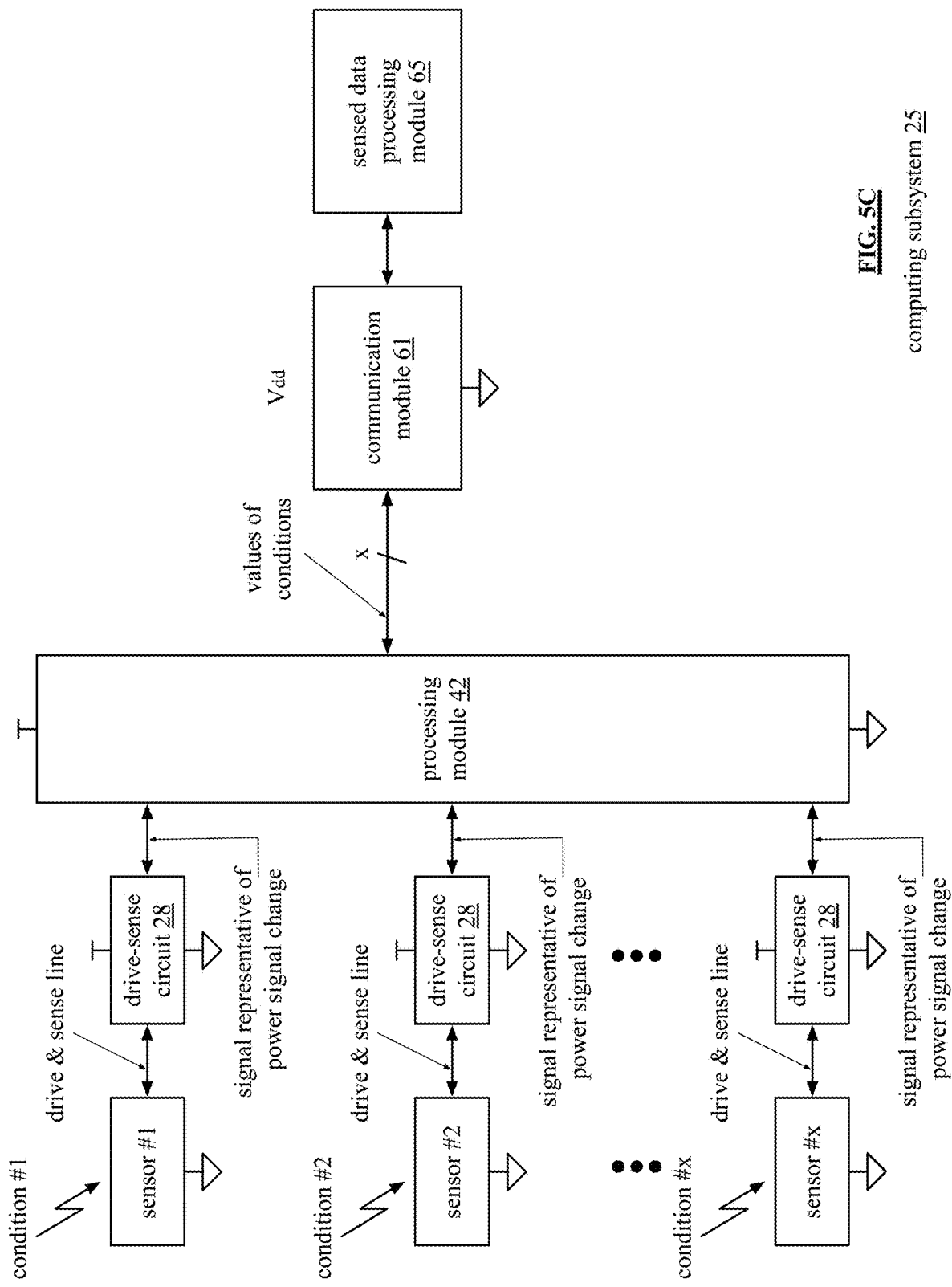
FIG. 5C is a schematic block diagram of another embodiment of a computing subsystem in accordance with the present invention.

FIG. 5C is a schematic block diagram of another embodiment of a computing subsystem 25 that includes a sensed data processing module 65, a communication module 61, a processing module 42, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device in which the processing module 42 resides.

In an embodiment, the drive-sense circuits 28, the processing module, and the communication module are within a common computing device. The functionality and operation of the sensed data processing module 65, the communication module 61, the processing module 42, the drive sense circuits 28, and the sensors 1-x are as discussed with reference to FIG. 5A.

Figure 5D:
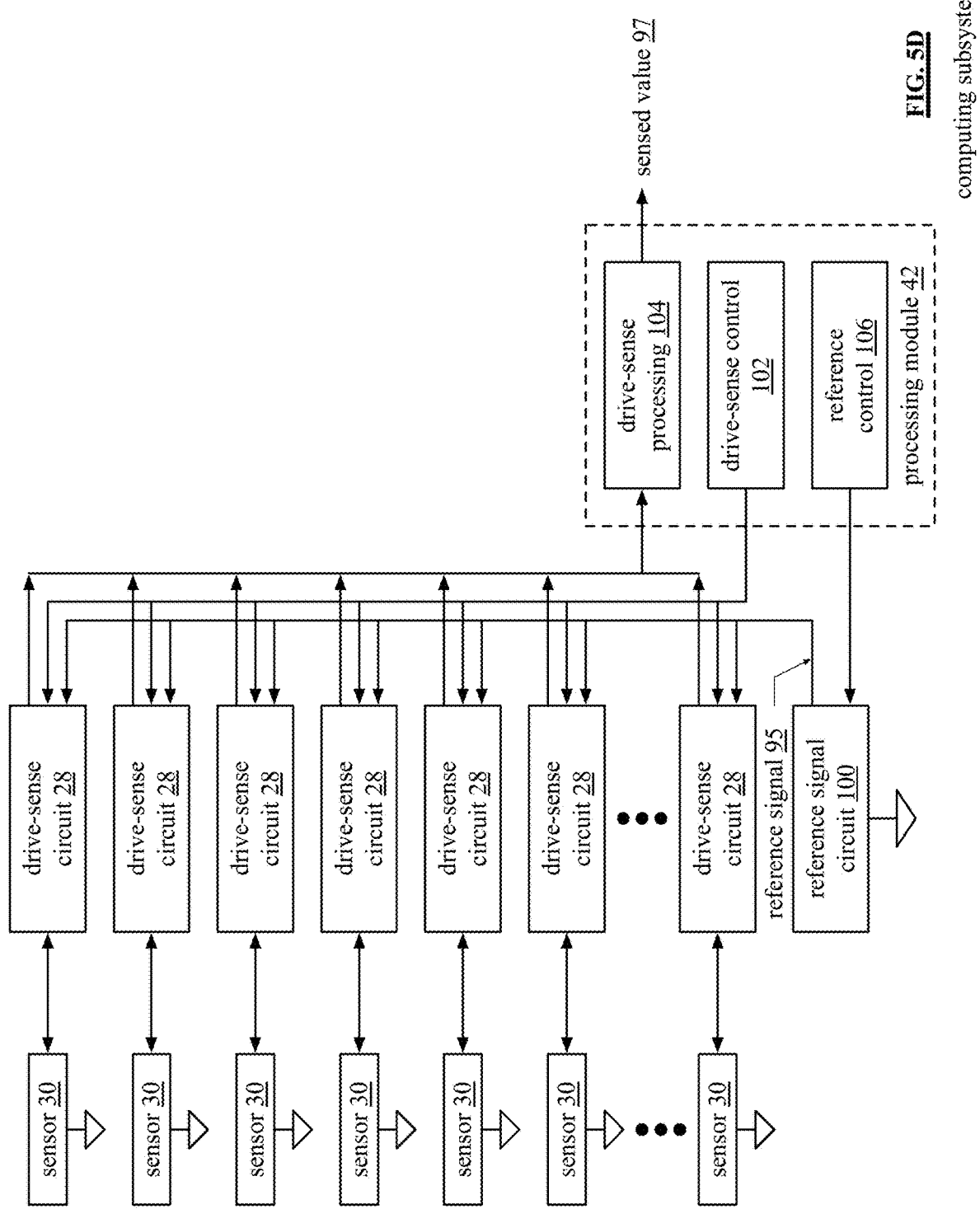
FIG. 5D is a schematic block diagram of another embodiment of a computing subsystem in accordance with the present invention.

FIG. 5D is a schematic block diagram of another embodiment of a computing subsystem 25 that includes a processing module 42, a reference signal circuit 100, a plurality of drive sense circuits 28, and a plurality of sensors 30. The processing module 42 includes a drive-sense processing block 104, a drive-sense control block 102, and a reference control block 106. Each block 102-106 of the processing module 42 may be implemented via separate modules of the processing module, may be a combination of software and hardware within the processing module, and/or may be field programmable modules within the processing module 42.

In an example of operation, the drive-sense control block 104 generates one or more control signals to activate one or more of the drive-sense circuits 28. For example, the drive-sense control block 102 generates a control signal that enables of the drive-sense circuits 28 for a given period of time (e.g., 1 second, 1 minute, etc.). As another example, the drive-sense control block 102 generates control signals to sequentially enable the drive-sense circuits 28. As yet another example, the drive-sense control block 102 generates a series of control signals to periodically enable the drive-sense circuits 28 (e.g., enabled once every second, every minute, every hour, etc.).

Continuing with the example of operation, the reference control block 106 generates a reference control signal that it provides to the reference signal circuit 100. The reference signal circuit 100 generates, in accordance with the control signal, one or more reference signals for the drive-sense circuits 28. For example, the control signal is an enable signal, which, in response, the reference signal circuit 100 generates a pre-programmed reference signal that it provides to the drive-sense circuits 28. In another example, the reference signal circuit 100 generates a unique reference signal for each of the drive-sense circuits 28. In yet another example, the reference signal circuit 100 generates a first unique reference signal for each of the drive-sense circuits 28 in a first group and generates a second unique reference signal for each of the drive-sense circuits 28 in a second group.

The reference signal circuit 100 may be implemented in a variety of ways. For example, the reference signal circuit 100 includes a DC (direct current) voltage generator, an AC voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the reference signal. As examples, the reference signal circuit 100 generates a reference signal similar to the signals shown in FIG. 7, which will be subsequently discussed.

As another example, the reference signal circuit 100 includes a DC current generator, an AC current generator, and a current combining circuit. The DC current generator generates a DC current a first current level and the AC current generator generates an AC current at a second current level, which is less than or equal to the first current level. The current combining circuit combines the DC and AC currents to produce the reference signal.

Returning to the example of operation, the reference signal circuit 100 provides the reference signal, or signals, to the drive-sense circuits 28. When a drive-sense circuit 28 is enabled via a control signal from the drive sense control block 102, it provides a drive signal to its corresponding sensor 30. As a result of a physical condition, an electrical characteristic of the sensor is changed, which affects the drive signal. Based on the detected effect on the drive signal and the reference signal, the drive-sense circuit 28 generates a signal representative of the effect on the drive signal.

The drive-sense circuit provides the signal representative of the effect on the drive signal to the drive-sense processing block 104. The drive-sense processing block 104 processes the representative signal to produce a sensed value 97 of the physical condition (e.g., a digital value that represents a specific temperature, a specific pressure level, etc.). The processing module 42 provides the sensed value 97 to another application running on the computing device, to another computing device, and/or to a server 22.

Figure 5E:
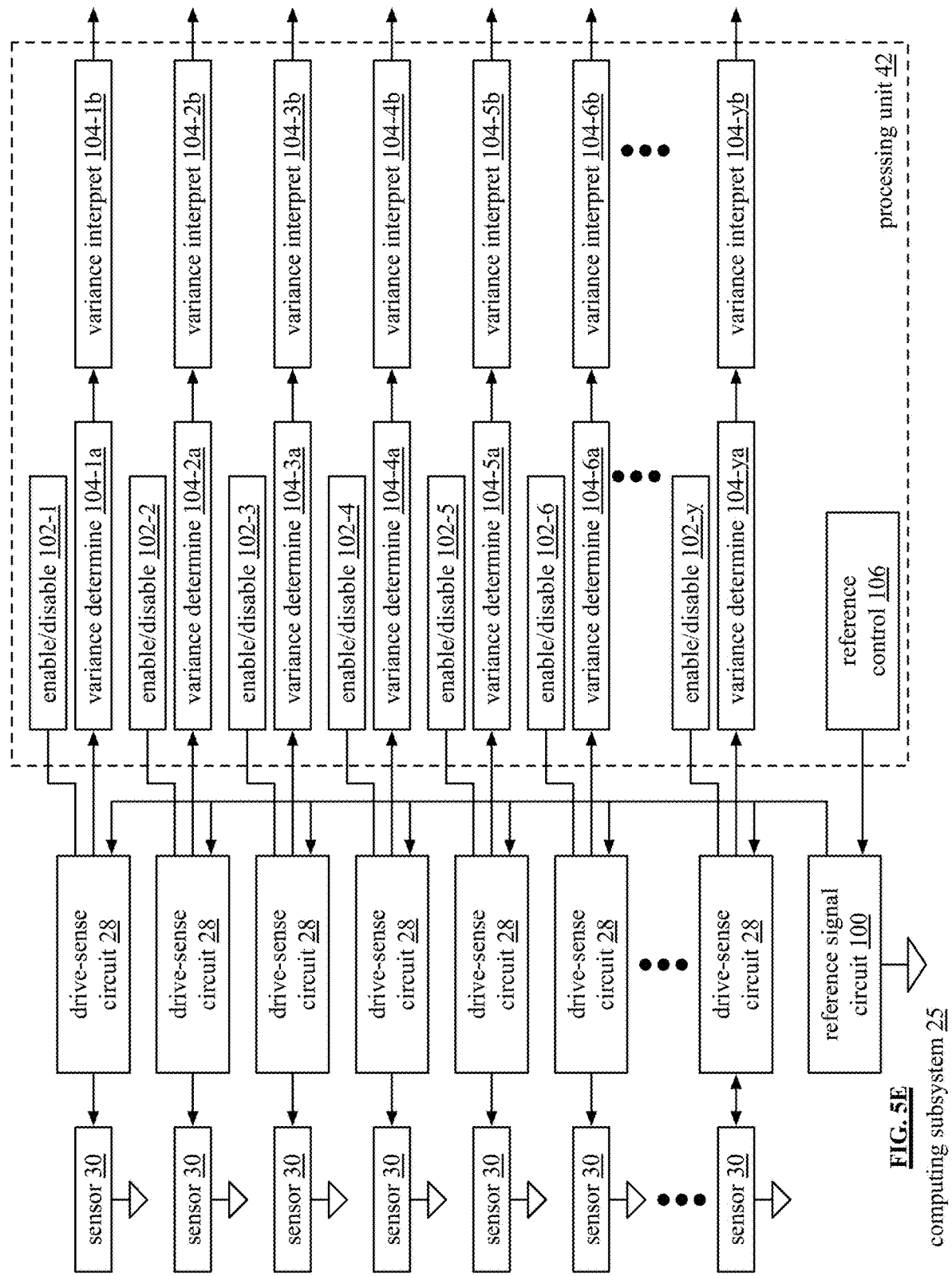
FIG. 5E is a schematic block diagram of another embodiment of a computing subsystem in accordance with the present invention.

FIG. 5E is a schematic block diagram of another embodiment of a computing subsystem 25 that includes a processing module 42, a plurality of drive sense circuits 28, and a plurality of sensors 30. This embodiment is similar to the embodiment of FIG. 5D with the functionality of the drive-sense processing block 104, a drive-sense control block 102, and a reference control block 106 shown in greater detail. For instance, the drive-sense control block 102 includes individual enable/disable blocks 102-1 through 102-y. An enable/disable block functions to enable or disable a corresponding drive-sense circuit in a manner as discussed above with reference to FIG. 5D.

The drive-sense processing block 104 includes variance determining modules 104-1a through y and variance interpreting modules 104-2a through y. For example, variance determining module 104-1a receives, from the corresponding drive-sense circuit 28, a signal representative of a physical condition sensed by a sensor. The variance determining module 104-1a functions to determine a difference from the signal representing the sensed physical condition with a signal representing a known, or reference, physical condition. The variance interpreting module 104-1*b* interprets the difference to determine a specific value for the sensed physical condition.

As a specific example, the variance determining module 104-1*a* receives a digital signal of 1001 0110 (150 in decimal) that is representative of a sensed physical condition (e.g., temperature) sensed by a sensor from the corresponding drive-sense circuit 28. With 8-bits, there are 28 (256) possible signals representing the sensed physical condition. Assume that the units for temperature is Celsius and a digital value of 0100 0000 (64 in decimal) represents the known value for 25 degree Celsius. The variance determining module 104-*b*1 determines the difference between the digital signal representing the sensed value (e.g., 1001 0110, 150 in decimal) and the known signal value of (e.g., 0100 0000, 64 in decimal), which is 0011 0000 (86 in decimal). The variance determining module 104-*b*1 then determines the sensed value based on the difference and the known value. In this example, the sensed value equals 25+86*(100/256)= 25+33.6=58.6 degrees Celsius.

Figure 6A:
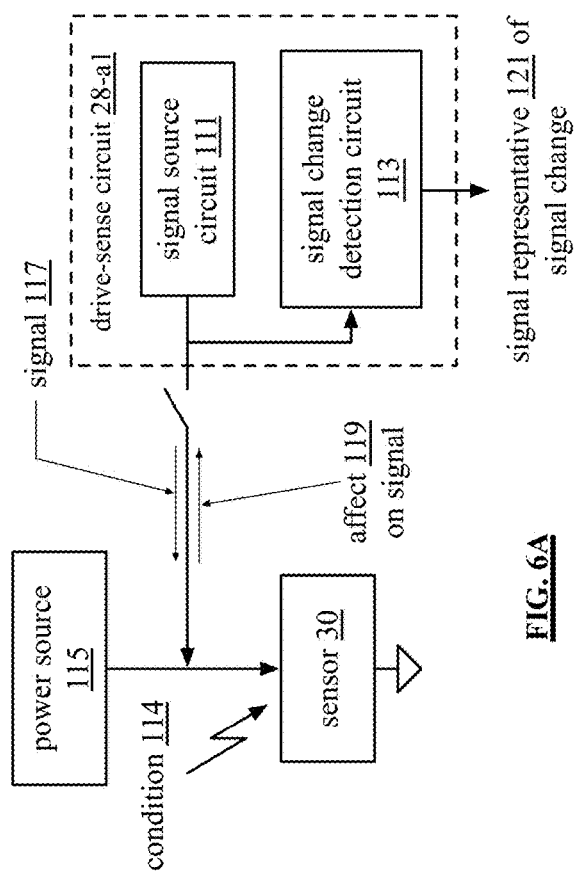
FIG. 6A is a schematic block diagram of another embodiment of a drive sense circuit in accordance with the present invention.
Figure 6:
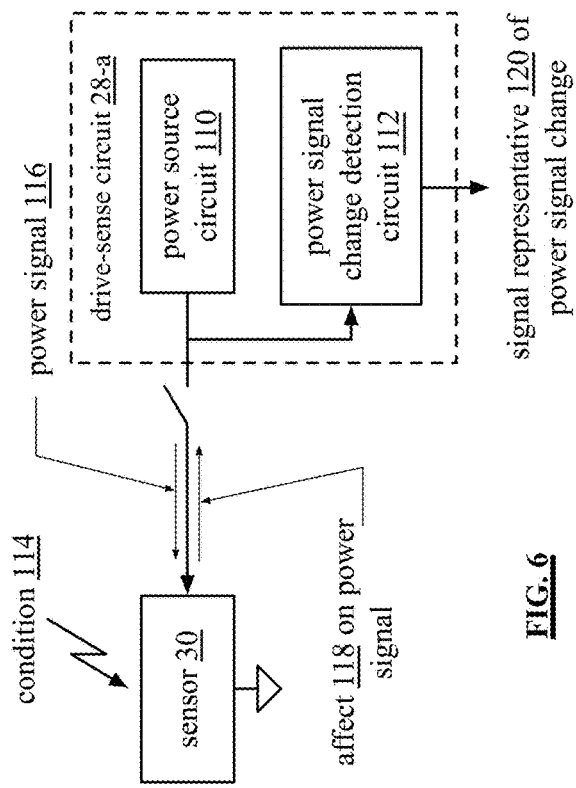
FIG. 6 is a schematic block diagram of an embodiment of a drive sense circuit in accordance with the present invention.

FIG. 6 is a schematic block diagram of a drive center circuit 28-*a* coupled to a sensor 30. The drive sense-sense circuit 28 includes a power source circuit 110 and a power signal change detection circuit 112. The sensor 30 includes one or more transducers that have varying electrical characteristics (e.g., capacitance, inductance, impedance, current, voltage, etc.) based on varying physical conditions 114 (e.g., pressure, temperature, biological, chemical, etc.), or vice versa (e.g., an actuator).

The power source circuit 110 is operably coupled to the sensor 30 and, when enabled (e.g., from a control signal from the processing module 42, power is applied, a switch is closed, a reference signal is received, etc.) provides a power signal 116 to the sensor 30. The power source circuit 110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provide a desired power level to the sensor and substantially matches impedance of the sensor. The power source circuit 110 generates the power signal 116 to include a DC (direct current) component and/or an oscillating component.

When receiving the power signal 116 and when exposed to a condition 114, an electrical characteristic of the sensor affects 118 the power signal. When the power signal change detection circuit 112 is enabled, it detects the affect 118 on the power signal as a result of the electrical characteristic of the sensor. For example, the power signal is a 1.5 voltage signal, and, under a first condition, the sensor draws 1 milliamp of current, which corresponds to an impedance of 1.5 K Ohms. Under a second conditions, the power signal remains at 1.5 volts and the current increases to 1.5 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

As another example, the power signal is a 1.5 voltage signal, and, under a first condition, the sensor draws 1 milliamp of current, which corresponds to an impedance of 1.5 K Ohms. Under a second conditions, the power signal drops to 1.3 volts and the current increases to 1.3 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

Figure 7:
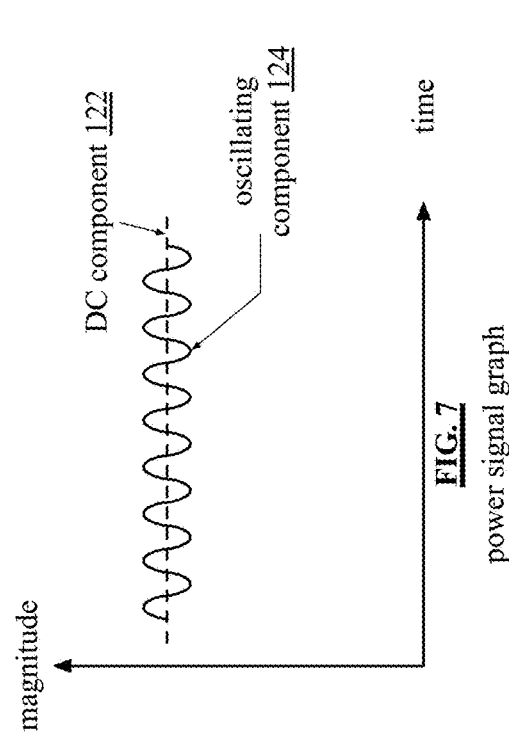
FIG. 7 is an example of a power signal graph in accordance with the present invention.

The power signal 116 includes a DC component 122 and/or an oscillating component 124 as shown in FIG. 7. The oscillating component 124 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Note that the power signal is shown without affect from the sensor as the result of a condition or changing condition.

In an embodiment, power generating circuit 110 varies frequency of the oscillating component 124 of the power signal 116 so that it can be tuned to the impedance of the sensor and/or to be off-set in frequency from other power signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

In an embodiment, the power generating circuit 110 varies magnitude of the DC component 122 and/or the oscillating component 124 to improve resolution of sensing and/or to adjust power consumption of sensing. In addition, the power generating circuit 110 generates the drive signal 110 such that the magnitude of the oscillating component 124 is less than magnitude of the DC component 122.

FIG. 6A is a schematic block diagram of a drive center circuit 28-*a*1 coupled to a sensor 30. The drive sense-sense circuit 28-*a*1 includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30.

The signal source circuit 111 may be a voltage supply circuit (e.g., a battery, a linear regulator, an unregulated DC-to-DC converter, etc.) to produce a voltage-based signal 117, a current supply circuit (e.g., a current source circuit, a current mirror circuit, etc.) to produce a current-based signal 117, or a circuit that provide a desired power level to the sensor and substantially matches impedance of the sensor. The signal source circuit 111 generates the signal 117 to include a DC (direct current) component and/or an oscillating component.

When receiving the combined signal (e.g., signal 117 and power from the power source) and when exposed to a condition 114, an electrical characteristic of the sensor affects 119 the signal. When the signal change detection circuit 113 is enabled, it detects the affect 119 on the signal as a result of the electrical characteristic of the sensor.

Figure 8:
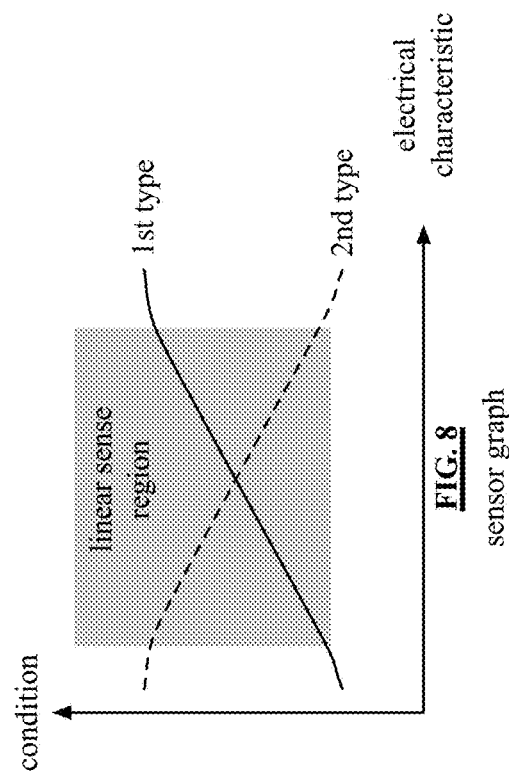
FIG. 8 is an example of a sensor graph in accordance with the present invention.

FIG. 8 is an example of a sensor graph that plots an electrical characteristic versus a condition. The sensor has a substantially linear region in which an incremental change in a condition produces a corresponding incremental change in the electrical characteristic. The graph shows two types of electrical characteristics: one that increases as the condition increases and the other that decreases and the condition increases. As an example of the first type, impedance of a temperature sensor increases and the temperature increases.

As an example of a second type, a capacitance touch sensor decreases in capacitance as a touch is sensed.

Figure 9:
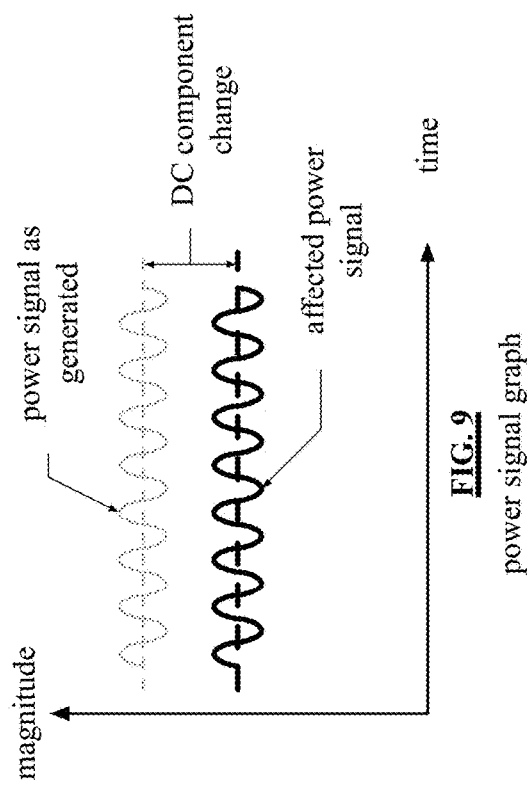
FIG. 9 is a schematic block diagram of another example of a power signal graph in accordance with the present invention.

FIG. 9 is a schematic block diagram of another example of a power signal graph in which the electrical characteristic or change in electrical characteristic of the sensor is affecting the power signal. In this example, the effect of the electrical characteristic or change in electrical characteristic of the sensor reduced the DC component but had little to no effect on the oscillating component. For example, the electrical characteristic is resistance. In this example, the resistance or change in resistance of the sensor decreased the power signal, inferring an increase in resistance for a relatively constant current.

Figure 10:
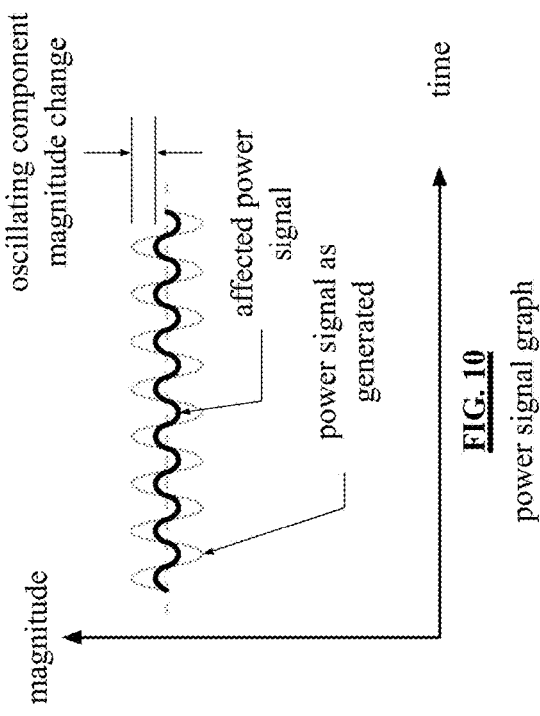
FIG. 10 is a schematic block diagram of another example of a power signal graph in accordance with the present invention.

FIG. 10 is a schematic block diagram of another example of a power signal graph in which the electrical characteristic or change in electrical characteristic of the sensor is affecting the power signal. In this example, the effect of the electrical characteristic or change in electrical characteristic of the sensor reduced magnitude of the oscillating component but had little to no effect on the DC component. For example, the electrical characteristic is impedance of a capacitor and/or an inductor. In this example, the impedance or change in impedance of the sensor decreased the magnitude of the oscillating signal component, inferring an increase in impedance for a relatively constant current.

Figure 11A:
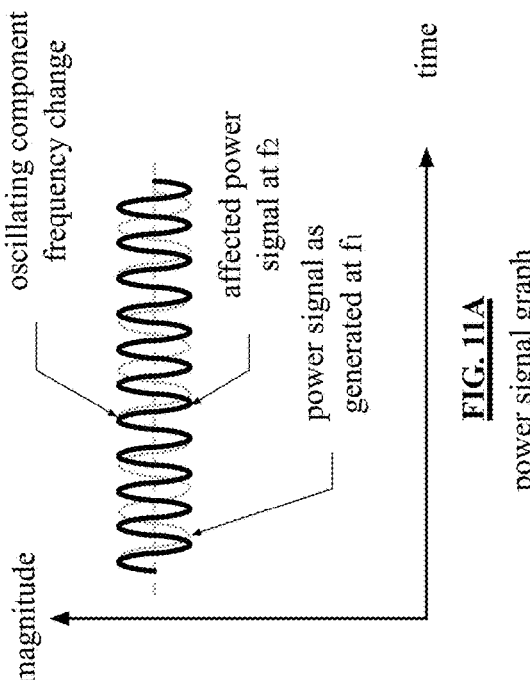
FIG. 11A is a schematic block diagram of another example of a power signal graph in accordance with the present invention.
Figure 11:
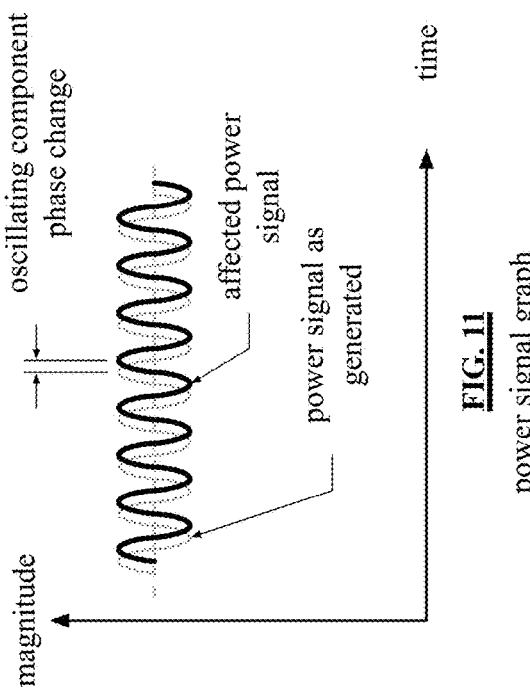
FIG. 11 is a schematic block diagram of another example of a power signal graph in accordance with the present invention.

FIG. 11 is a schematic block diagram of another example of a power signal graph in which the electrical characteristic or change in electrical characteristic of the sensor is affecting the power signal. In this example, the effect of the electrical characteristic or change in electrical characteristic of the sensor shifted frequency of the oscillating component but had little to no effect on the DC component. For example, the electrical characteristic is reactance of a capacitor and/or an inductor. In this example, the reactance or change in reactance of the sensor shifted frequency of the oscillating signal component, inferring an increase in reactance (e.g., sensor is functioning as an integrator or phase shift circuit).

FIG. 11A is a schematic block diagram of another example of a power signal graph in which the electrical characteristic or change in electrical characteristic of the sensor is affecting the power signal. In this example, the effect of the electrical characteristic or change in electrical characteristic of the sensor changes the frequency of the oscillating component but had little to no effect on the DC component. For example, the sensor includes two transducers that oscillate at different frequencies. The first transducer receives the power signal at a frequency of f1 and converts it into a first physical condition. The second transducer is stimulated by the first physical condition to create an electrical signal at a different frequency f2. In this example, the first and second transducers of the sensor change the frequency of the oscillating signal component, which allows for more granular sensing and/or a broader range of sensing.

Figure 12:
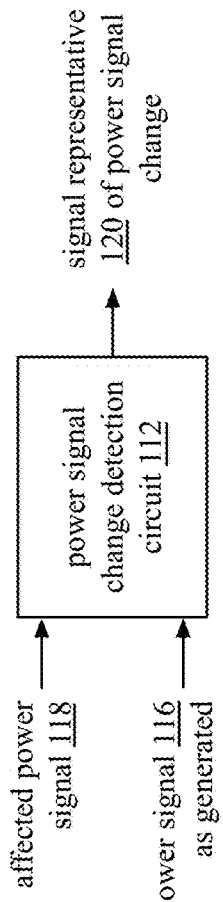
FIG. 12 is a schematic block diagram of an embodiment of a power signal change detection circuit in accordance with the present invention.

FIG. 12 is a schematic block diagram of an embodiment of a power signal change detection circuit 112 receiving the affected power signal 118 and the power signal 116 as generated to produce, therefrom, the signal representative 120 of the power signal change. The affect 118 on the power signal is the result of an electrical characteristic and/or change in the electrical characteristic of a sensor; a few examples of the affects are shown in FIGS. 8-11A.

In an embodiment, the power signal change detection circuit 112 detect a change in the DC component 122 and/or the oscillating component 124 of the power signal 116. The power signal change detection circuit 112 then generates the signal representative 120 of the change to the power signal based on the change to the power signal. For example, the change to the power signal results from the impedance of the sensor and/or a change in impedance of the sensor. The representative signal 120 is reflective of the change in the power signal and/or in the change in the sensor's impedance.

In an embodiment, the power signal change detection circuit 112 is operable to detect a change to the oscillating component at a frequency, which may be a phase shift, frequency change, and/or change in magnitude of the oscillating component. The power signal change detection circuit 112 is also operable to generate the signal representative of the change to the power signal based on the change to the oscillating component at the frequency. The power signal change detection circuit 112 is further operable to provide feedback to the power source circuit 110 regarding the oscillating component. The feedback allows the power source circuit 110 to regulate the oscillating component at the desired frequency, phase, and/or magnitude.

Figure 13:
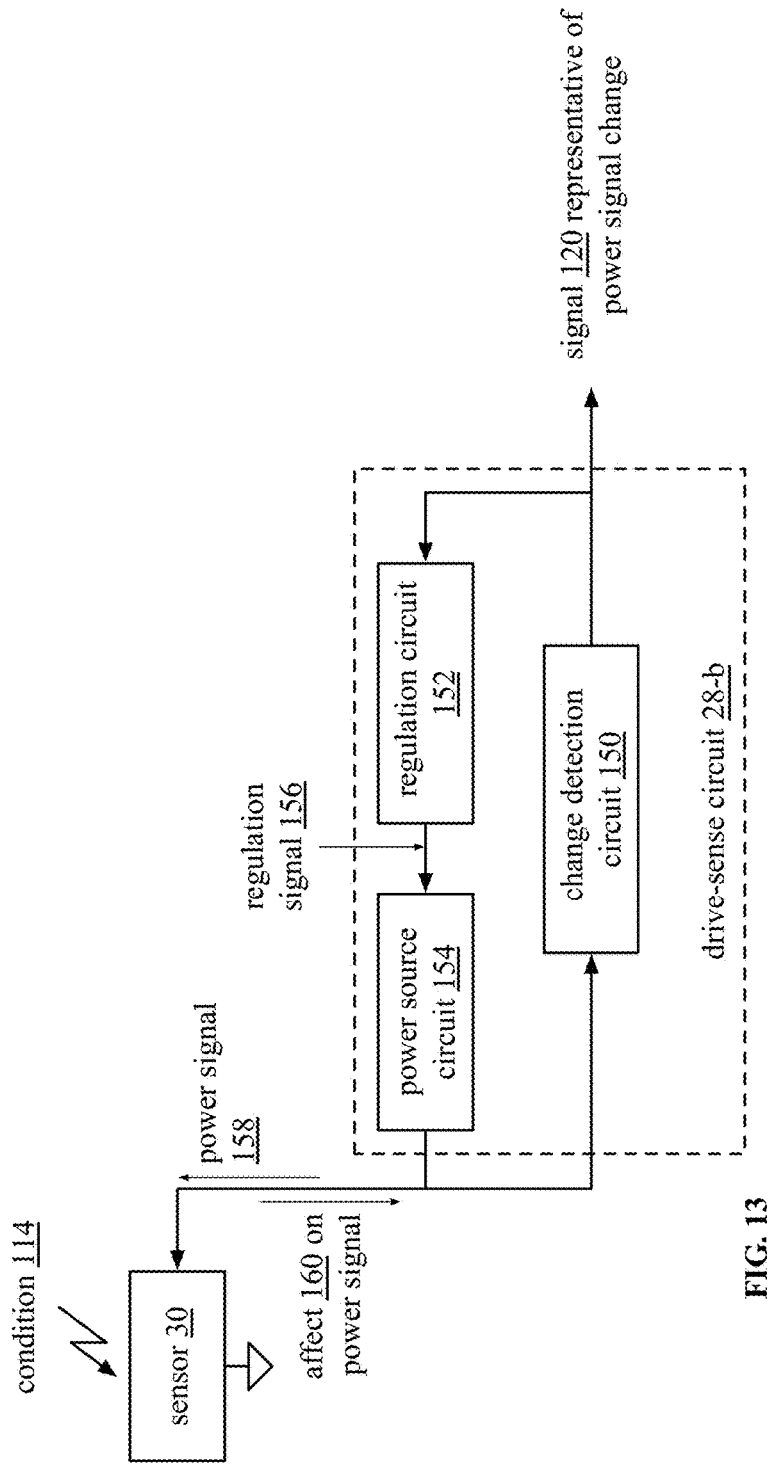
FIG. 13 is a schematic block diagram of another embodiment of a drive sense circuit in accordance with the present invention.

FIG. 13 is a schematic block diagram of another embodiment of a drive sense circuit 28-b includes a change detection circuit 150, a regulation circuit 152, and a power source circuit 154. The drive-sense circuit 28-b is coupled to the sensor 30, which includes a transducer that has varying electrical characteristics (e.g., capacitance, inductance, impedance, current, voltage, etc.) based on varying physical conditions 114 (e.g., pressure, temperature, biological, chemical, etc.).

The power source circuit 154 is operably coupled to the sensor 30 and, when enabled (e.g., from a control signal from the processing module 42, power is applied, a switch is closed, a reference signal is received, etc.) provides a power signal 158 to the sensor 30. The power source circuit 154 may be a voltage supply circuit (e.g., a battery, a linear regulator, an unregulated DC-to-DC converter, etc.) to produce a voltage-based power signal or a current supply circuit (e.g., a current source circuit, a current mirror circuit, etc.) to produce a current-based power signal. The power source circuit 154 generates the power signal 158 to include a DC (direct current) component and an oscillating component.

When receiving the power signal 158 and when exposed to a condition 114, an electrical characteristic of the sensor affects 160 the power signal. When the change detection circuit 150 is enabled, it detects the affect 160 on the power signal as a result of the electrical characteristic of the sensor 30. The change detection circuit 150 is further operable to generate a signal 120 that is representative of change to the power signal based on the detected effect on the power signal.

The regulation circuit 152, when its enabled, generates regulation signal 156 to regulate the DC component to a desired DC level and/or regulate the oscillating component to a desired oscillating level (e.g., magnitude, phase, and/or frequency) based on the signal 120 that is representative of the change to the power signal. The power source circuit 154 utilizes the regulation signal 156 to keep the power signal at a desired setting 158 regardless of the electrical characteristic of the sensor. In this manner, the amount of regulation is indicative of the affect the electrical characteristic had on the power signal.

In an example, the power source circuit 158 is a DC-DC converter operable to provide a regulated power signal having DC and AC components. The change detection circuit 150 is a comparator and the regulation circuit 152 is a pulse width modulator to produce the regulation signal 156. The comparator compares the power signal 158, which is affected by the sensor, with a reference signal that includes DC and AC components. When the electrical characteristics is at a first level (e.g., a first impedance), the power signal is regulated to provide a voltage and current such that the power signal substantially resembles the reference signal.

When the electrical characteristics changes to a second level (e.g., a second impedance), the change detection circuit 150 detects a change in the DC and/or AC component of the power signal 158 and generates the representative signal 120, which indicates the changes. The regulation circuit 152 detects the change in the representative signal 120 and creates the regulation signal to substantially remove the effect on the power signal. The regulation of the power signal 158 may be done by regulating the magnitude of the DC and/or AC components, by adjusting the frequency of AC component, and/or by adjusting the phase of the AC component.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

Figure 14:
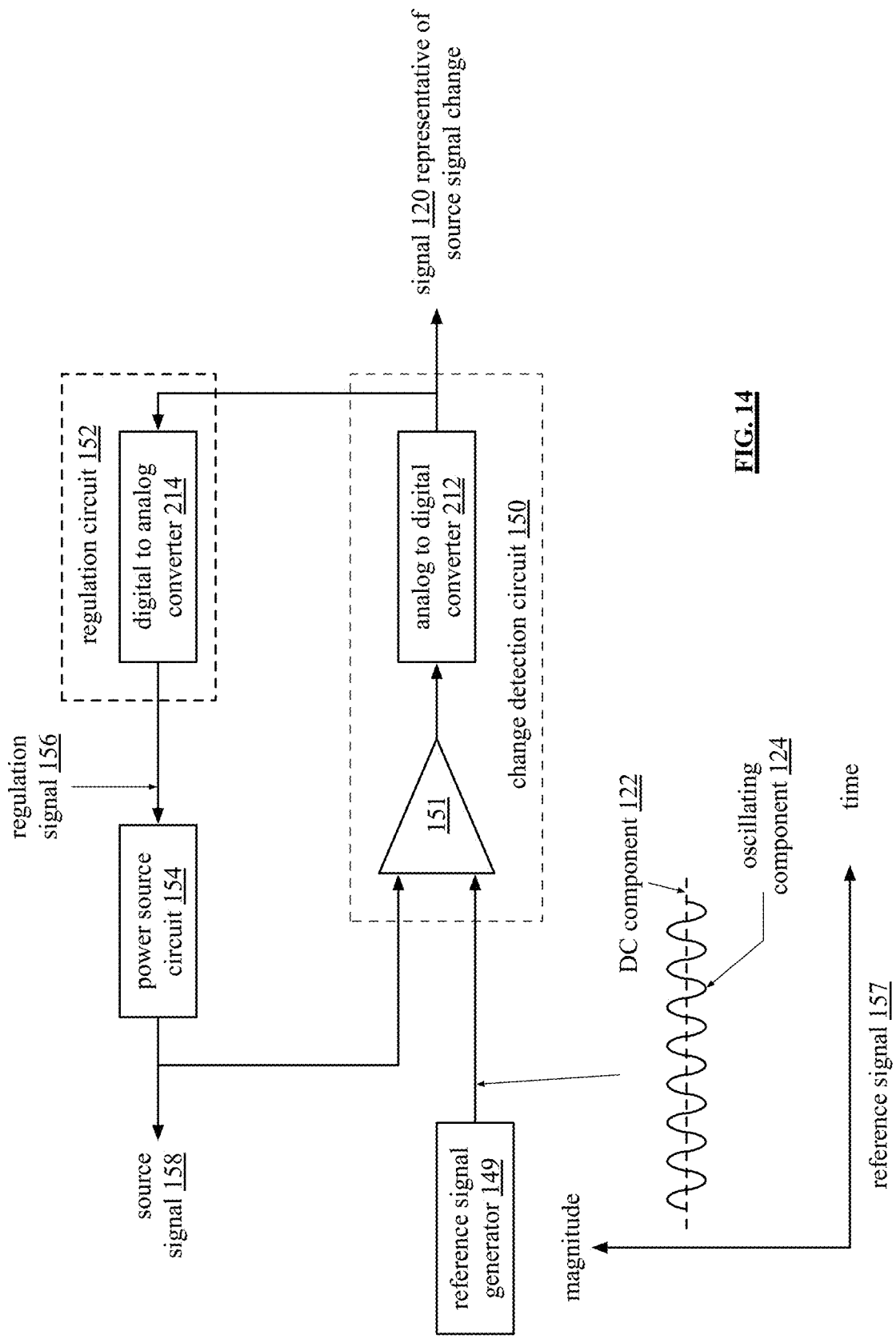
FIG. 14 is a schematic block diagram of an example of a drive sense circuit with a programmed reference signal generator in accordance with the present invention.

FIG. 14 is a schematic block diagram of an embodiment for providing a reference signal waveform for a drive-sense circuit. In an example, a sinusoidal waveform, such as oscillating component 124 is generated by reference signal generator 149, which is coupled to change detection circuit 150. Reference signal generator 149 can be a phase-locked loop (PLL) a crystal oscillator, a digital frequency synthesizer, and/or any other signal source that can provide a sinusoidal signal of desired frequency, phase shift, and/or magnitude.

In general, a power source circuit 154 produces a source signal 158 that is regulated to substantially match the sinusoidal reference signal 157. For example, the sinusoidal signal generated by reference signal generator 149 is useful when sensor 30 is one of a plurality of sensors sensing capacitance changes of a touch screen display. In such an environment, the use of a sinusoidal reference signal is readily generating and also does not introduce harmonics that may adversely affect the operation of the drive sense circuit, the touch screen operation of the display, and/or the display operation of the display.

The output of power source circuit 154 (source signal 158) and reference signal generator output (such as reference signal 157) are coupled to the inputs of Op-amp 151, the output of which is coupled to analog to digital converter (ADC) 212. Signal 120, which represents the source signal change is output by ADC 212 which output is also input to regulation circuit 152 and converted by digital to analog converter (DAC) 214; the output of regulation circuit 152 is coupled to power source circuit 154 to provide regulation signal 156 to power source circuit 154. The sinusoidal signal generated by reference signal generator 149 is non-linear signal and therefore has non-linear resolution.

Figure 15:
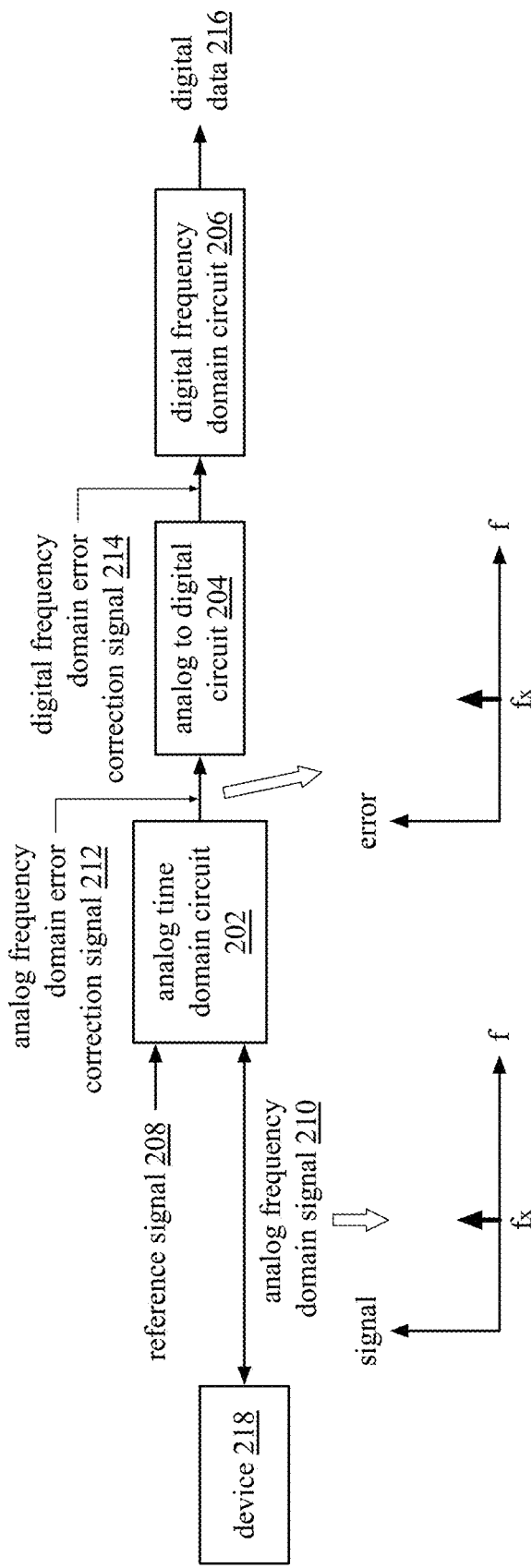
FIG. 15 is a schematic block diagram of an embodiment of a data sensing circuit in accordance with the present invention.

FIG. 15 is a schematic block diagram of an embodiment of a data sensing circuit 200 that includes an analog time domain circuit 202, an analog to digital circuit 204, and a digital frequency domain circuit 206. The data sensing circuit 200 operates in the time domain on information that is in the frequency domain. In general, the data sensing circuit 200 generates digital data 216 based on an analog frequency domain signal 210 (e.g., an analog signal with data in the frequency domain) and a reference signal 208. The resulting digital data 216 may be the desired output data or may require further processing to obtain the desired data output.

In an example of operation, the analog time domain circuit 202 outputs a signal component of the analog frequency domain signal 210 to a device 218. The analog time domain circuit 202 includes a regulated source circuit to generate the signal component. In one embodiment, the regulated source circuit is a dependent current source that is regulated to a specific current value based on the reference signal 208. In another embodiment, the regulated source circuit is a voltage circuit (e.g., a linear regulator, a DC-DC converter, a battery, etc.) that generates a regulated voltage based on the reference signal 208.

The device 218 alters the signal component to produce the analog frequency domain signal 210, where the altering of the signal component at a particular rate to represent input data. The inverse of the data rate corresponds to the frequency of the analog frequency domain signal 210; thus, the signal in the analog domain and the data is in the frequency domain. As an example, the signal component produced by the analog time domain circuit 202 is a DC voltage (e.g., 0.25 volts to 5 volts or more), which corresponds to the reference signal 208. The device 218 alters the signal component by varying the loading on the signal component to affect the voltage and/or current of the signal component thereby created the analog frequency domain signal 210 (e.g., the signal component plus the effects of altering).

As a specific example, the device 218 changes its resistance at a particular rate (e.g., 10 Hz to 100 MHz or more) to represent the input data. An increase in resistance decreases voltage for a constant current, decreases current for a constant voltage, or decreases both voltage and current of the signal component. A decrease in resistance increases the voltage for a constant current, increases the current for a constant voltage, or increases both voltage and current of the signal component. The increasing and decreasing of the resistance of the device at the particular rate is representative of the input data. The number of different resistance levels corresponds to the data level, where N equals the number of unique data values per cycle of the data rate, where N is an integer of 2 or more. For instance, when N=2, there are two data levels (e.g., a logic "0" for a first resistance and a logic "1" for a second resistance) and when N=10, there are ten data levels (e.g., 0 through 9).

As another example of producing the analog frequency domain signal 210, the signal component produced by the analog time domain circuit 202 includes an oscillating component (e.g., a sine wave, a triangular wave, square wave, saw-tooth wave, etc. with a peak to peak voltage of a few millivolts to 5 volts or more having a frequency of a 100 Hz to 1 MHz or more), which corresponds to the reference signal 208. In this example, the device changes its impedance (e.g., capacitance, inductance, and/or resistance) at a particular rate (e.g., fx of 10 Hz to 100 MHz or more) to represent the input data. An increase in impedance decreases voltage for a constant current, decreases current for a constant voltage, or decreases both voltage and current of the signal component. A decrease in impedance increases the voltage for a constant current, increases the current for a constant voltage, or increases both voltage and current of the signal component. The increasing and decreasing of the impedance of the device at the particular rate is representative of the input data.

Continuing with the example of operation, the analog time domain circuit 202 uses the reference signal 208 in comparison to the analog frequency domain signal 210 to create an analog frequency domain error correction signal 212. The analog frequency domain error correction signal 212 is representative of the error correction needed to keep the signal component and hence the analog frequency domain signal 210 substantially matching the reference signal. The error correction is representative of the frequency domain data that is embedded in the altering of the signal component.

The analog to digital circuit 204 (e.g., an "n"-bit analog to digital converter, where n is an integer equal to or greater than 1) converts the analog frequency domain error correction signal 212 into a digital frequency domain error correction signal 214. The error correction, which is representative of the frequency domain data, is substantially preserved in the digital domain.

The digital frequency domain circuit 206 operates in the frequency domain to recover the digital data 216. For example, the digital frequency domain circuit 206 includes one or more finite impulse response (FIR) filters, one or more cascaded integrated comb (CIC) filters, one or more infinite impulse response (FIR) filters, one or more decimation stages, one or more fast Fourier transform (FFT) filters, and/or one or more discrete Fourier transform (DFT) filters.

Figure 16:
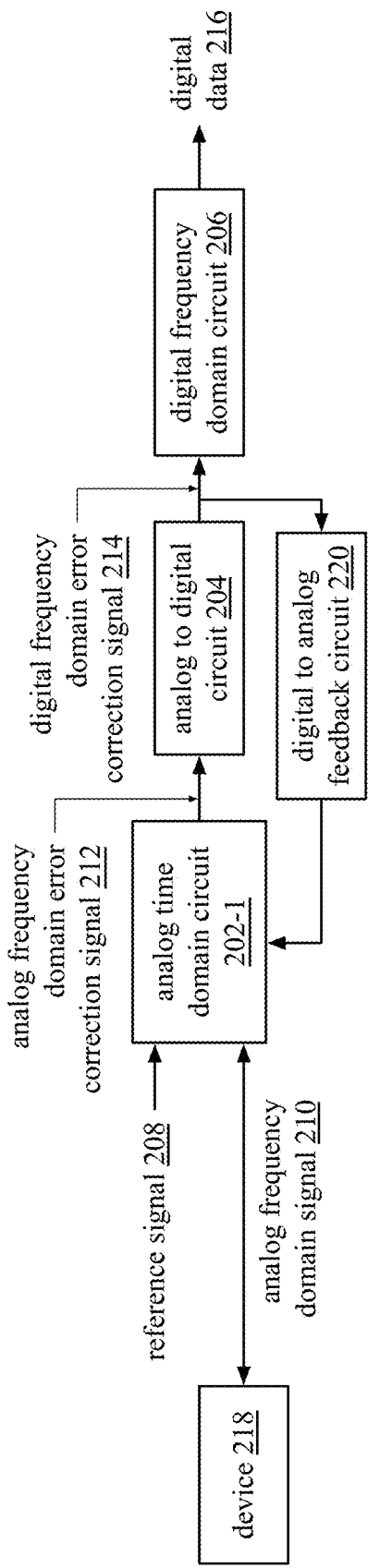
FIG. 16 is a schematic block diagram of another embodiment of a data sensing circuit in accordance with the present invention.

FIG. 16 is a schematic block diagram of another embodiment of a data sensing circuit 200 that includes an analog time domain circuit 202-1, an analog to digital circuit 204, a digital frequency domain circuit 206; and a digital to analog feedback circuit 220. This data sensing circuit 200 operates similarly to the data sensing circuit 200 of FIG. 10 with the following differences. The feedback for regulating the signal component via the regulated source circuit within the analog time domain circuit 201-1 is from the digital to analog feedback circuit 220 (e.g., an "n"-bit digital to analog converter, when n is an integer equal to or greater than 1).

Figure 17:
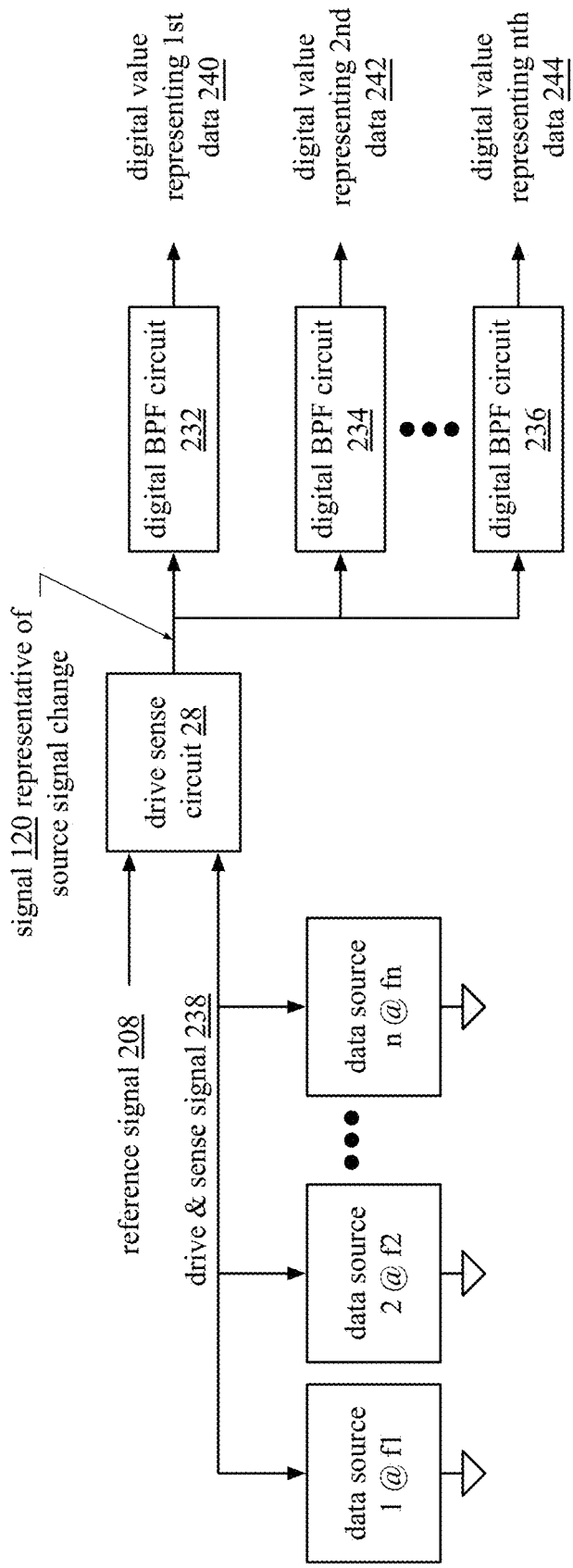
FIG. 17 is a schematic block diagram of an embodiment of a data circuit in accordance with the present invention.

FIG. 17 is a schematic block diagram of another embodiment of a data circuit 230 that includes a drive sense circuit 28, a plurality of digital bandpass filters (BPF) circuits 232-236, and a plurality of data sources (1 through n). The drive sense circuit 28 produces a drive signal component of a drive & sense signal 238 (e.g., the drive part of signal 238) based on the reference signal 208 as previously discussed. The data sources operate at different frequencies to embed frequency domain data into the drive & sense signal 238 (e.g., the sense part of signal 238). Each of the data sources operates similarly to the device 218 of FIG. 10 to embed the data into the signal 238 by varying the loading on the drive component of signal 238.

In an example of operation, data source 1 alters the drive signal component of the drive & sense signal 238 at a first frequency f1; data source 2 alters the drive signal component of the drive & sense signal 238 at a second frequency f2; and data source n alters the drive signal component of the drive & sense signal 238 at an "nth" frequency fn. The drive sense circuit 28 regulates the drive & sense signal 238 to substantially match the reference signal 208, which may be similar to reference signal 157 of FIG. 14.

The drive sense circuit 28 outputs a signal 120 that is representative of changes to the drive & sense signal 238 based on the regulation of the drive & sense signal 238. Each of the digital BPF circuits 232 receives the signal 120 and is tuned to extract data therefrom corresponding to one of the data sources. For example, digital BPF circuit 232 is tuned to extract the data at frequency f1 of the data source 1 to produce one or more digital values representing the first data 240. The second digital BPF circuit 234 is tuned to extract the data at frequency f2 of the data source 2 to produce one or more digital values representing the second data 242. The nth digital BPF circuit 236 is tuned to extract the data at frequency fn of the data source n to produce one or more digital values representing the nth data 244. Each of the digital BPF circuits 232-236 includes one or more finite impulse response (FIR) filters, one or more cascaded integrated comb (CIC) filters, one or more infinite impulse response (IIR) filters, one or more decimation stages, one or more fast Fourier transform (FFT) filters, and/or one or more discrete Fourier transform (DFT) filters.

Figure 18:
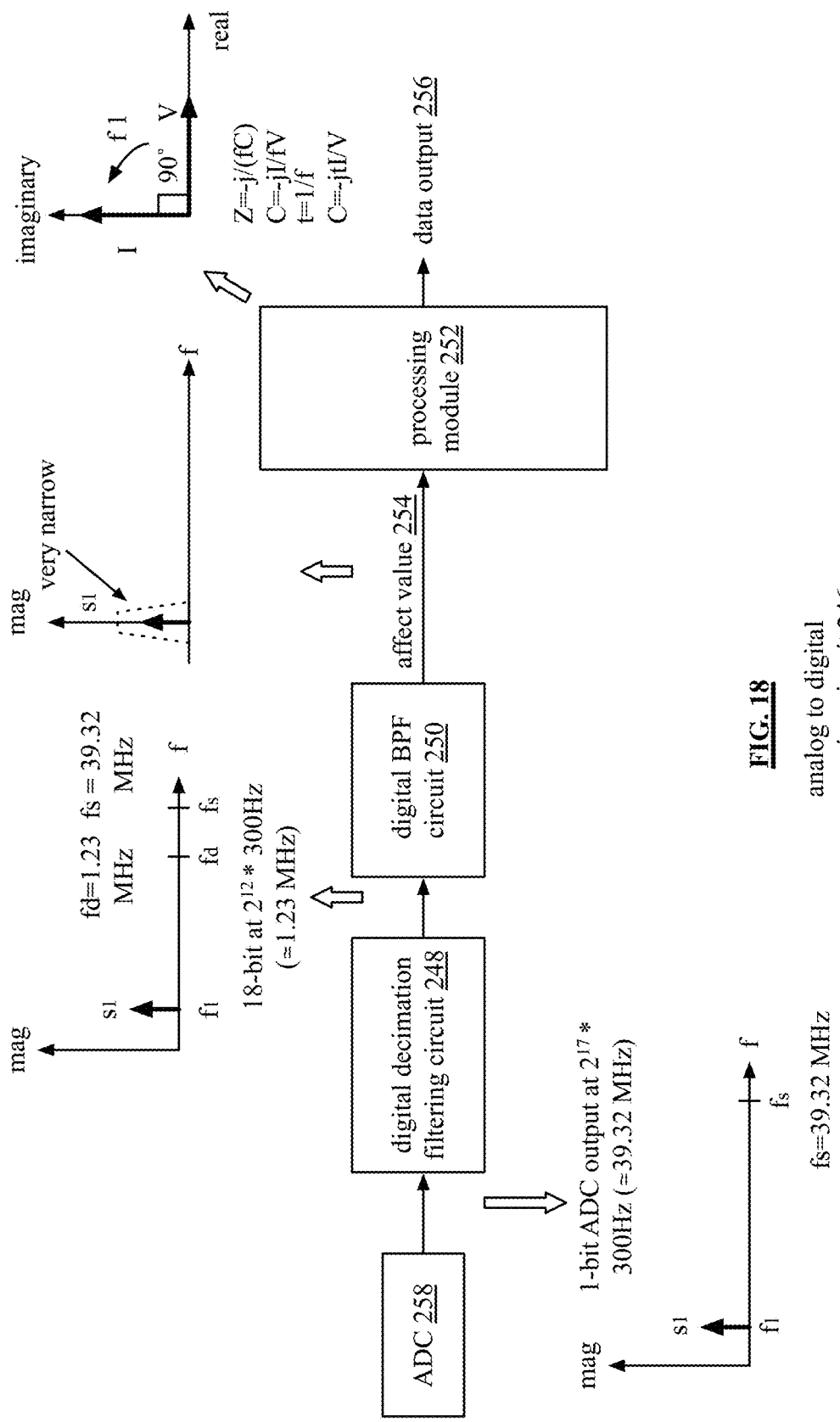
FIG. 18 is a schematic block diagram of an embodiment of an analog to digital conversion circuit in accordance with the present invention.

FIG. 18 is a schematic block diagram of an embodiment of an analog to digital conversion circuit 246 that includes an analog to digital converter (ADC) 258, a digital decimation filtering circuit 248, a digital bandpass filter (BPF) circuit 250, and a processing module 252. The ADC 258 may be implemented in a variety of ways. For example, the ADC 258 is the ADC converter 212 of drive sense circuit 28 of previous Figures. As another example, the ADC 258 is implemented as a flash ADC, a successive approximation ADC, a ramp-compare ADC, a Wilkinson ADC, an integrating ADC, and/or a delta encoded ADC. As yet another example, the ADC 258 is implemented as a sigma-delta ADC.

The digital decimation filtering circuit 248 includes one or more finite impulse response (FIR) filters, one or more cascaded integrated comb (CIC) filters, one or more infinite impulse response (FIR) filters, one or more decimation stages, one or more fast Fourier transform (FFT) filters, and/or one or more discrete Fourier transform (DFT) filters, one or more polyphase filters, and one or more decimation stages. The digital bandpass filter (BPF) circuit 250 includes one or more finite impulse response (FIR) filters, one or more cascaded integrated comb (CIC) filters, one or more infinite impulse response (FIR) filters, one or more decimation stages, one or more fast Fourier transform (FFT) filters, and/or one or more discrete Fourier transform (DFT) filters, and one or more polyphase filters. BPF 250 includes a plurality of taps having coefficients set to produce a bandpass region approximately centered at the oscillation frequency of the analog input signal and having a bandwidth tuned for filtering a pure tone (e.g., s1).

Sampling frequencies of the stages of the analog to digital conversion circuit 246 are set as multiples of the data output rate. For example, the data output 256 rate is 300 Hz thus sampling frequencies are multiples of 300 Hz. For example, ADC circuit 258 oversamples the analog input signal at a sampling frequency (fs) of $2^{17}*300$ Hz (approximately 39.32 MHz). The analog input signal is said to be oversampled when the sampling frequency is more than the Nyquist sampling frequency (e.g., 40 KHz-400 KHz when the oscillating frequency is 20 KHz-200 KHz). Setting the sampling frequency at a frequency much higher than the Nyquist sampling frequency results in a significantly oversampled analog signal. Oversampling of the analog signal allows for narrower bandpass filtering and improves signal to noise ratio (SNR).

In an example of operation, the ADC 258 converts an analog signal that includes a set of pure tone components (e.g., one or more pure tone components, each having an oscillation frequency) into a digital signal of the one or more pure tone components. For example, an input analog signal has a pure tone (e.g., a sinusoidal signal, a DC signal, a repetitive signal, and/or a combination thereof) having a DC component and/or an oscillation frequency at f1 (e.g., a frequency in the audio range, in the range 20 KHz-200 KHz, or more). As a specific example, the ADC is a sigma-delta ADC that oversamples the analog input signal at clock rate of approximately 39.32 MHz (e.g., $300*2^{17}$) and, as such, pushes low frequency noise up to higher frequencies outside the band of interest. An example of a sigma-delta ADC will be discussed in greater detail with reference to FIG. 23.

Continuing with the specific example, the ADC 258 produces a 1-bit digital output at approximately 39.32 MHz representative of the analog signal. In an embodiment, the analog signal includes an error correction signal s1 at frequency f1, which represents the frequency domain data embedded in the analog input signal and is substantially preserved in the digital domain (e.g., as discussed in FIGS. 14-15).

The digital decimation filtering circuit 248 takes the output from ADC circuit 258 (e.g., 1-bit digital output at approximately 39.32 MHz) and converts it to another digital signal having another data rate frequency that is a multiple of the data output rate (e.g., 300 Hz). In this example, digital decimation filtering circuit 248 has an output rate (fd) of $2^{12}*300$ HZ (approximately 1.23 MHz).

As a more specific example, the digital decimation filtering circuit 248 converts the 1-bit digital output at approximately 39.32 MHz into an 18-bit output at $2^{12}*300$ HZ (approximately 1.23 MHz) representing error correction signal s1 at frequency f1. The ratio between the sampling rate (fs) and the digital decimation filtering circuit 248's output rate (fd) (e.g., fs/fd) is equal to the number of ADC 258 samples per output of digital decimation filtering circuit 248. For example, 39.32 MHz/1.23 MHz=32. Therefore, digital decimation filtering circuit 248 has a decimation rate of 32. In the time is takes ADC 258 to output 32 1-bit samples, 1 18-bit output is produced by digital decimation filtering circuit 248. The digital decimation filtering circuit 248 will be discussed in greater detail with reference to FIGS. 31-41.

The digital BPF circuit 250 takes the output of the digital decimation filtering circuit 248 (e.g., the 18-bit output at approximately 1.23 MHz) and bandpass filters it. The digital BPF circuit 250 applies a narrow bandpass filter, centered at f1, and outputs an affect value 254 having real and imaginary components. Because the data (e.g., error correction signal) is embedded in a sinusoid (e.g., a pure tone) the desired information is at frequency f1 and is based on magnitude and/or phase. Therefore, the bandpass filter can be very narrow (e.g., 1% to 20% of channel spacing and, as a specific example about 5% the channel spacing 255 (e.g., for a channel spacing of 300 Hz, a 10 Hz bandpass filter may be used)) to capture the desired signal. In an embodiment, the digital BPF circuit 250 has a tap-length of 4096 (e.g., in the time it takes digital decimation filtering circuit 248 to output 4096 18-bit outputs at approximately 1.23 MHz, digital BPF circuit outputs 1 48-bit affect value at the output rate of 300 Hz). The digital BPF circuit 250 will be discussed in greater detail with reference to FIGS. 42-53.

Processing module 252 interprets the imaginary and real components of the affect value 254 to produce data output 256. Affect value 254 is a vector (i.e., a phasor complex number) having a real component and an imaginary component representing a sinusoidal function that has a peak magnitude (i.e., amplitude) and direction (i.e., phase). For example, affect value 254 is one 48-bit value having a 24-bit real component and a 24-bit imaginary component. In the complex domain, voltages and currents are phasors and resistances, capacitances, and inductances are replaced with complex impedances (e.g., ZR=R, ZL=jfL, and ZC=1/(jfC)= −j/(fC)). Since voltage (V)=current (I)*impedance (Z), the processing module 252 determines a capacitance or other impedance value from voltage and current vectors of the affect value 254 (e.g., a decrease in impedance increases the voltage for a constant current, increases the current for a constant voltage, or increases both voltage and current of the signal component). The increasing and decreasing of impedance at a particular rate is representative of the input data. The impedance value or change in impedance value determined is output as data output 256 at the example output rate of 300 Hz.

Figure 19:
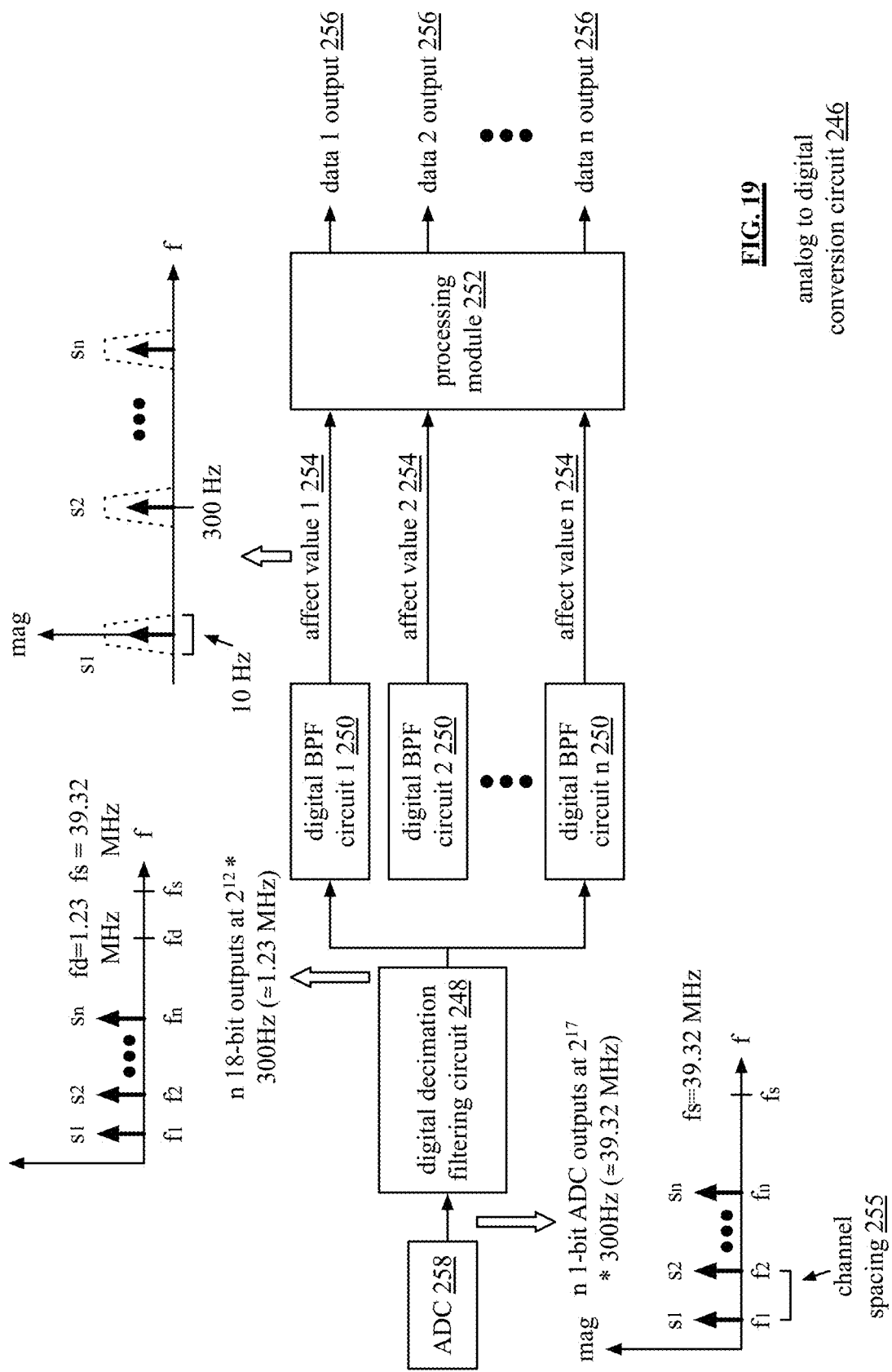
FIG. 19 is a schematic block diagram of another embodiment of an analog to digital conversion circuit in accordance with the present invention.

FIG. 19 is a schematic block diagram of another embodiment of analog to digital conversion circuit 246 that includes analog to digital converter (ADC) 258, digital decimation filtering circuit 248, a plurality of digital bandpass filter (BPF) circuits 250, and processing module 252. Analog to digital conversion circuit 246 of FIG. 19 operates similarly to the example of FIG. 18 except a plurality of digital BPF circuits are included for filtering a plurality of pure tones.

In an example of operation, the ADC 258 converts an analog signal having a set of pure tone components (e.g., signals s1-sn) into a set of digital signals (s1-sn) at the oscillation frequencies (e.g., f1-fn). For example, a first tone of the input analog signal has an oscillation frequency of f1 (e.g., 100 KHz), which, for example, is used for a first self-capacitance measurement on a touch screen display, a second tone of the input analog signal has an oscillation frequency of f2 (e.g., 100.3 KHz), which, for example, is used for a first mutual-capacitance measurement on a touch screen display, and an nth tone of the input analog signal has an oscillation frequency of fn (e.g., 100 KHz+300 nHz), which, for example, is for an nth mutual-capacitance measurement on a touch screen display. Frequencies f1-fn span n channels and are equally separated by a channel spacing 255. For example, channel spacing 255 is equal to output data rate of 300 Hz.

The digital decimation filtering circuit 248 takes the output from the ADC 258 (e.g., via a n-line parallel bus) and converts the signals to other digital signals having another data rate frequency that is a multiple of the data output rate (e.g., 300 Hz). In this example, digital decimation filtering circuit 248 has an output rate (fd) of $2^{12}*300$ HZ (approximately 1.23 MHz). For example, the digital decimation filtering circuit 248 converts the 1-bit ADC output at approximately 39.32 MHz representing digital signals s1-sn at frequencies f1-fn to an 18-bit output at $2^{12}*300$ HZ (approximately 1.23 MHz) representing signals s1-sn at frequencies f1-fn.

Each of the digital BPF circuits 1-$n$ 250 includes a plurality of taps having coefficients set to produce a bandpass region approximately centered at the oscillation frequency of the analog input signal and having a bandwidth tuned for filtering a pure tone. For example, digital BPF circuit 1 250 has a bandwidth tuned for filtering f1, digital BPF circuit 2 250 has a bandwidth tuned for filtering f2, and digital BPF circuit n 250 has a bandwidth tuned for filtering fn. Digital BPF circuits 1-$n$ 250 take the output from the from the digital decimation filtering circuit 248 (e.g., n 18-bit outputs at approximately 1.23 MHz with error correction signals s1-sn at frequencies f1-fn via a bus) and shifts each signal to the bandpass for a frequencies f1-fn.

Digital BPF circuits 1-$n$ 250 each apply a very narrow bandpass filter and output a corresponding affect value 1-$n$ 254 having real and imaginary components. Because data is embedding in each sinusoid signal (s1-sn) (e.g., a pure tone) the desired information is at frequencies f1-fn and based on magnitude and/or phase. Therefore, the bandpass filters can be very narrow (e.g., less than 0.05 the channel spacing (e.g., 10 Hz)) to capture the desired signals.

Processing module 252 interprets the imaginary and real components of the affect values 1-n 254 to produce data outputs 1-n 256. Affect values 1-n 254 are vectors (i.e., a phasor complex numbers) each having a real component and an imaginary component representing a sinusoidal function that has a peak magnitude (i.e., amplitude) and direction (i.e., phase). For example, an affect value is one 48-bit value having a 24-bit real component and a 24-bit imaginary component. In the complex domain, voltages and currents are phasors and resistances, capacitances, and inductances are replaced with complex impedances (e.g., ZR=R, ZL=jfL, and ZC=1/(jfC)=−j/(fC)). Since voltage (V)=current (I)*impedance (Z), the processing module 252 determines capacitance or other impedance values from voltage and/or current vectors represented by affect values 1-n 254. The impedance values or changes in impedance values determined are output as data outputs 1-n 256. Data output 256 is output separately or in parallel at the output data rate (e.g., 300 Hz).

Figure 20B:
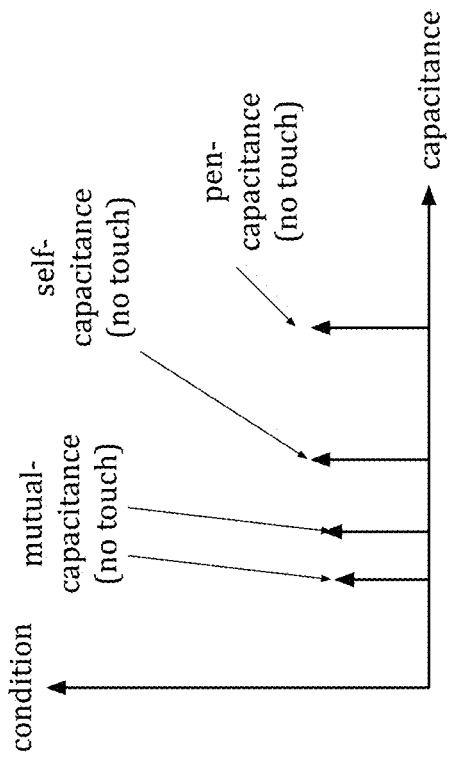
FIGS. 20A-20B are example graphs that plot condition verses capacitance in accordance with the present invention.
Figure 20A:
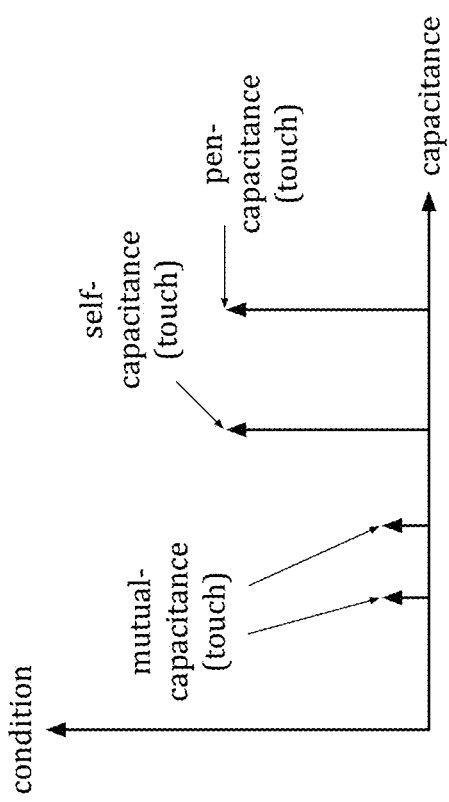

FIGS. 20A-20B are example graphs that plot condition verses capacitance (e.g., of an electrode of a touch screen display). In a touch screen display example, an electrode has a self-capacitance and mutual capacitance. A finger capacitance or a pen capacitance (e.g., a touch) raises self-capacitance of electrodes which decreases the impedance for a given frequency. As shown in FIG. 20A, the mutual capacitance decreases with a touch and the self-capacitance and pen-capacitance increases with a touch. As shown in FIG. 20B, the mutual capacitance, pen-capacitance, and self-capacitance for a no-touch condition are shown to be about the same magnitude but are different than when under a touch condition. For instance, the mutual capacitance decreases as a result of a touch, while self-capacitance and pen-capacitance each increases as a result of a touch.

Figure 21:
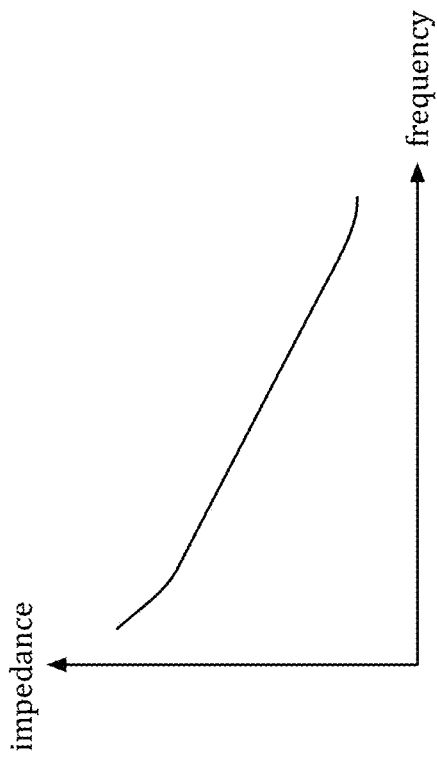
FIG. 21 is an example graph that plots impedance verses frequency for an input in accordance with the present invention.

FIG. 21 is an example graph that plots impedance verses frequency for an input that has a primarily capacitive load. Being based on capacitance (self, pen, and/or mutual), as the frequency increases for a fixed capacitance, the impedance decreases based on ½πfC, where f is the frequency and C is the capacitance.

Figure 22:
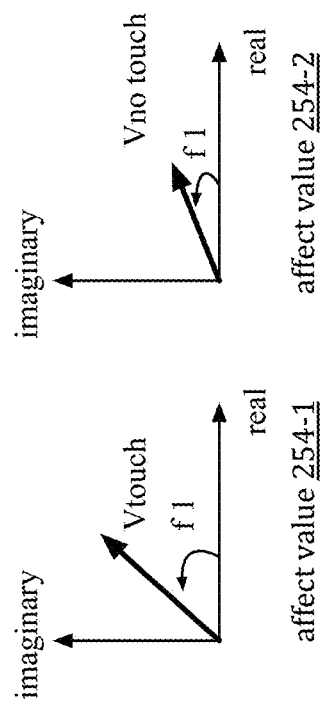
FIG. 22 is an example of affect values in accordance with the present invention.

FIG. 22 is an example of affect values 254-1 and 254-2. When the DC component embedded in the analog input signal represents a voltage at a constant current, an affect value represents a voltage vector having an imaginary component and a real component. The processing module 252 determines capacitance changes (e.g., self, pen, mutual, etc.) from voltage vectors (e.g., impedance (Z)=voltage (V)/current (I) and ZC=1/(jfC)=−j/(fC)) and interprets whether the change represents a touch or no touch condition.

Figure 23:
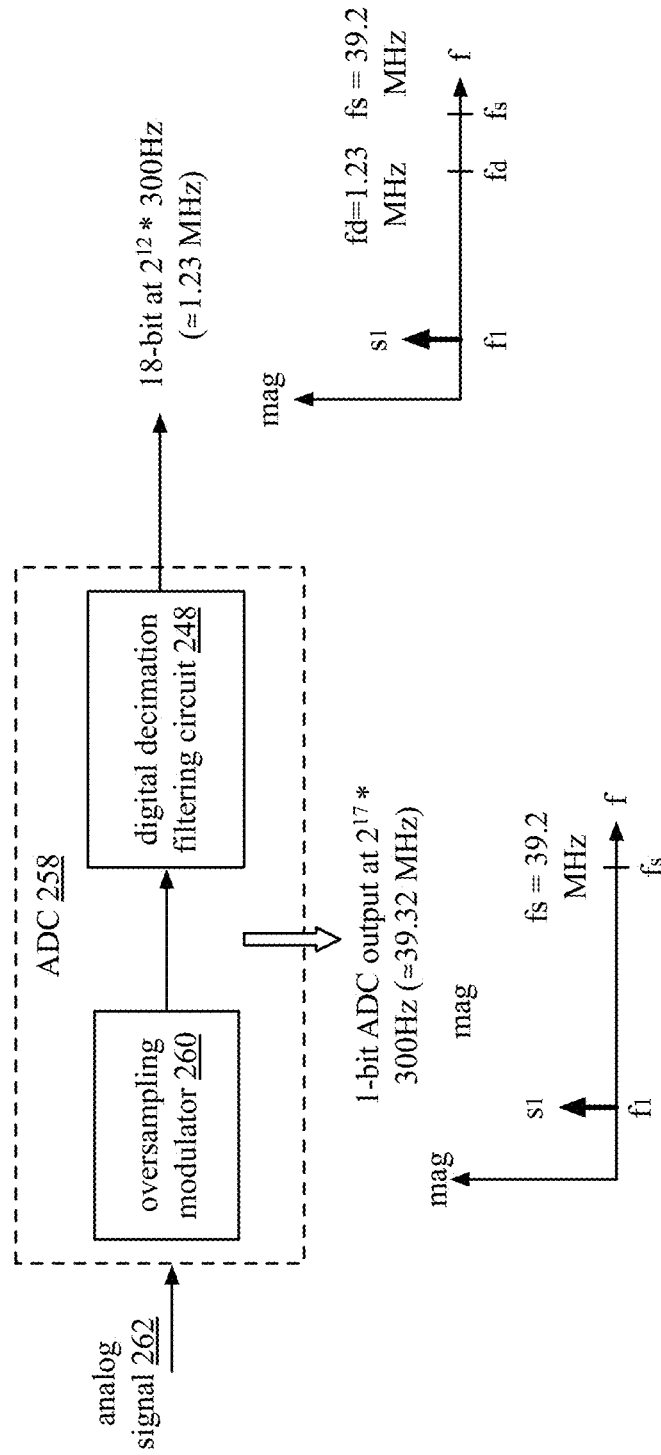
FIG. 23 is a schematic block diagram of an embodiment of a sigma delta analog to digital (ADC) circuit in accordance with the present invention.

FIG. 23 is a schematic block diagram of an embodiment of a sigma delta analog to digital (ADC) circuit. Sigma delta (ADC) circuit 258 is an example of ADC 258 of FIGS. 18 and 19 and includes oversampling modulator 260 and digital decimation filtering circuit 248. In an example of operation, the ADC circuit 258 converts an analog input signal 262 having an oscillation frequency and a set of pure tone components into an 18-bit output at a rate of approximately 1.23 MHz. For example, an input analog signal 262 has an oscillation frequency of fi (e.g., 20 KHz-200 KHz) and a pure tone component s1.

In this example, oversampling modulator 260 is a 1-bit ADC sigma-delta modulator. Oversampling modulator 260 oversamples the analog input signal 262 at a sampling frequency (fs) of $2^{17}$*300 Hz (approximately 39.32 MHz) in this example. Oversampling modulator 260 produces a 1-bit ADC output at 39.32 MHz representing error correction signal s1 embedded in the sinusoidal signal at frequency f1. Error correction signal s1 is representative of the frequency domain data embedded in the analog input signal and is substantially preserved in the digital domain.

Digital decimation filtering circuit 248 includes one or more finite impulse response (FIR) filters, one or more cascaded integrated comb (CIC) filters, one or more infinite impulse response (FIR) filters, one or more decimation stages, one or more fast Fourier transform (FFT) filters, and/or one or more discrete Fourier transform (DFT) filters, one or more polyphase filters, and one or more decimation stages. Digital decimation filtering circuit 248 takes the output from oversampling modulator 260 (e.g., 1-bit ADC output at approximately 39.32 MHz representing error correction signal s1 at frequency f1) and filters and down converts it to another digital signal having another data rate frequency. In this example, digital decimation filtering circuit 248 has an output rate (fd) of $2^{12}$*300 HZ (approximately 1.23 MHz).

For example, the digital decimation filtering circuit 248 converts the 1-bit ADC output at approximately 39.32 MHz representing error correction signal s1 at frequency f1 to an 18-bit output at $2^{12}$*300 HZ (approximately 1.23 MHz) representing error correction signal s1 at frequency f1. The ratio between the sampling rate (fs) and the digital decimation filtering circuit 248's output rate (fd) (e.g., fs/fd) is equal to the number of samples taken by the oversampling modulator 260 per output of the digital decimation filtering circuit 248. For example, 39.32 MHz/1.23 MHz=32. Therefore, digital decimation filtering circuit 248 has a decimation rate of 32.

FIG. 24 is an example of quantization noise of a sigma delta oversampling modulator 260 of FIG. 23. Sigma-delta ADCs implement noise shaping (i.e., a function that effectively pushes low frequency noise up to higher frequencies outside the band of interest) making it suitable for high precision, high resolution applications. Oversampling modulator 260 of FIG. 23 moves quantization noise 264 to higher frequencies. The order of the sigma delta oversampling modulator varies the noise shaping.

As shown, quantization noise 264 starts low at zero Hz, rises and then levels off at the oversampling modulator's sampling frequency (fs). Multi-order sigma delta modulators shape the quantization noise 264 to higher frequencies than lower-order sigma delta modulators. For example, the third-order sigma delta modulator example shows much more noise near frequency fs in comparison to the first-order sigma delta modulator but noise near lower frequencies is much less. The output of digital decimation filtering circuit 248 of FIG. 23 includes frequencies from 0 to frequency fd and thus a good portion of the quantization noise 264 exists in the output of all three examples. However, very narrow bandpass filtering (e.g., by digital BPF circuit 250 as discussed in previous Figures) isolates the signals of interest at the lower frequencies such that noise near fd is also removed.

FIG. 25 is a schematic block diagram of example outputs of the different stages of the analog to digital conversion circuit 246 of FIGS. 18 and 19. In this example, analog to digital (ADC) circuit 258 produces a 1-bit ADC output at $2^{17}$*300 Hz (approximately 39.32 MHz). Therefore, there are $2^{17}$ (or 131,072) 1-bit samples of the analog input signal per data output clock cycle (e.g., 300 Hz in this example). Digital decimation filtering circuit 248 produces an 18-bit output at $2^{12}$*300 Hz (approximately 1.23 MHz). $2^{17}/2^{12}$ is equal to $2^5$ or 32; therefore, in the time the ADC circuit 258 outputs 32 1-bit samples and the digital decimation filtering circuit 248 is able to output one 18-bit value as shown.

BPF circuits 250 output one 48-bit affect value having a 24-bit real component and a 24-bit imaginary component at the data output clock rate of 300 Hz. Therefore, there are $2^{12}$ (or 4096) 18-bit values per data output clock cycle (e.g., 300 Hz in this example). In other words, in the time it takes digital decimation filtering circuit 248 to output 4096 18-bit values, the one or more digital BPF circuits 250 output one 48-bit affect value having a 24-bit real component and a 24-bit imaginary component at the data output clock rate of 300 Hz.

FIG. 26 is an example of sampling an analog signal 262 to produce a digitized signal 270. In this example, analog signal 262 is sampled at 8 points per cycle (s0-s7) to create a digitized signal of 8 discrete points representative of the analog signal 262.

FIG. 27 is a schematic block diagram of a digital filter implementing a multiply-accumulate function. The digital filter shown is designed with 8 stages (e.g., taps) in order to capture the 8 discrete points of the digitized signal of FIG. 26. When the 8 stages capture the points in the pattern shown in FIG. 26, the digital filter produces a filtered output 272 (e.g., a pulse representative of an n-bit digital logic value). The input signal (e.g., digitized signal 270) enters the digital filter at stage 0 where it is multiplied by coefficient h0 and also input into stage 1. Stages 1-7 each include a unit delay $Z^{-1}$ in Z-transform notation to provide delayed inputs (taps) to each stage's multiplication operation (i.e., the input signal is multiplied by the next coefficient (e.g., h1-h6) after a delay $Z^{-1}$). The results of the multiplication operation from each stage are added (i.e., accumulated) to create the filtered output. The series of multiply accumulate functions is also referred to as a moving average. The more taps the filter has, the more computationally extensive the output becomes.

FIG. 28 is a schematic block diagram of a digital filter implementing a multiply-accumulate function. The digital filter operates similarly to the digital filter of FIG. 27 and is shown here for convenience.

FIG. 29 is an example of a digitized signal 270. At a point in time, digitized signal 270 has a particular pattern. For example, the pattern shown is one cycle of a sinusoidal signal. Coefficients h0-h7 of the digital filter of FIG. 28 can be set so that only something close to the desired pattern produces a viable output.

FIG. 30 is an example of producing a digital filtered output 272. As digitized signal 270 of FIG. 29 moves through the stages of the digital filter (e.g., of FIGS. 27 and 28), coefficients h0-h7 at stages 0-7 are set to look for the pattern shown in FIG. 29 (i.e., the coefficients set the center frequency of the bandpass filter, the bandwidth of the bandpass filter, and the roll-off of the bandpass filter). When the pattern shown in FIG. 29 (or something fairly close to the pattern) is recognized, the bandpass filter produces an output indicating the presence of the signal (e.g., a magnitude and/or phase of a sinusoidal signal). As shown, at stage 7 and at time t7, the filter recognizes that the pattern shown in FIG. 29 has moved through stages 0-7 and therefore produces a filtered output 272 at time t7.

The filtered output 272 may be a pulse representative of an n-bit digital logic value. For example, a digitized sinusoidal signal of a first amplitude may produce pulse representative of a 1-bit digital logic of zero and a digitized sinusoidal signal of a second amplitude may produce pulse representative of a 1-bit digital logic of one. Therefore, digital data (e.g., signal s1 of FIG. 18-19) can be embedded in an analog signal and extracted via digital filtering.

FIG. 31 is a schematic block diagram of an embodiment of a digital decimation filtering circuit 248. Digital decimation filtering circuit 248 includes anti-aliasing filter 274 and decimator 276. In general, digital decimation filtering circuit 248 filters high frequency components of the input signal and reduces the sampling rate so that the next stage of analog to digital conversion circuit 246 can operate more efficiently.

Digital decimation filtering circuit 248 receives a 1-bit ADC output stream at approximately 39.32 MHz from ADC 258 or oversampling modulator 260 when ADC 258 is sigma delta ADC 258 of FIG. 23. By oversampling the analog input signal, quantization noise 264 is spread out over a wider bandwidth. When ADC 258 is a first order sigma delta ADC, the output from the oversampling modulator 260 includes quantization noise 264 that is noise shaped to be greatest at the sampling frequency (fs) of the oversampling modulator 260 (e.g., 39.32 MHz) as shown.

Anti-aliasing filter 274 is a lowpass filter averaging filter (e.g., one or more finite impulse response (FIR) filters, one or more comb filters, one or more raised cosine filters, one or more cascaded integrated comb (CIC) filters, one or more infinite impulse response (IIR) filters, one or more decimation stages, one or more fast Fourier transform (FFT) filters, and/or one or more discrete Fourier transform (DFT) filters, etc.) that samples the 1-bit ADC output and provides a cutoff frequency to remove or attenuate signals (e.g., quantization noise 264) at higher frequencies. Anti-aliasing filter 274 has a frequency response H(z).

Decimator 276 reduces the output rate of anti-aliasing filter 274 by throwing away portions of anti-aliasing filter 274's output data. In this example, decimator 276 reduces the output rate of anti-aliasing filter 274 (e.g., 39.32 MHz) by 32 to produce digital decimation filtering circuit 248 output rate of 18-bit at approximately 1.23 MHz (e.g., 39.32 MHz/32=1.23 MHz). As shown, applying a low pass anti-aliasing filter 274 with a cutoff frequency of fd and decimating the signal by 32 removes a portion of quantization noise between fd and fs.

FIG. 32 is an example frequency response H(z) of the anti-aliasing filter 274. For example, anti-aliasing filter 274 is a finite impulse response (FIR) filter that cuts off frequencies higher than 1.23 MHz (i.e., the output rate of digital decimation filtering circuit 248). The FIR filter has a sin x/x (e.g., or "sinc") frequency response as shown. The sinc frequency response has a "notch" response (e.g., it can reject the line frequency when set to that frequency). The notch position is also directly related to the output data rate. As shown, the first notch position in FIG. 32 is located at the output rate of the digital decimation filtering circuit 248 output rate of approximately 1.23 MHz (e.g., the cutoff frequency). The sinc frequency response is equal to zero at integer multiples of the data rate (e.g., 2.46 MHz, 3.69 MHz, and so on). With a sampling rate of 39.32 MHz, the signal can contain frequency content up to 39.32 MHz/2=19.66 MHz according to Nyquist sampling theorem.

FIG. 33 is a schematic block diagram of an embodiment of anti-aliasing filter 274. In this example, anti-aliasing filter 274 is implementing a multiply accumulate function as discussed in FIG. 27. For example, anti-aliasing filter 274 is a lowpass finite impulse response (FIR) filter having N number of taps. The number of taps selected in anti-aliasing filter 274 is related to the sampling frequency (e.g., 39.32 MHz), the desired cutoff or stopband frequency (e.g., 1.23 MHz), and several other desired filter properties. For example, increasing the number of taps in a FIR filter reduces noise, reduces transition bandwidth between stopband and passband frequencies, and increases attenuation in the stopband. However, the more taps a FIR filter has, the more computationally extensive it is (e.g., more multiply accumulates are required).

In a specific example, anti-aliasing filter 274 is a 128-tap FIR filter (e.g., the FIR filter has 128 frequency coefficients h0-h127) that cuts off frequencies higher than 1.23 MHz (i.e., the output rate of digital decimation filtering circuit

248) and runs at the 1-bit ADC output frequency of 39.32 MHz. The 1-bit ADC output at of 39.32 MHz is a stream of 1-bit code in the time domain shown here as input signal x[n], where x[n] includes n discrete points. The analog signal shown as a dotted line over the stream of 1-bit code shows a simplified example of how a stream of 1-bit inputs can represent an analog signal. As discussed in previous Figures, digital decimation filtering circuit 248 filters 32 samples of input at a time. To accommodate for the 128-taps, the 32-bit input can be padded with zeros.

The input signal enters the anti-aliasing filter 274 at stage 0 where it is multiplied by coefficient h0 and also input into stage 1. Stages 1-127 each include a unit delay $Z^{-1}$ in Z-transform notation to provide delayed inputs (taps) to each stage's multiplication operation (i.e., the input signal is multiplied by the next coefficient (e.g., h1-h127) after a delay $Z^{-1}$). The results of the multiplication operation from each stage are added (i.e., accumulated) to create the filtered output. The series of multiply accumulate functions is also referred to as a moving average. The more taps, the more computationally extensive the output becomes.

The output signal from the anti-aliasing filter 274 is equal to $y[n]=\Sigma_{i=0}^{N} h[i] \cdot x[n-i]$ where N is 128 in this example. The output equation is a summation of the convolution of the input signal with the filter's coefficients. In the time domain, the 128-bit code train resembles the original analog signal (here only 20 bits are shown for convenience) and is responsible for high resolution. However, in the frequency domain, anti-aliasing filter 274 only applies a low pass filter to the signal to attenuate the quantization noise. Therefore, the output signal is now a high-resolution digital version of the analog input signal.

FIG. 34 is a schematic block diagram of an embodiment of a decimator 276. Decimator 276 takes the output from the 128-tap anti-aliasing filter 274 represented here as y[n]=y[0]+y[1]+ . . . +y[127] (note that the illustration only shows 20 samples for convenience) and throws out every M calculation (e.g., where M is the decimation factor). For example, with a decimation factor of 32 and an input of 128 samples from the 128-tap anti-aliasing filter 274, decimator 276 outputs 4 outputs y[0]+y[1] (formerly y[31]), +y[2] (formerly y[63])+y[3](formerly y[95]). From the summation of the four outputs, one 18-bit output is produced at the output rate of approximately 1.23 MHz.

FIG. 35 is an example of a frequency band having frequency channels. The frequency band of interest 280 begins at f1 and ends at fn. Frequency band of interest 280 includes channels 282 f1-fn spaced out at a desired channel spacing 255 (e.g., the data output rate of 300 Hz or another frequency). As a specific example, frequency band of interest 280 includes 128 channels where each channels contains a pure tone component s1-s128 having frequencies f1-f128. With a channel spacing of 300 Hz (e.g., the data output rate), the frequency band of interest is 128×300 Hz=38.4 KHz wide (i.e., n×channel spacing 200 Hz). If f1 is at 100 KHz, the frequency band of interest 280 spans from 100 Khz to 138.4 KHz.

FIG. 36 is a schematic block diagram of another embodiment of digital decimation filtering circuit 248. The digital decimation filtering circuit 248 includes anti-aliasing filters 274-1 through 274-n and decimators 276-1 through 276-n where n corresponds to n channels of 1-bit ADC output. As an example, anti-aliasing filters 274-1 through 274-n are 128-tap finite impulse response (FIR) filters. The n channels of ADC output are delivered to digital decimation filtering circuit 248 via an n-line parallel bus 284. Each channel of 1-bit data from the ADC is filtered with a corresponding anti-aliasing filter 274-1 through 274-n and decimated by a factor of 32 by a corresponding decimator 276-1 through 276-n to produce n outputs at the digital decimation filtering circuit 248 output rate.

For example, digital decimation filtering circuit 248 takes 128 channels of 1-bit output at 39.32 MHz from the ADC and filters each channel with an anti-aliasing filter with a decimation factor of 32 producing 128 18-bit outputs at a sample rate of approximately 1.23 MHz. For example, the 128 18-bit outputs are multiplexed onto a single bus running at approximately 157.29 MHz (i.e., 128 ($2^7$) channels×the output rate 1.23 MHz ($2^{12}$×300 Hz) or $2^{19}$×300 Hz=approximately 157.29 MHz). As a specific example, the output bus is a 16-bit bus with eight idle time slots (e.g., 8 bits are needed to multiplex the 128 channels which is an 8-bit binary number). The output bus runs at 128 times the output rate to allow for each channel to run through each anti-aliasing filter 274-1 through 274-n and be output onto a single bus. Alternatively, the 128 18-bit outputs may be output in parallel.

FIG. 37 is a schematic block diagram of another embodiment of digital decimation filtering circuit 248. In contrast to the 128-tap finite impulse response (FIR) anti-aliasing filter 274 and decimator 276 of FIGS. 31-36, the digital decimation filtering circuit 248 shown here includes 32 4-tap polyphase filters $E_0(z)$-$E_{31}(z)$ with coefficients e(n)=h(32n+1), n=0 . . . 3 and l=0 . . . 31. Each polyphase filter includes a delay ($z^{-1}$) and a decimator ($\downarrow 32$) producing a result that is added by a summation network 278 to compute the final output.

In the example of FIGS. 31-36, the filter response is convolved with the full signal and many points that were just calculated are thrown away (e.g., the signal is filtered then decimated). Polyphase filters are a more efficient implementation for digital decimation filtering circuit 248 because the signal can be decimated prior to filtering and calculations are not wasted. Further, each polyphase filter in the digital decimation filtering circuit runs at the slower digital decimation filtering circuit 248 output rate of 1.23 MHz (in comparison to the 128 FIR filter which runs at 39.32 MHz).

In this example, 32 polyphase filters are needed because the decimation rate is 32. Each sample on the input to digital decimation filtering circuit 248 is delivered to just one of the polyphase filters. 32 1-bit input samples (e.g., from the 1-bit ADC output stream at 39.32 MHz) are loaded into the 32 polyphase filters starting from the bottom (at stage 0) and working up. After 32 1-bit samples are loaded, the polyphase filters run to generate a single output point (e.g., an 18-bit output at 1.23 MHz). The procedure is repeated for the next 32 samples.

FIG. 38 is a schematic block diagram of an example of polyphase filters of digital decimation filtering circuit 248 shown in FIG. 37. Each polyphase filter $E_0(z)$-$E_{31}(z)$ includes 4 coefficients (e.g., 4 taps). The frequency response of the 128-tap FIR filter discussed in previous Figures can be rewritten as a summation of the frequency response of each filter $E_0(z)$-$E_{31}(z)$. Based on the decimation factor, the taps that produce an output can be included in one filter (e.g., $E_0(z)$ includes taps h[0], h[32]$z^{-1}$, h[64]$z^{-2}$ and h[96]$z^{-3}$ which extract data from the input signal at every $32^{nd}$ point. The input signal x[n] can then be broken up in order to decimate the signal prior to input into filters $E_0(z)$-$E_{31}(z)$. For example, x[n] values x[0], x[32], x[64], and x[96] are input into filter $E_0(z)$ which with produce the values needed for decimation. Other inputs are multiplied by zero in order to not waste calculations done by the filters. Summation network 278 adds the results (e.g., y[0], y[1], y[2], and y[3]) from the filters $E_0(z)$-$E_{31}(z)$ to produce an 18-bit output at the output rate of 1.23 MHz.

FIG. 39 is a schematic block diagram of another embodiment of the digital decimation filtering circuit 248. In this example, digital decimation filtering circuit 248 filters and decimates (by a factor of 32) 128 channels of 1-bit ADC output at 39.32 MHz through the structure shown. In contrast to the example shown in FIG. 36, where n (e.g., 128) separate anti-aliasing filters and decimators are required for each input channel, here each channel is processed by the same filter structure. In order to filter and decimate 128 channels through one structure, digital decimation filtering circuit 248 includes 32 shift register memories 286, 32 bit shifts 288, 32 4-tap polyphase filters E0-E31 (e.g., of FIG. 37) implemented as 32 look-up tables (LUTs) 290, and summation tree 292.

Each shift register memory 286 contains a 5-bit register for each of the 128 channels. In each 5-bit register, one of the bits is reserved for new input while the other 4 contain the previous 4 binary inputs. Memory is written to each shift memory registry 286 a column at a time at the same frequency as the output sample rate (e.g., 1.23 Mz) however, memory is read out a row at a time into the filter structure at a rate of 128 times the output sample rate (e.g., 128×1.23 Mz=157.29 MHz). As shown, by the time 128 bits are input to each shift memory registry 286 at the output rate, 4 bits are input into each LUT 290 per cycle. With a decimation factor of 32, 4 bits are output for every 128 bits in this example. The structure of the shift memory registry 286 will be discussed in greater detail with reference to FIG. 40.

The bit shift 288 removes the input bit and rearranges the other 4 bits into the correct address lines of the look up tables (LUTs) 290. Polyphase filters E0-E31 are implemented as a set of look-up tables (LUTs) 290. LUTs 290 store pre-computed product values corresponding to possible input values. Pre-computed product values are stored at a memory location whose address location is the same as the binary value of the input value the product value corresponds to. For example, for each polyphase filter E0-E31, the output for the 16 possible combinations of the 4 binary input taps are precomputed and stored in the table. Each LUT takes the 4-bit input from the bit shift 288 and determines a precomputed value based on the address. The output from each LUT is 16-bits representative of 4 bits of input data (e.g., 1-bit per tap (4 taps), per input (4)). The 16-bits representative of 4 bits of input data are put through the summation tree 292 to calculate the 18-bit final result.

Digital decimation filtering circuit 248 runs at a rate of 128 times the output rate (e.g., 128×1.23 MHz=157.29 MHz) so that all 128 channels can be processed through the same structure and all output data can be processed on the same output bus. Digital decimation filtering circuit 248 processes 4 bits representative of 128 bits of each 128 channels at a time. In the polyphase filter of FIGS. 36-37, 32 1-bit input samples (e.g., from the 1-bit ADC output stream at 39.32 MHz) are loaded into the 32 polyphase filters starting from the bottom and working up. After 32 samples are loaded, the polyphase filters run to generate a single output point. Here, 1-bit samples from each of the 128 channels are loaded into the 32 polyphase filters. Thus, the filter structure of FIG. 39 runs at 128 times the digital decimation filtering circuit 248 data output rate.

Summation tree 292 adds the results of polyphase filters (LUTs) 290 (e.g., 16 bits from E0 is added to 16 bits from E1 to make a 17-bit value, and so on) to get the final result of 128 18-bit outputs at 1.23 MHz multiplexed on a 157.29 MHz bus.

FIG. 40 is a schematic block diagram of an example of a shift register memory 286. For example, shift register memory 286 is a two port 5-bit×128-bit device (e.g., a static access random memory (SRAM) device) that is written a column (128 bits) at a time and is read a row (5 bits) at a time. Port A is a write only port that has inputs for data A (128 bits) and address A (3 bits) that addresses rows. Port B is a read only port that has an output for data B (5 bits) and an input for address B (7 bits) that addresses columns. Shift register memory 286 has a latched output.

Each row of shift register memory 286 is the shift register for one of the 128 1-bit ADC output channels. Of the 5 taps in each row, 4 taps are active data read out into the filter structure and the fifth tap is reserved for input data for the next output sample. When the data for the filter structure of FIG. 39 arrives on the input bus, all 128 channels are sampled on that cycle.

Memory is written to each shift memory registry 286 at the same frequency as the output sample rate (e.g., 1.23 Mz) however, memory is read out into the filter structure at a rate of 128 times the output sample rate (e.g., 128×1.23 Mz=157.29 MHz). This allows all the 128 channels to be processed by the same filter structure, and all the output data to be multiplexed onto the same output bus.

FIG. 41 is a schematic block diagram of another embodiment of the digital decimation filtering circuit 248. FIG. 41 shows a detailed example of the digital decimation filtering circuit 248 of FIG. 39. The input signals of each 128 channels are broken up in order to decimate each channel by the decimation rate of 32 (e.g., as discussed with reference to FIG. 38). For example, the shift register memory 1 286 writes in the first bit (x[0]) from each channel, then writes in the $32^{nd}$ bit (x[32]) from each channel, then writes in the $64^{th}$ bit (x[64]) from each channel, and then writes in the $96^{th}$ bit (x[96]) from each channel. Shift register memory 1 286 reads out a row of data containing x[0], x[32], x[64], and x[96] from each channel at a rate of 128 times the write rate (1.23 MHz) in order to filter 128 channels through one filter structure.

The four bits of data from each channel from shift register memory 1 286 are filtered through filter E0 (look-up table (LUT) 290) to produce 128 16-bit outputs. For example, $E_0$ filter includes taps h[0], h[32]$z^{-1}$, h[64]$z^{-2}$ and h[96]$z^{-3}$. An input of x[0], x[32], x[64], and x[96] produces a 16-bit filter output y[0] representative of these inputs. Shift register memories 2 through 128 operate similarly to shift register memory 1 286. Each 16-bit output from each filter E0-E31 goes through summation tree 292 in order to produce one 18-output. Therefore, at the output of digital decimation filtering circuit 128, 128 18-bit values are output at a rate of 1.23 MHz multiplexed on a 157.29 MHz bus (e.g., 128×1.23 MHz).

FIG. 42 is an example of a frequency band having n frequency channels 282. FIG. 42 is similar to the example of FIG. 35 except now the frequency band of interest 280 is shown in comparison to the decimation frequency fd=1.23 MHz after going through the digital decimation filtering circuit 248 (e.g., the digital decimation filtering circuit 248 cut off noise at higher frequencies than 1.23 MHz and reduced the sampling rate to 1.23 MHz). The frequency band of interest 280 begins at f1 and ends at fn. Frequency band of interest 280 includes channels 282 f1-fn spaced out at a desired channel spacing 255 (e.g., the data output rate of 300 Hz or another frequency). With a channel spacing of 300 Hz (e.g., the data output rate), the frequency band of interest is 128×300 Hz=38.4 KHz wide (i.e., n×channel spacing 300 Hz). If f1 is at 100 KHz, the frequency band of interest 280 spans from 100 Khz to 138.4 KHz.

FIG. 43 is a schematic block diagram of an embodiment of digital bandpass filter (BPF) circuit 250. Digital bandpass filter (BPF) circuit 250 includes one or more finite impulse response (FIR) filters, one or more cascaded integrated comb (CIC) filters, one or more infinite impulse response (FIR) filters, one or more decimation stages, one or more fast Fourier transform (FFT) filters, one or more discrete Fourier transform (DFT) filters, and/or one or more polyphase filters. BPF 250 includes a plurality of taps having coefficients set to produce a bandpass region approximately centered at the oscillation frequency of the analog reference signal (e.g., 100 KHz) and having a bandwidth tuned for filtering a pure tone (e.g., f1). BPF 250 has a frequency response H(z).

Digital BPF circuit 250 takes the output of the digital decimation filtering circuit 248 (e.g., the 18-bit output at approximately 1.23 MHz representative of signal s1 at frequency f1) and shifts to the bandpass for frequency f1 (e.g., 100 KHz). When the output of the digital decimation filtering circuit 248 includes n 18-bit outputs from different channels (e.g., the analog input signal includes pure tone components f1-fn of FIG. 42), a digital BPF circuit is needed for each output to isolate each pure tone component.

Digital BPF circuit 250 applies a very narrow bandpass filter and outputs an affect value 254 (si) having real and imaginary components at the output frequency of 300 Hz. Because embedded data is a sinusoid (e.g., a pure tone) the desired information is at frequency f1 and based on magnitude and/or phase. Therefore, the bandpass filter can be very narrow (e.g., less than 0.05 the channel spacing (e.g., 10 Hz)) to capture the desired signal.

FIG. 44 is an example frequency response H(z) of digital bandpass filter (BPF) circuit 250. As an example, the digital BPF circuit 250 is a discrete Fourier transform (DFT) filter with length N. For example, digital BPF circuit 250 has a length 4096 in order to filter 4096 18-bit inputs to produce 1 48-output. A sin x/x (e.g., or "sinc") frequency response is shown. The sinc frequency response has a "notch" response (e.g., it can reject the line frequency when set to that frequency). With a sampling frequency of 1.23 MHz and length 4096, the frequency bin (i.e., intervals between samples in frequency domain) resolution is 1.23 MHz/ 4096=300 Hz. The notch position is also directly related to the output data rate. As shown, the sinc frequency response is equal to zero at integer multiples of the output data rate of 300 Hz (e.g., 600 Hz, 900 Hz, 1200 Hz, and so on).

FIG. 45 is an example frequency response H(z) of a digital bandpass filter (BPF) circuit 250. A finite impulse response (FIR) filter has a sin x/x (e.g., or "sinc") frequency response as shown. The sinc frequency response has a "notch" response (e.g., it can reject the line frequency when set to that frequency). With the signal s1 shifted to bandpass, a very narrow bandpass filter can be applied. For example, a bandpass filter of 10 Hz with center frequency 5 Hz is applied to isolate the pure tone. As shown, the first notch position in FIG. 45 is located at 10 Hz with a center frequency of 5 Hz.

FIGS. 46A-46D are examples of processing a signal by digital bandpass filter (BPF) circuit 1 250. BPF circuit 1 250 includes a plurality of taps having coefficients set to produce a bandpass region approximately centered at the oscillation frequency of an analog reference signal for s1 (e.g., 100 KHz) and having a bandwidth tuned for filtering a digital signal having frequency components at f1, f2, and f3. In FIG. 46A, digital BPF circuit 1 250 receives the output of the digital decimation filtering circuit 248 (e.g., the 18-bit output at approximately 1.23 MHz representative of signals s1 at frequency f1, s2 at frequency f2, and s3 at frequency f3).

In FIG. 46B digital BPF circuit 1 250 shifts the 18-bit output at approximately 1.23 MHz representative of signals s1 at frequency f1, s2 at frequency f2, and s3 at frequency f3 to the bandpass for frequency f1 (e.g., 100 KHz). For example, s1 is now at 0 Hz and s2 and s3 are spaced out evenly from s1 (e.g., at 300 Hz and 600 Hz).

In FIG. 46C, digital BPF circuit 1 250 applies a very narrow bandpass filter to isolate s1. Because the embedded data is a sinusoid (e.g., a pure tone) the desired information is at frequency f1 (e.g., 0 Hz) and based on magnitude and/or phase. Therefore, the bandpass filter can be very narrow (e.g., less than 0.05 the channel spacing (e.g., 10 Hz)) to capture the desired signal.

In FIG. 46D, digital BPF circuit 1 250 outputs an affect value 254 (s1) having real and imaginary components at the output frequency of 300 Hz. The affect value 254 (s1) is 48 bits with a 24-bit real part and a 24-bit imaginary part.

FIGS. 47A-47D are examples of processing a signal by digital bandpass filter (BPF) circuit 2 250. BPF circuit 2 250 includes a plurality of taps having coefficients set to produce a bandpass region approximately centered at the oscillation frequency of an analog reference signal for s2 (e.g., 100.3 KHz) and having a bandwidth tuned for filtering a pure tone (e.g., f2). In FIG. 47A, digital BPF circuit 2 250 receives the output of the digital decimation filtering circuit 248 (e.g., the 18-bit output at approximately 1.23 MHz representative of signals s1 at frequency f1, s2 at frequency f2, and s3 at frequency f3).

In FIG. 47B digital BPF circuit 2 250 shifts the 18-bit output at approximately 1.23 MHz representative of signals s1 at frequency f1, s2 at frequency f2, and s3 at frequency f3 to the bandpass for frequency f2 (e.g., 100.3 KHz). For example, s2 is now at 0 Hz and s3 at 300 Hz. S1 may fold over and be aligned with s3 or another frequency.

In FIG. 47C, digital BPF circuit 2 250 applies a very narrow bandpass filter to isolate s2. Because the embedded data is a sinusoid (e.g., a pure tone) the desired information is at frequency f2 (e.g., 0 Hz) and based on magnitude and/or phase. Therefore, the bandpass filter can be very narrow (e.g., less than 0.05 the channel spacing (e.g., 10 Hz)) to capture the desired signal.

In FIG. 47D, digital BPF circuit 2 250 outputs an affect value 254 (s2) having real and imaginary components at the output frequency of 300 Hz. The affect value 254 (s2) is 48 bits with a 24-bit real part and a 24-bit imaginary part.

FIG. 48 is a schematic block diagram of an embodiment of digital bandpass filter (BPF) circuit 250. Digital BPF circuit 250 includes one or more finite impulse response (FIR) filters, one or more cascaded integrated comb (CIC) filters, one or more infinite impulse response (FIR) filters, one or more decimation stages, one or more fast Fourier transform (FFT) filters, one or more discrete Fourier transform (DFT) filters, and/or one or more polyphase filters.

Using a DFT filter example, BPF circuit 250 receives n channels of output from the digital decimation filtering circuit 248 (e.g., 128 18-bit outputs at approximately 1.23 MHz on a 16-bit bus running at approximately 157.29 MHz) and computes discrete Fourier transforms with a length N (e.g., to have a frequency response that synchronizes outputs) on every channel at two frequencies at a time (e.g., a self-capacitance frequency and a pen frequency). Digital BPF circuit 250 runs at twice the speed of the input bus (e.g., $2^{20} \times 300$ Hz=314.57 MHz) to compute two frequencies for each input.

Discrete Fourier transforms (DFTs) transform a sequence of complex numbers into another sequence of complex numbers. Each 18-bit input received represents a complex number at a frequency. An 18-bit input is fed to two separate multipliers where the input is multiplied by either the real or imaginary coefficients of the DFT. The real and imaginary parts of a DFT are pre-computed for each frequency by a coefficient processor. The coefficient processor will be discussed in more detail with reference to FIG. 52.

For each real and imaginary part of the input, BPF circuit 250 applies a multiply accumulate function. For example, real part coefficients 294 are multiplied by the input and accumulated by accumulators 302. When the final result is computed for all outputs (e.g., 128 channels×2 frequencies=256 outputs) the final result is shifted to output buffer 304 and real component value 298 (e.g., 24 bits) is output at 300 Hz. Likewise, imaginary part coefficients 296 are multiplied by the input and accumulated by accumulators 302. When the final result is computed for all outputs (128 channels×2 frequencies=256 outputs) the final result is shifted to output buffer 304 and imaginary component value 300 (e.g., 24 bits) is output at 300 Hz. Therefore, the BPF circuit filters N outputs from digital decimation filtering circuit 248 to produce 1 output with a real component value 298 and an imaginary component value 300 and operates at twice the speed of the input in order to output a result for two frequencies per channel.

FIG. 49 is a schematic block diagram of another embodiment of analog to digital conversion circuit 246 that includes analog to digital converter (ADC) circuits 1-$n$ 258, digital filtering decimation circuit 248, $1^{st}$ bandpass filter (BPF) circuit 250, $2^{nd}$ BPF circuit 250, coefficient processor 306, and processing module 252.

ADC circuits 1-$n$ 258 may be ADC converter 212 of drive sense circuit 28 of previous Figures and/or any conventional ADC (e.g., a flash ADC, a successive approximation ADC, a ramp-compare ADC, a Wilkinson ADC, an integrating ADC, and/or a delta encoded ADC). ADC circuit 258 may be implemented by combination of a 1-bit ADC sigma-delta modulator and the digital decimation filtering circuit 248 (e.g., a sigma delta ADC). FIG. 49 operates in accordance with previous examples except that $1^{st}$ BPF circuit 250 is operable to process outputs from digital filtering decimation circuit 248 where frequencies are known and 2nd BPF circuit 250 is operable to process outputs from digital filtering decimation circuit 248 where frequencies are selectable by the processing module 252 according to regions of interest (ROI).

For example, mutual capacitance is measured at two points per n channels (e.g., 256 frequencies where n is equal to 128). Processing module 252 chooses which cross points are sampled based on given crossing points or at specific points based on the results of the of self-frequencies and pen frequencies which are always on. Processing module 252 inputs the selected frequencies 310 into $2^{nd}$ BPF 250 and coefficient processor 306 pre-computes coefficients for $2^{nd}$ BPF 250 based on the selected frequencies. $2^{nd}$ BPF 250 will be discussed in more detail with reference to FIG. 51.

Self-capacitance is measured at one point (e.g., one frequency) per n electrodes of a touch screen (e.g., 128 electrodes, where n is equal to 128) and pen capacitance is measured at one point (e.g., one frequency on the same n electrodes). These frequencies are known to the system therefore processing module 252 inputs the known frequencies 308 into coefficient processor 306 to pre-compute coefficients for 1st BPF 250. $1^{st}$ BPF 250 will be discussed in more detail with reference to FIG. 50.

$1^{st}$ BPF 250 outputs $1^{st}$ affect values 254 representative of self and pen capacitance values (e.g., $1^{st}$ BPF 250 runs at twice the speed of the input bus to filter two frequencies per channel as discussed in FIG. 48). $2^{nd}$ BPF 250 outputs $2^{nd}$ affect values 254 representative of mutual capacitance values. Processing module 252 interprets the imaginary and real components of the affect values 254 to produce data output 256. Affect values 254 are vectors (i.e., phasor complex numbers) having a real component and an imaginary component representing a sinusoidal function that has a peak magnitude (i.e., amplitude) and direction (i.e., phase). For example, affect values 254 are 48-bit values each having a 24-bit real component and a 24-bit imaginary component. In the complex domain, voltages and currents are phasors and all resistances, capacitances, and inductances are replaced with complex impedances (e.g., $Z_R$=R, $Z_L$=jfL, and $Z_C$=1/(jfC)=−j/(fC)).

Since the impedance of a channel is primarily based on its capacitance (self, pen, and/or mutual), as the frequency increases for a fixed capacitance, the impedance decreases based on $\frac{1}{2\pi fC}$, where f is the frequency and C is the capacitance. Since voltage (V)=current (I)*impedance (Z), the processing module 252 determines a capacitance or other impedance value from voltage and current vectors of the affect value 254 (e.g., a decrease in impedance increases the voltage for a constant current, increases the current for a constant voltage, or increases both voltage and current of the signal component). The increasing and/or decreasing of impedance is representative of the input data. The impedance value or change in impedance value determined is output as data output 256 at the example output rate of 300 Hz.

FIG. 50 is a schematic block diagram of an embodiment of a first bandpass filter (BPF) circuit 250. $1^{st}$ BPF circuit 250 is one or more discrete Fourier transform (DFT) or fast Fourier transform (FFT) filters that receives n (e.g., 128) channels of output from the digital decimation filtering circuit 248 (e.g., 128 18-bit outputs at approximately 1.23 MHz on a 16-bit bus running at approximately 157.29 MHz) and computes discrete Fourier transforms with a length N=4096 on every channel at two frequencies at a time (e.g., a self-capacitance frequency and a pen frequency). Digital BPF circuit 250 runs at twice the speed of the input bus (e.g., $2^{20} \times 300$ Hz=314.57 MHz) to compute two frequencies for each input.

Discrete Fourier transforms transform a sequence of N complex numbers (e.g., $\{x_n\}$=$x_0$, $x_1$, ..., $x_{N-1}$) into another sequence of complex numbers (e.g., $\{X_k\}$=$X_0$, $X_1$, ..., $X_{N-1}$) where $$X_k = \sum_{n=0}^{N-1} x_n w_n e^{\frac{-i2\pi}{N}kn}$$

which can also be expressed as $$X_k = \sum_{n=0}^{N-1} x_n w_n \left[ \cos\left(\frac{2\pi kn}{N}\right) - i \cdot \sin\left(\frac{2\pi kn}{N}\right) \right]$$

according to Euler's formula.

For each 18-bit input, the real and imaginary parts of $$w_n e^{\frac{-i2\pi}{N}kn}$$

are pre-computed for each frequency by coefficient processor 306. Coefficient processor 306 will be discussed in more detail with reference to FIG. 52.

For example, the real part coefficients $w_n \cos(2\pi\omega_s n)$ (for a self-frequency (fs) input $\omega_s$, where $$\frac{k}{N} = \omega_s)$$

and $w_n \cos(2\pi\omega_p n)$ (for a pen-frequency (fp) input $\omega_p$, where $$\frac{k}{N} = \omega_p)$$

are precomputed by coefficient processor 306 and multiplexed to be multiplied with the correct 18-bit output from digital decimation filtering circuit 248 shown on the left side. Imaginary part coefficients $-w_n \sin(2\pi\omega_s n)$ (for a self-frequency (fs) input $\omega_s$, where $$\frac{k}{N} = \omega_s)$$

and $-w_n \sin(2\pi\omega_p n)$ (for a pen-frequency (fp) input $\omega_p$, where $$\frac{k}{N} = \omega_p)$$

are precomputed by coefficient processor 306 and multiplexed to be multiplied with the correct 18-bit output from digital decimation filtering circuit 248 shown on the right side.

$1^{st}$ BPF circuit 250 includes 4 18×18 multipliers (e.g., 2 per side, per frequency) for multiplying 18-bits from the digital decimation filtering circuit 248 with 18-bits from coefficient processor. $1^{st}$ BPF circuit 250 includes 4 30-bit signed accumulators 302 (e.g., 2 per side, per frequency) with 256 output registers for adding the multiplied values. $1^{st}$ BPF circuit 250 further includes 4 256×24-bit output buffers 304 (e.g., 2 per side, per frequency). For example, output buffers 304 are two port static access random memory (SRAM) with a write only port and a read only port.

$1^{st}$ BPF circuit 250 computes the final product for all 256 18-bit values received (e.g., 128 channels×2 frequencies) and shifts the final results to output buffers 304. Output buffers 304 output a 24-bit real component values 298 and a 24-bit imaginary component values 300 output at 300 Hz to the processing module 252.

FIG. 51 is a schematic block diagram of an embodiment of a second bandpass filter (BPF) circuit 250. $2^{nd}$ BPF circuit 250 is one or more discrete Fourier transform (DFT) or fast Fourier transform (FFT) filters that receives n (e.g., 128) channels of output from the digital decimation filtering circuit 248 (e.g., 128 18-bit outputs at approximately 1.23 MHz on a 16-bit bus running at approximately 157.29 MHz) and computes discrete Fourier transforms with a length N=4096 on every channel at two frequencies at a time (e.g., two mutual frequencies per channel). Digital BPF circuit 250 runs at twice the speed of the input bus (e.g., $2^{20}$×300 Hz=314.57 MHz) to compute two frequencies for each input.

2nd BPF circuit 250 is operable to process outputs from digital filtering decimation circuit 248 where frequencies are selectable according to regions of interest (ROI). For example, mutual capacitance is measured at two points per n channels (e.g., 256 frequencies where n is equal to 128). Processing module 252 chooses which cross points are sampled based on given crossing points or at specific points based on the results of the of self-frequencies and pen frequencies which are always on. Processing module 252 inputs the selected frequencies into output map 316 of $2^{nd}$ BPF 250.

For example, output map 316 is a 256×12-bit two port a static access random memory (SRAM) which has a write only port interfaced with the processing module and a read only port. The processing module fills out the 256-entry output map 316 with a 12-bit address for each frequency (e.g., 7-bit address 326 for channel number and 5-bit address 328 for the frequency index). Input buffer 312 is double buffered (in comparison to the first BPF circuit 250) so the channels can load sequentially and clock out randomly. For example, input buffer 312 is a 256×18-bit two port SRAM with a write only port and a read only port. Because the input is double buffered, 2nd BPF circuit 250 will have one more cycle of latency (e.g., at 300 Hz) than the $1^{st}$ BPF circuit 250.

Counter 314 clocks through the 256 cross points at each summation step. Each cross point selects a line and coefficients corresponding to one of the frequencies computed by the coefficient processor 306. Coefficient processer 306 pre-computes coefficients for $2^{nd}$ BPF 250 based on the selected frequencies. For example, there are 34 possible frequency values for mutual frequency. Therefore, coefficient processor 306 computes real and imaginary coefficients for each of the 34 possibilities and stores the values in look-up tables.

Coefficient processer 306 inputs real coefficients into coefficient lookup table (LUT) 318 and imaginary coefficients into coefficient LUT 320. Each coefficient LUT 318 and 320 is a 34×18-bit two port SRAM with a read only port and a write only port. The 5-bit address 328 corresponding to a selected frequency is input to each coefficient LUT 318 and 320 and is used to select the correct coefficients for the input. Coefficient LUT 318 inputs an 18-bit real coefficient to the multiplier to be multiplied by the 18-bit input value from digital filtering decimation circuit 248. Coefficient LUT 320 inputs an 18-bit imaginary coefficient to the second multiplier on the right of the schematic to be multiplied by the 18-bit input value from digital filtering decimation circuit 248.

The rest of $2^{nd}$ BPF 250 operates similarly to $1^{st}$ BPF circuit 250. 2nd BPF circuit 250 includes 4 18×18 multipliers (e.g., 2 per side, per frequency) for multiplying 18-bits from the digital decimation filtering circuit 248 with 18-bits from coefficient LUTs 318 and 320. $2^{nd}$ BPF circuit 250 includes 4 30-bit signed accumulators 302 (e.g., 2 per side, per frequency) with 256 output registers for adding the multiplied values. $2^{nd}$ BPF circuit 250 further includes 4 256×24-bit output buffers 304 (e.g., 2 per side, per frequency). For example, output buffers 304 are two port SRAM with a write only port and a read only port. $2^{nd}$ BPF circuit 250 computes the final product for all 256 18-bit values received (e.g., 128 channels×2 frequencies) and shifts the final results to output buffers 304. Output buffers 304 output the 24-bit real component values 322 and the 24-bit imaginary component values 324 output at 300 Hz to the processing module.

FIG. 52 is a schematic block diagram of an embodiment of a coefficient processor 306. Coefficient processor 306 includes a "nk" latch, a +1024, a function multiplexer, cosine lookup table 330, frequency lookup table 332, a 0.5-0.5×, a "$w_n$" latch, counter 334, two multiplexers, and a coefficient processor multiplier 336. Frequency lookup table 332 is a 34×12-bit two port a static access random memory (SRAM) that is filled with the 34 possible frequency options by the processing module. Cosine lookup table 330 is a 1.17 fixed point 4096×16-bit lookup table (e.g., read only memory (ROM)). Coefficient processor multiplier 336 is an 18×18-bit signed multiplier.

As discussed previously, discrete Fourier transforms (DFTs) transform a sequence of N complex numbers (e.g., $\{x_n\}=x_0, x_1, \ldots, x_{N-1}$) into another sequence of complex numbers (e.g., $\{X_k\}=X_0, X_1, \ldots, X_{N-1}$) where $$X_k = \sum_{n=0}^{N-1} x_n w_n e^{\frac{-i2\pi}{N}kn}$$

which can also be expresses as $$X_k = \sum_{n=0}^{N-1} x_n w_n \left[\cos\left(\frac{2\pi kn}{N}\right) - i \cdot \sin\left(\frac{2\pi kn}{N}\right)\right]$$

according to Euler's formula.

For each 18-bit input, the real and imaginary parts of $$w_n e^{\frac{-i2\pi}{N}kn}$$

are pre-computed for each frequency by coefficient processor 306.

For example, there are 34 possible frequency options that every input into the BPF circuits 250 could be. Each real part coefficient $w_n \cos(2\pi\omega n)$ (for a frequency input $\omega$, where $$\frac{k}{N} = \omega)$$

and each imaginary part coefficient $-w_n \sin(2\pi\omega n)$ (for a frequency input $\omega$, where $$\frac{k}{N} = \omega)$$

for each of the 34 frequency options is precomputed by coefficient processor 306.

Coefficient processor 306 runs at a rate of n that is one greater than the BPF circuits 250 so that it is always one cycle ahead of the BPFs circuits 250. For each value of n, (which runs at the input sample rate of 1.23 MHz) the coefficient processor 306 makes the following computations: 1) $w_n$=0.5-0.5 $\cos(2\pi n/N)$ and for each of the 34 frequency possibilities (k): 1) kn mod 4096, 2) $w_n \cos(2\pi kn/N)$, and 3) $-w_n \sin(2\pi kn/N)$. To complete this, coefficient processor multiplier 336 runs at n times the input sample rate (e.g., 128×1.23 MHz=157.29 MHz when n is 128).

Counter 334 goes from 0 to 4095 and inputs the value of "n" into the function multiplexer and the multiplexer connected with $w_n$ latch. The kn latch inputs the kn value to the function multiplexer for the $\cos(2\pi kn/N)$ and $-\sin(2\pi kn/N)$ functions. A kn plus 1024 value is also input to the function multiplexer. Based on the clock cycle, a function is selected (e.g., $\cos(2\pi kn/N)$, $-\sin(2\pi kn/N)$, or $\cos(2\pi n/N)$). The selected function is entered into the cosine lookup table 330 to lookup the particular value for that function.

If the function selected does not include k, the particular value from cosine lookup table 330 is fed to the 0.5-0.5× where the value for $w_n$=0.5-0.5 $\cos(2\pi n/N)$ is computed and outputted to the $w_n$ latch. The $w_n$ latch outputs a value and is multiplexed with counter 334 outputs. When the function does include k, the selected function is entered into the cosine lookup table 330 to lookup the particular value for that function. The particular value is then input into the multiplexer with an output (k) from the frequency lookup table 332. On one clock cycle, the particular value for either for $\cos(2\pi kn/N)$ or $-\sin(2\pi kn/N)$ is input to the coefficient processor multiplier 336 to be multiplied by the $w_n$ value. The computed coefficients are converted to 18 bits then output to the BPF circuits 250.

On a different clock cycle, a value of k from the frequency lookup table 332 is input to the coefficient processor multiplier 336 to be multiplied with the value n from counter 334. The kn value is input into the kn latch for the next set of computations.

FIG. 53 is a schematic block diagram of another embodiment of analog to digital conversion circuit 246 that includes analog to digital converter (ADC) circuits 1-n 258, digital filtering decimation circuit 248, pen bandpass filter (BPF) circuit 338, self BPF circuit 340, coefficient processor 306, mutual BPF circuit 342, and processing module 252.

FIG. 53 operates similarly to the example of FIG. 49 except two BPF filters running at the speed of the input bus (e.g., pen BPF circuit 338 and self BPF circuit 340) replace one BPF circuit 250 (e.g., $1^{st}$ BPF circuit 250) running at twice the speed of the input bus in order to compute two frequencies at a time. Pen BPF circuit 338 and self BPF circuit 340 process outputs from digital filtering decimation circuit 248 where frequencies are known (e.g., self and pen measurements are always on) and mutual BPF circuit 342 is operable to process outputs from digital filtering decimation circuit 248 where frequencies are selectable according to regions of interest (ROI).

For example, mutual capacitance is measured at two points per n electrodes (e.g., 256 frequencies where n is equal to 128). Processing module 252 chooses which cross points are sampled based on given crossing points or at specific points based on the results of the self-frequencies and pen frequencies which are always on. Processing module 252 inputs a selection of frequencies 310 into mutual BPF circuit 342 and coefficient processer 306 pre-computes coefficients for mutual BPF circuit 342 based on the selected frequencies.

Self-capacitance is measured at one point (e.g., frequency) per n electrodes and pen capacitance is measured at one point per (e.g., one frequency) n electrodes. These frequencies are known to the system therefore processing module 252 inputs the known frequencies 308 into coefficient processer 306 to pre-compute coefficients for pen BPF circuit 338 and self BPF circuit 340.

Pen BPF circuit 338 outputs pen affect values representative of pen capacitance values. Self BPF circuit 340 outputs self affect values representative of self capacitance values. Mutual BPF circuit 342 outputs mutual affect values representative of mutual capacitance values. Processing module 252 interprets the imaginary and real components of the affect values to produce data output 256 at 300 Hz. Affect values 254 are vectors (i.e., phasor complex numbers) having a real component and an imaginary component representing a sinusoidal function that has a peak magnitude (i.e., amplitude) and direction (i.e., phase). For example, affect values 254 are 48-bit values each having a 24-bit real component and a 24-bit imaginary component. In the complex domain, voltages and currents are phasors and all resistances, capacitances, and inductances are replaced with complex impedances (e.g., $Z_R=R$, $Z_L=jfL$, and $Z_C=1/(jfC)=-j/(fC)$).

Since the impedance of a channel is primarily based on its capacitance (self, pen, and/or mutual), as the frequency increases for a fixed capacitance, the impedance decreases based on $\frac{1}{2\pi fC}$, where f is the frequency and C is the capacitance. Since voltage (V)=current (I)*impedance (Z), the processing module 252 determines a capacitance or other impedance value from voltage and current vectors of the affect value (e.g., a decrease in impedance increases the voltage for a constant current, increases the current for a constant voltage, or increases both voltage and current of the signal component). The increasing and/or decreasing of impedance is representative of the input data. The impedance value or change in impedance value determined is output as data output 256 at the example output rate of 300 Hz.

FIG. 54 is a schematic block diagram of an embodiment of processing module 252 controls within the analog to digital conversion circuit 246. Analog to digital conversion circuit 246 is a confined data communication system in all variables are set by the processing module 252 and controlled for desired data processing. Processing module 252 is operable to control every stage of analog to digital conversion circuit 246 in order to produce the desired output 256.

For example, processing module 252 sets the frequency and waveform for each oscillating reference signal via reference generation circuit 344 (e.g., reference signal generator 149) to produce analog reference signals 346. DC component input data 348 is embedded in each analog reference signal 346. Processing module 252 also sets the sampling rate of ADC 258. ADC 258 processes the analog signal containing the analog reference signal and the DC component and outputs representative signal 350 to the digital filtering stages 352 (e.g., digital decimation filtering circuit 248 and digital BPF circuit 250).

Processing module 252 determines the stages (e.g., taps) of each filter, the sampling frequencies, the filter bandwidth, and any other desired filter parameters. Processing module 252 determines digital filtering parameters based on a desired output rate, desired linearity, and other factors. Processing module 252 inputs known frequencies and mutual frequency selections into the coefficient processor for digital BPF filters.

The digital filtering stage 352 produces an affect value 254 to be interpreted by the processing module 252 at the data processing 354 stage. Processing module 252 sets data interpretation parameters based on the data output rate and the nature of the input data 348.

For example, input data 348 may be communicating one or more of current (I), voltage (V), or impedance (Z) changes. For example, if the input is a voltage measurement with a constant current, processing module 252 can analyze the voltage change to determine an impedance change value. Based on the data interpretation parameters, processing module 252 interprets affect value 254 and produces processed output data 256.

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
   converting, by n analog to digital converter (ADC) circuits of an analog to digital conversion circuit, n analog signals into n first digital signals having a first data rate frequency, wherein an analog signal of the n analog signals includes an oscillation frequency and a set of pure tone components, and wherein n is an integer greater than 1;
   converting, by n digital decimation filtering circuits of the analog to digital conversion circuit, the n first digital signals into n second digital signals having a second data rate frequency; and
   converting, by n digital bandpass filter (BPF) circuits of the analog to digital conversion circuit, the n second digital signals into a plurality of outbound digital signals having a third data rate frequency, wherein a digital BPF circuit of the n digital BPF circuits includes a plurality of taps having a plurality of coefficients, wherein the plurality of coefficients for the plurality of taps is set to produce a bandpass region approximately centered at the oscillation frequency of the analog signal and having a bandwidth tuned for filtering a pure tone component of the set of pure tone components, wherein the first data rate frequency is a first integer multiple of the third data rate frequency, wherein the second data rate frequency is a second integer multiple of the third data rate frequency, and wherein the first data rate frequency is greater than the second data rate frequency.

2. The method of claim 1, wherein the first data rate frequency is a third integer multiple of the second data rate frequency.

3. The method of claim 1, wherein an ADC circuit of the n ADC circuits includes a digital decimation filtering circuit of the n digital decimation filtering circuits.

4. The method of claim 1, wherein a first digital signal of then first digital signals is a 1-bit digital data stream at the first data rate frequency.

5. The method of claim 1 further comprises:
   converting, by a first digital BPF circuit of the digital BPF circuit, a second digital signal of the n second digital signals into a first outbound digital signal of the plurality of outbound digital signals, wherein the first digital BPF circuit includes a first plurality of taps having a first plurality of coefficients, wherein the first plurality of coefficients for the first plurality of taps is set to produce a first bandpass region approximately centered at the oscillation frequency of the analog signal and having a first bandwidth tuned for filtering a first pure tone component of the set of pure tone components; and
   converting, by a second digital BPF circuit of the digital BPF circuit, the second digital signal of the n second digital signals into a second outbound digital signal of the plurality of outbound digital signals, wherein the second digital BPF circuit includes a second plurality of taps having a second plurality of coefficients, wherein the second plurality of coefficients for the second plurality of taps is set to produce a second bandpass region approximately centered at the oscillation frequency of the analog signal and having a second bandwidth tuned for filtering a second pure tone component of the set of pure tone components.

6. The method of claim 5 further comprises:
   selecting, by a processing module of the analog to digital conversion circuit, the first and second pure tone components; and
   computing, by a coefficient processer of the digital BPF circuit, the first and second plurality of coefficients based on the selected first and second pure tone components.

7. The method of claim 1 further comprises:
   the first data rate frequency is $2^{17}$ times the third data rate frequency; and
   the second data rate frequency is $2^{12}$ times the third data rate frequency.

8. The method of claim 1 further comprises:
   the first data rate frequency includes a first bit rate per interval;
   the second data rate frequency includes a second bit rate per interval; and
   the third data rate frequency includes a third bit rate per interval.

9. The method of claim 1 further comprises:
   determining, by a processing module of the analog to digital conversion circuit a plurality of impedance values from the plurality of outbound digital signals, wherein a first outbound digital signal of the plurality of outbound digital signals is a vector having real and imaginary components.

10. The method of claim 1, wherein the bandwidth tuned for filtering the pure tone component is less than 0.05 of channel spacing, and wherein the channel spacing is the bandwidth between two pure tone components of the set of pure tone components.

11. A method comprises:
    converting, by n analog to digital converter (ADC) circuits of a touch screen display, n analog signals into n first digital signals having a first data rate frequency, wherein an analog signal of the n analog signals includes an oscillation frequency and a set of pure tone components, wherein n is an integer greater than 1, and wherein the touch screen display includes n electrodes;
    converting, by n digital decimation filtering circuits of the touch screen display, the n first digital signals into n second digital signals having a second data rate frequency;
    converting, by n digital bandpass filter (BPF) circuits of the touch screen display, the n second digital signals into a plurality of outbound digital signals having a third data rate frequency, wherein a digital BPF circuit of the n digital BPF circuits includes a plurality of taps having a plurality of coefficients, wherein the plurality of coefficients for the plurality of taps is set to produce a bandpass region approximately centered at the oscillation frequency of the analog signal and having a bandwidth tuned for filtering a pure tone component of the set of pure tone components, wherein the first data rate frequency is a first integer multiple of the third data rate frequency, wherein the second data rate frequency is a second integer multiple of the third data rate frequency, and wherein the first data rate frequency is greater than the second data rate frequency;

determining, by a processing module of the touch screen display, a plurality of impedance values from the plurality of outbound digital signals, wherein a first outbound digital signal of the plurality of outbound digital signals is a vector having real and imaginary components; and interpreting, by the processing module, the plurality of impedance values as touch data of the touch screen display.

12. The method of claim 11, wherein the first data rate frequency is a third integer multiple of the second data rate frequency.

13. The method of claim 11, wherein a first digital signal of the n first digital signals is a 1-bit digital data stream at the first data rate frequency.

14. The method of claim 11 further comprises:

converting, by a first digital BPF circuit of the digital BPF circuit, a second digital signal of the n second digital signals into a first outbound digital signal of the plurality of outbound digital signals, wherein the first digital BPF circuit includes a first plurality of taps having a first plurality of coefficients, wherein the first plurality of coefficients for the first plurality of taps is set to produce a first bandpass region approximately centered at the oscillation frequency of the analog signal and having a first bandwidth tuned for filtering a first pure tone component of the set of pure tone components; and converting, by a second digital BPF circuit of the digital BPF circuit, the second digital signal of then second digital signals into a second outbound digital signal of the plurality of outbound digital signals, wherein the second digital BPF circuit includes a second plurality of taps having a second plurality of coefficients, wherein the second plurality of coefficients for the second plurality of taps is set to produce a second bandpass region approximately centered at the oscillation frequency of the analog signal and having a second bandwidth tuned for filtering a second pure tone component of the set of pure tone components.

15. The method of claim 14 further comprises:

selecting, by the processing module, the first and second pure tone components; and computing, by a coefficient processer of the digital BPF circuit, the first and second plurality of coefficients based on the selected first and second pure tone components.

16. The method of claim 15 further comprises:

selecting, by the processing module, the first pure tone component based on a known frequency; and selecting, by the processing module, the second pure tone component based on a region of interest of the touch screen display.

17. The method of claim 11, wherein the pure tone component corresponds to one of:

a self capacitance of an electrode of then electrodes;

a pen capacitance of the electrode; and a mutual capacitance of the electrode.

18. The method of claim 11 further comprises:

the first data rate frequency is $2^{17}$ times the third data rate frequency; and the second data rate frequency is $2^{12}$ times the third data rate frequency.

19. The method of claim 11 further comprises:

the first data rate frequency includes a first bit rate per interval;

the second data rate frequency includes a second bit rate per interval; and the third data rate frequency includes a third bit rate per interval.

20. The method of claim 11, wherein the bandwidth tuned for filtering the pure tone is less than 0.05 of channel spacing, wherein the channel spacing is the bandwidth between two pure tone components of the set of pure tone components.

* * * * *